US009564245B2

United States Patent
Querbach et al.

(10) Patent No.: US 9,564,245 B2
(45) Date of Patent: Feb. 7, 2017

(54) INTEGRATED CIRCUIT DEFECT DETECTION AND REPAIR

(71) Applicant: INTEL CORPORATION, Santa Clara, CA (US)

(72) Inventors: Bruce Querbach, Hillsboro, OR (US); Theodore Z. Schoenborn, Portland, OR (US); David J. Zimmerman, El Dorado Hills, CA (US); David G. Ellis, Tualatin, OR (US); Christopher W. Hampson, Hillsboro, OR (US); Ifar Wan, Hillsboro, OR (US); Yulan Zhang, Hillsboro, OR (US); Ramakrishna Mallela, Hillsboro, OR (US); William K. Lui, Portland, OR (US)

(73) Assignee: INTEL CORPORATION, Santa Clara, CA (US)

(*) Notice: Subject to any disclaimer, the term of this patent is extended or adjusted under 35 U.S.C. 154(b) by 0 days.

(21) Appl. No.: 14/141,239

(22) Filed: Dec. 26, 2013

(65) Prior Publication Data

US 2015/0187439 A1    Jul. 2, 2015

(51) Int. Cl.
*G06F 11/263* (2006.01)
*G06F 11/27* (2006.01)
(Continued)

(52) U.S. Cl.
CPC .............. *G11C 29/36* (2013.01); *G06F 11/263* (2013.01); *G11C 29/10* (2013.01);
(Continued)

(58) Field of Classification Search
CPC ... G11C 29/4401; G11C 29/72; G11C 11/401; G11C 2029/0401; G11C 2029/0405; G11C 29/44; G11C 2029/3602; G01R 31/3187
(Continued)

(56) References Cited

U.S. PATENT DOCUMENTS 5,956,350 A * 9/1999 Irrinki et al. ................ 714/718
5,987,632 A * 11/1999 Irrinki et al. ................ 714/711
(Continued)

FOREIGN PATENT DOCUMENTS

EP        1416499        5/2004

OTHER PUBLICATIONS

International Search Report and Written Opinion for International Application No. PCT/US2014/072003, dated Mar. 25, 2015, 16 pp.
(Continued)

*Primary Examiner* — James C Kerveros
(74) *Attorney, Agent, or Firm* — Konrad Raynes Davda & Victor LLP

(57) ABSTRACT

In accordance with the present description, a device includes an internal defect detection and repair circuit which includes a self-test logic circuit built in within the device and a self-repair logic circuit also built in within the device. In one embodiment, the built in self-test logic circuit may be configured to automatically identify defective memory cells in a memory. Upon identifying one or more defective memory cells, the built in self-repair logic circuit may be configured to automatically repair the defective memory cells by replacing defective cells with spare cells within the memory.

22 Claims, 24 Drawing Sheets

(51) Int. Cl.

| | | |
|---|---|---|
| *G11C 11/406* | (2006.01) | |
| *G11C 29/00* | (2006.01) | |
| *G11C 29/36* | (2006.01) | |
| *G11C 29/44* | (2006.01) | |
| *G11C 29/10* | (2006.01) | |

(52) U.S. Cl.
CPC .......... *G11C 29/4401* (2013.01); *G06F 11/27* (2013.01); *G11C 11/406* (2013.01); *G11C 29/72* (2013.01); *G11C 29/78* (2013.01); *G11C 2029/4402* (2013.01)

(58) Field of Classification Search
USPC .................... 714/733, 718, 711, 723, 738
See application file for complete search history.

(56) References Cited

U.S. PATENT DOCUMENTS

| | | | |
|---|---|---|---|
| 6,067,262 A * | 5/2000 | Irrinki et al. ................. | 365/201 |
| 6,367,042 B1 * | 4/2002 | Phan et al. .................... | 714/733 |
| 6,425,103 B1 * | 7/2002 | Phan ............................. | 714/733 |
| 6,651,202 B1 * | 11/2003 | Phan ............................. | 714/733 |
| 6,668,347 B1 | 12/2003 | Babella et al. | |
| 6,834,361 B2 * | 12/2004 | Abbott ................... | G11C 29/26 714/42 |
| 6,928,593 B1 | 8/2005 | Halbert et al. | |
| 6,941,495 B2 | 9/2005 | Wehage | |
| 7,155,643 B2 | 12/2006 | Ichikawa | |
| 7,171,596 B2 * | 1/2007 | Boehler ........................ | 714/718 |
| 7,174,489 B2 | 2/2007 | Sadakata et al. | |
| 7,228,468 B2 * | 6/2007 | Wu et al. ....................... | 714/710 |
| 7,260,758 B1 * | 8/2007 | Agrawal et al. .............. | 714/733 |
| 7,286,380 B2 | 10/2007 | Hsu et al. | |
| 7,356,741 B2 * | 4/2008 | Boehler ........................ | 714/718 |
| 7,370,251 B2 * | 5/2008 | Nadeau-Dostie et al. .... | 714/723 |
| 7,421,629 B2 * | 9/2008 | Bucksch et al. .............. | 714/718 |
| 7,475,314 B2 | 1/2009 | Chhabra et al. | |
| 7,536,267 B2 | 5/2009 | Zimmerman et al. | |
| 7,639,535 B2 | 12/2009 | Hendrickson et al. | |
| 7,746,712 B2 | 6/2010 | Kang et al. | |
| 7,757,135 B2 * | 7/2010 | Nadeau-Dostie et al. .... | 714/723 |
| 8,069,377 B2 * | 11/2011 | Singh ............................ | 714/711 |
| 2003/0177415 A1 | 9/2003 | Togashi et al. | |
| 2005/0024981 A1 | 2/2005 | Bateman et al. | |
| 2006/0156134 A1 * | 7/2006 | Mukherjee ....... | G01R 31/31724 714/733 |
| 2006/0221731 A1 | 10/2006 | Kobatake | |
| 2008/0091988 A1 * | 4/2008 | Yoel et al. ..................... | 714/711 |
| 2008/0178053 A1 * | 7/2008 | Gorman ........... | G01R 31/31724 714/718 |

OTHER PUBLICATIONS

U.S. Appl. No. 14/320,164, entitled "Integrated Circuit Defect Detection and Repair", filed Jun. 30, 2014, invented by B. Querbach et al., 129 pp.
Office Action 1 for U.S. Appl. No. 14/320,164, dated Mar. 12, 2015, 15 pp.
Second Response to Final Office Action 1 for U.S. Appl. No. 14/320,164, dated Nov. 25, 2015, 15 pp.
Response to Office Action 1 for U.S. Appl. No. 14/320,164, dated Jun. 12, 2015, 12 pp.
Final Office Action 1 for U.S. Appl. No. 14/320,164, dated Jun. 25, 2015, 12 pp.
Response Final Office Action 1 for U.S. Appl. No. 14/320,164, dated Aug. 25, 2015, 12 pp.
Office Action 3 for U.S. Appl. No. 14/320,164, dated Dec. 21, 2015, 17 pp.
Response to Office Action 3 for U.S. Appl. No. 14/320,164, dated Mar. 24, 2016, 14 pp.
Final Office Action 3 for U.S. Appl. No. 14/320,164, dated Apr. 5, 2016, 23 pp.
Advisory Action for U.S. Appl. No. 14/320,164, dated Sep. 8, 2015, 8 pp.
Advisory Action for U.S. Appl. No. 14/320,164, dated Oct. 23, 2015, 7 pp.
Response to Final Office Action 2 for U.S. Appl. No. 14/320,164, dated Jul. 13, 2016, 14 pp.
Advisory Action for U.S. Appl. No. 14/320,164, dated Aug. 1, 2016, 5 pp.
Second Response to Final Office Action 2 for U.S. Appl. No. 14/320,164, dated Aug. 5, 2016, 14 pp.
International Preliminary Report on Patentability for International Application No. PCT/US2014/072003, dated Jul. 7, 2016, 13 pp.
Notice of Allowance 1 for U.S. Appl. No. 14/320,164, dated Aug. 31, 2016, 13 pp.

* cited by examiner

| Bank n Fail 0 | Bank n Fail 1 | Bank n Fail 2 | • • • | Bank n Fail n | Bank n Flags |
|---|---|---|---|---|---|
| ⋮ | | ⋮ | | ⋮ | ⋮ |
| Bank 2 Fail 0 | Bank 2 Fail 1 | Bank 2 Fail 2 | • • • | Bank 2 Fail n | Bank 2 Flags |
| Bank 1 Fail 0 | Bank 1 Fail 1 | Bank 1 Fail 2 | • • • | Bank 1 Fail n | Bank 1 Flags |
| Bank 0 Fail 0 | Bank 0 Fail 1 | Bank 0 Fail 2 | • • • | Bank 0 Fail n | Bank 0 Flags |

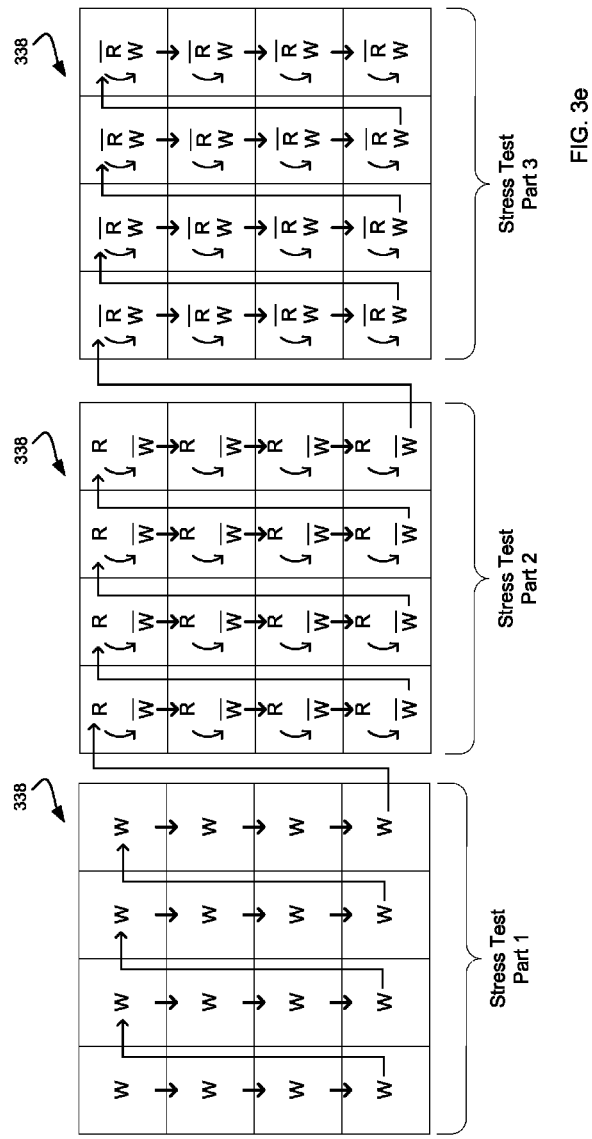

| Output | Pattern Mixer Code (hex) |
|---|---|
| Constant 0 | 00 |
| Constant 1 | FF |
| S0 | AA |
| S1 | CC |
| S2 | F0 |
| (~S1) • (~S2) | 03 |
| S1 • S2 • S3 | 80 |
| S1 • S2 | C0 |
| S1 + S2 | EE |

FIG. 14

INTEGRATED CIRCUIT DEFECT DETECTION AND REPAIR

TECHNICAL FIELD

The present invention relates generally to devices having memory with built-in self-test functionality.

BACKGROUND

Integrated circuit devices such as random access memories (RAMs) usually undergo device verification testing during manufacture. Typically, such verification tests are designed to detect both static and dynamic defects in a memory array. Static defects include, for example, open circuit and short circuit defects in the integrated circuit device. Dynamic defects include defects such as weak pull-up or pull-down transistors that create timing sensitive defects. Defects which have been identified in a memory may be repaired by issuing commands to the device to replace defective memory cells with spare memory cells placed on the device for that purpose. Such replacement is typically achieved by opening and closing fuses within the memory array.

BRIEF DESCRIPTION OF THE DRAWINGS

FIG. 3e is a schematic diagram of yet another example of a stress test pattern which may be generated by the programmable stress test pattern generator of the self-test logic of FIG. 2, in response to a sequence of stress test instructions provided to the programmable stress test pattern generator.

FIG. 14 is a table depicting examples of Boolean function based modes of operation of the algorithm generator of FIG. 13.

DESCRIPTION OF EMBODIMENTS

A specialized integrated circuit device tester is normally employed to perform manufacturing verification tests. Such testing apparatus is typically controlled by a human operator or automation system using a computer executing test software. To test a memory device, test patterns of various memory addresses, memory commands and test data may be read from the computer memory or otherwise generated, and applied via the device tester to the devices under test. Typically, the devices under test are on a semiconductor wafer or may be on a die cut from the wafer.

Test data read from the devices in response to applied test patterns, is compared by the external tester software to expected results to identify defects. Defects in memory devices identified in this manner, may in some instances be repaired by issuing commands to the device containing a memory defect. For example, in some memory circuits, a row of memory cells containing a defective memory cell may be replaced by spare row of memory cells.

Some integrated circuit devices have built-in self-test (BIST) circuitry. For example, an integrated circuit memory array may contain circuitry to perform a standard static random access memory (SRAM) 13N March test algorithm on the memory array. A state machine is typically used to generate the 13N March test algorithm along with circuitry to sample data output and to generate a signature of the results. The signature is then compared against an expected value to determine whether defects exist in the memory array.

Unfortunately, these known BIST routines have often been limited to applying a fixed test sequence on the memory array. As the process of manufacturing such a memory array evolves, manufacturing test engineers typically develop improved strategies for detecting both static and dynamic defects in the memory array.

Moreover, such improved strategies for detecting defects have typically been applied to testing that occurs while the device is placed in an expensive integrated circuit device tester. Therefore, engineers have frequently been unable to achieve the benefits of improved test strategies without the use of an expensive tester, or without redesigning the integrated circuit device. Because of the advances in memory technology, and particularly in the area of narrow high-speed buses, which typically run at speeds in the GHz range, for use with dynamic random access memory devices (DRAMs), it is very expensive to obtain a high-speed tester capable of testing a memory module or a memory component at such high operating frequencies. Therefore, the added use of expensive high-speed hardware testers increases the overall manufacturing cost of these memory modules and memory components.

Figure 1:
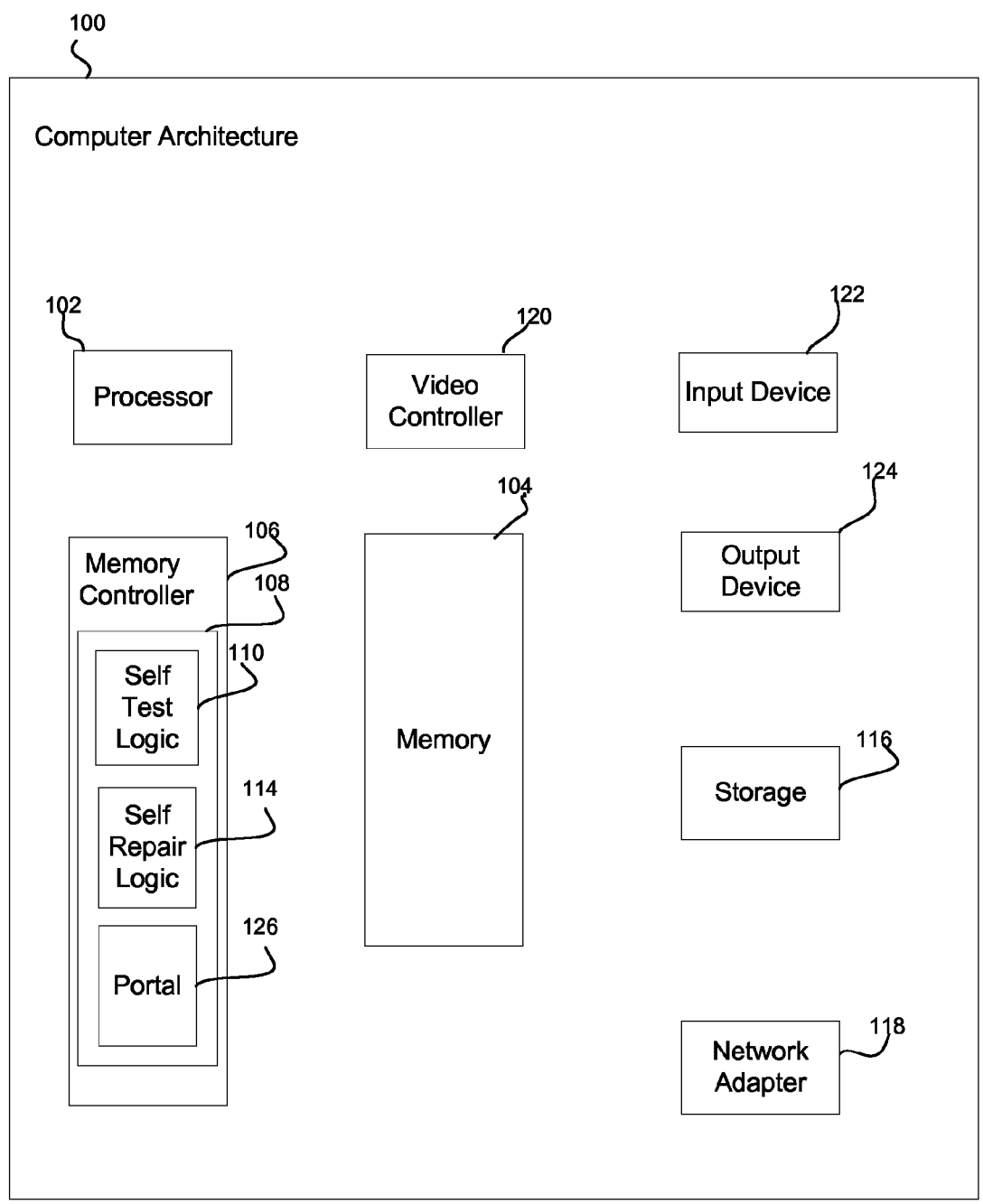
FIG. 1 is a schematic diagram of one embodiment of a computer architecture device employing self-test and repair in accordance with one aspect of the present description.

FIG. 1 illustrates one embodiment of a computer architecture device 100 employing defect detection and repair in accordance with one aspect of the present description. The computer architecture device 100 may comprise any computing device known in the art, such as a mainframe, server, personal computer, workstation, telephony device, network appliance, virtualization device, storage controller, portable or mobile devices (e.g., laptops, netbooks, tablet computers, personal digital assistant (PDAs), portable media players, portable gaming devices, digital cameras, mobile phones, smartphones, feature phones, etc.) or component (e.g. system on a chip, processor, bridge, memory controller, memory, etc.). The architecture device 100 may include a processor 102 (e.g., a microprocessor), a memory 104 (e.g., a volatile or nonvolatile memory device), and a memory controller 106 which controls input and output operations to and from the memory 104.

As explained in greater detail below, the memory controller 106 includes an internal defect detection and repair circuit 108 which includes a self-test logic circuit 110 built in within the device 100 and a self-repair logic circuit 114 also built in within the device 100. The built in self-test logic circuit 110 may be configured to automatically identify defective memory cells in the memory 104. Upon identifying one or more defective memory cells, the built in self-repair logic circuit 114 may be configured to automatically repair the defective memory cells by replacing defective cells with spare cells within the memory 104. The memory die may be included in the same package as the logic die having the self-test logic circuit 110 the self-repair logic circuit 114. Alternatively, the memory die could be outside the package of the logic die, on top of the logic die, adjacent to the logic die or on a plug in module such as a dual in line memory module (DIMM).

As used herein, the term "automated" includes fully automated in which once stress testing of the device is initiated, the test and repair operations of the device proceed through repair of at least one memory location without any user intervention. Also, the term "automated" includes substantially automated in which once stress testing of the device is initiated, the test and repair operations of the device proceed through repair of at least one memory location with limited user intervention. However, most of the test and repair operations proceed without any user intervention. In some embodiments, at least 50%, at least 75% or at least 95% of the test and repair operations proceed without any user intervention.

In the illustrated embodiment, the memory controller 106 is disposed on a semiconductor die within the device 100 and the internal self-test logic circuit 110 and the internal self-repair logic circuit 114 of the circuit 108 are disposed on the same die of the memory controller 106. Thus, although the internal self-test logic circuit 110 and the internal self-repair logic circuit 114 are depicted as built in to the memory controller 106, it is appreciated that the internal self-test logic circuit 110 and the internal self-repair logic circuit 114 may be built in to other circuits of the computer architecture device 100.

As explained in greater detail below, the internal self-test logic circuit 110 is capable of generating a wide range of test patterns for testing the memory 104. Moreover, in some embodiments, the test patterns generated by the internal self-test logic circuit 110 may be readily modified as conditions warrant. If the internal defect detection and repair circuit 108 is located on the same die as the memory cells, the defect detection and repair circuit may be activated to test for and repair memory defects during the manufacture process at the wafer or die level but also after semiconductor components have been assembled and packaged. If the defect detection and repair circuit is located on a separate die such as a logic device, the defect detection and repair circuit may be used to test the memory device or devices after the memory has been connected to a device containing the defect detection and repair circuit. Further, it is appreciated that in some embodiments, the internal defect detection and repair circuit 108 may be activated to test for and repair memory defects should a memory failure occur after the device 100 has been packaged in a housing and sold to consumers. Thus, the internal defect detection and repair circuit 108 may interrupt normal memory transactions between the processor 102 and memory 104 to conduct memory test and repair operations.

The computer architecture device 100 may further include storage 116 (e.g., a non-volatile storage, such as magnetic disk drives, optical disk drives, a tape drive, flash memory, etc.). The storage 116 may comprise an internal storage device or an attached or network accessible storage. Programs in the storage 116 are loaded into the memory 104 and executed by the processor 102 in a manner known in the art. The computer architecture device 100 further includes a network controller or adapter 118 to enable communication with a network, such as an Ethernet, a Fiber Channel Arbitrated Loop, etc. Further, the architecture may, in certain embodiments, include a video controller 120 to render information on a display monitor, where the video controller 120 may be embodied on a video card or integrated on integrated circuit components mounted on a motherboard or other substrate. An input device 122 is used to provide user input to the processor 102, and may include a keyboard, mouse, pen-stylus, microphone, touch sensitive display screen, input pins, sockets, or any other activation or input mechanism known in the art. An output device 124 is capable of rendering information transmitted from the processor 102, or other component, such as a display monitor, printer, storage, output pins, sockets, etc. The network adapter 118 may embodied on a network card, such as a Peripheral Component Interconnect (PCI) card, PCI-express, or some other I/O card, or on integrated circuit components mounted on a motherboard or other substrate.

The internal defect detection and repair circuit 108 includes a portal 126 through which test and repair input and output information may be passed among the defect detection and repair circuit 108 and the other components of the device 100 and if appropriate, to devices external to the computer architecture device 100 via an input device 122 and an output device 118. One example of the portal 126 is an on-chip communication network or fabric side band. In one embodiment, the portal 126 may be accessed externally through a Test Access Port (TAP) system. Other communication portals may be utilized, depending upon the particular application.

One or more of the components of the device 100 may be omitted, depending upon the particular application. For example, a network router may lack a video controller 120, for example. Also, any one or more of the components of the computer architecture device 100 may include one or more integrated circuits having an on-die defect detection and repair circuit as described herein.

Figure 2:
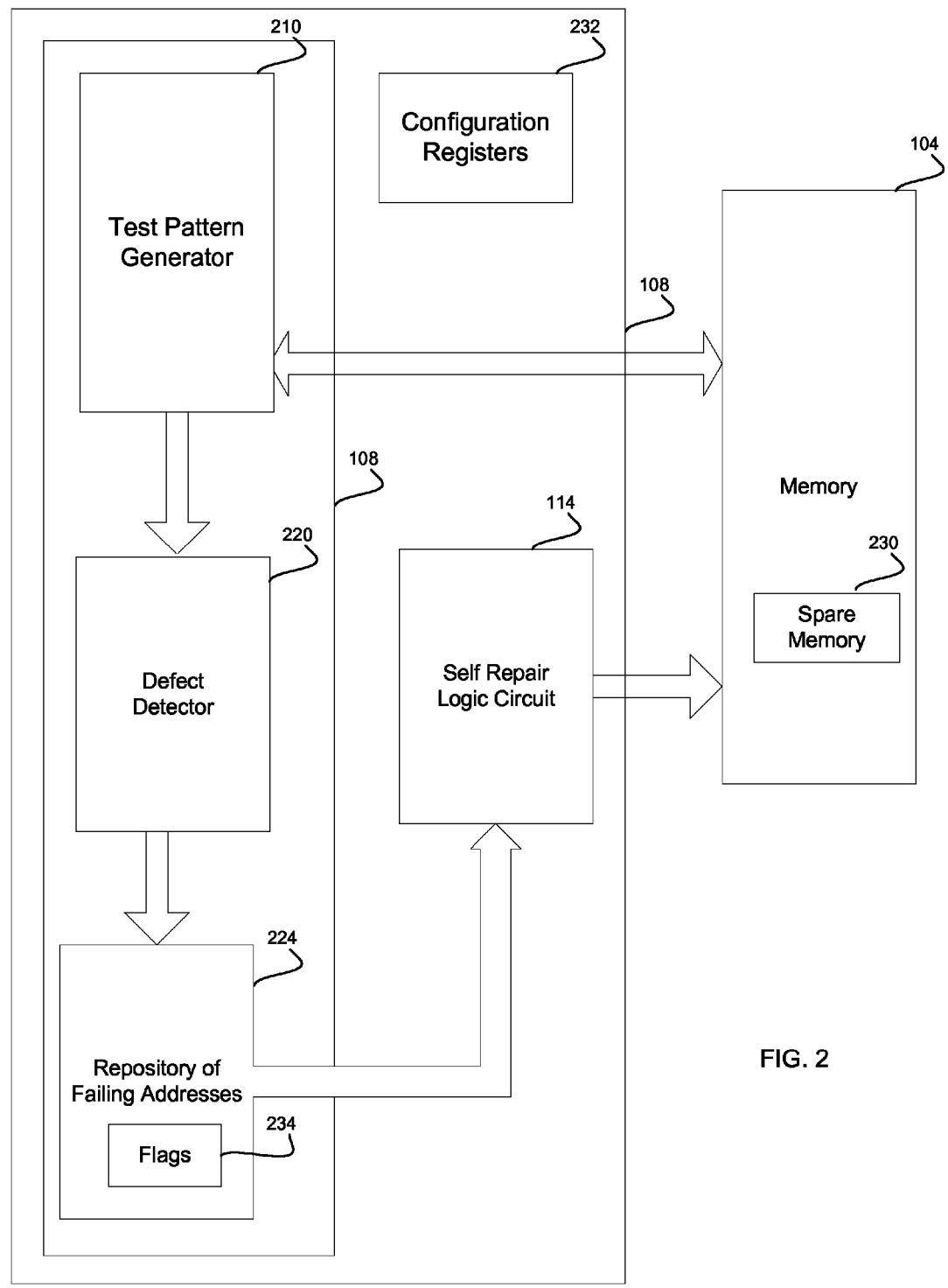
FIG. 2 is a more detailed schematic diagram of one embodiment of automated self-test and repair logic on board the computer architecture device of FIG. 1.

FIG. 2 shows a more detailed example of an internal defect detection and repair circuit 108 in accordance with the present description. The defect detection and repair circuit 108 includes a test pattern generator 210 for generating test patterns, writing test data to the memory device, sending a copy of the data to a defect detector circuit 220, and sending a series of read commands to read back the test data. The read data from the memory device is routed to the defect detector circuit 220 where the expected data from the test patter generator 210 is compared to the actual data from the memory device to detect defective memory cells in the memory 104 in response to the test patterns testing the memory cells of the memory 104.

The defect detector circuit 220 stores in a memory 224 configured as a repair list repository also disposed within the device 108, a list of memory locations of the memory 104, each memory location of the list having a set of memory cells which includes at least one defective memory cell in the memory 104. The self-repair logic circuit 114 includes logic circuitry adapted to read the list of memory locations stored in the repair list repository 224, and to repair the memory locations of the list. In the illustrated embodiment, the memory locations of the list may be repaired by substituting a memory location of spare memory cells 230 of the memory 104, for a memory location having at least one defective memory cell.

In one embodiment, the repair list repository may also include register or other memory locations for various flags 234. For example, a flag may be set indicating that the number of memory locations having at least one defective memory cell exceeds the maximum for a particular memory region of the memory 104. Another flag may be set for each memory region, indicating whether at least one row of the particular memory region has at least one defective memory cell within the particular memory region. Other flags 234 may be stored in the repair list repository 224, depending upon the particular application.

FIGS. 3a, 3b, 3f, 4 show a more detailed example of the test pattern generator 210 of FIG. 2, in accordance with one embodiment of the present description. The logic depicted in FIGS. 3a, 3b, 4 may be implemented in one embodiment, with a hardware finite state machine on board the die of the memory controller 106. This finite state machine may in turn be implemented with hardware logic gates or a software or firmware programmable processor or a combination thereof on the same die as the memory controller 104 or other internal die of the device 100.

The test pattern generator 210 includes a plurality of generators including a programmable address pattern generator 306 which includes at least one address generator 310a, 310b . . . 310n (FIG. 3f), and a loop sequencer circuit 320 adapted to apply to an appropriate one or more of the generators 310a, 310b . . . 310n of the programmable address generator 306, a plurality of nested loop instructions, including a sequential loop 322 (FIG. 3b) of address instructions in a sequence 324 (FIG. 3a) of address instructions, Address Instruction 1, Address Instruction 2 . . . Address Instruction n, to an address generator 310a, 310b . . . 310n. Each address generator 310a, 310b . . . 310n may include one or more finite state machines. Each address instruction, Address Instruction 1, Address Instruction 2 . . . Address Instruction n, of the sequence 324 when executed by an appropriate address generator 310a, 310b . . . 310n, causes that address generator 310a, 310b . . . 310n to generate a pattern of memory cell addresses as a function of the particular address instruction, Address Instruction 1, Address Instruction 2 . . . Address Instruction n, and the particular address generator 310a, 310b . . . 310n, to which it is applied. The test pattern generator 210 (FIG. 2) is adapted to execute memory commands at memory cells addressed by a pattern of memory cell addresses generated by an address instruction, Address Instruction 1, Address Instruction 2 . . . Address Instruction n, being executed in sequence in the loop 322 (FIG. 3b) of address instructions. A counter of the counters 323 of the instruction loop sequencer 320, generates a pointer to the sequence 324 (FIG. 3a) of address instructions, Address Instruction 1, Address Instruction 2 . . . Address Instruction n, which in turn generates the current address instruction to be used. Parameters of the address instructions may include parameters identifying the size of the memory region to be tested, a starting address of the memory region to be tested, and a parameter indicating that a particular address instruction is the last address instruction of the sequence. Additional examples of parameters for address instructions are provided below. It is appreciated that other parameters may be included or utilized, depending upon the particular application.

Figure 3A:
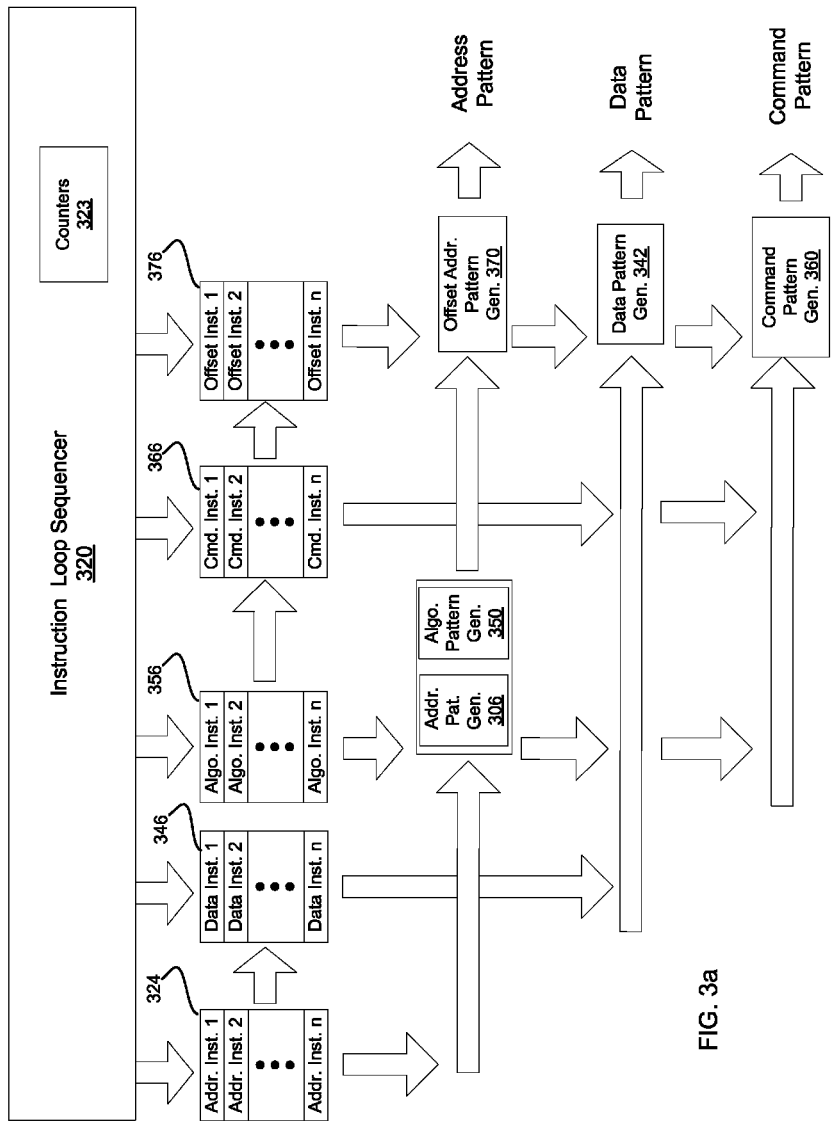
FIG. 3a is a more detailed schematic diagram of one embodiment of a programmable stress test pattern generator of the self-test logic of FIG. 2.
Figure 3B:
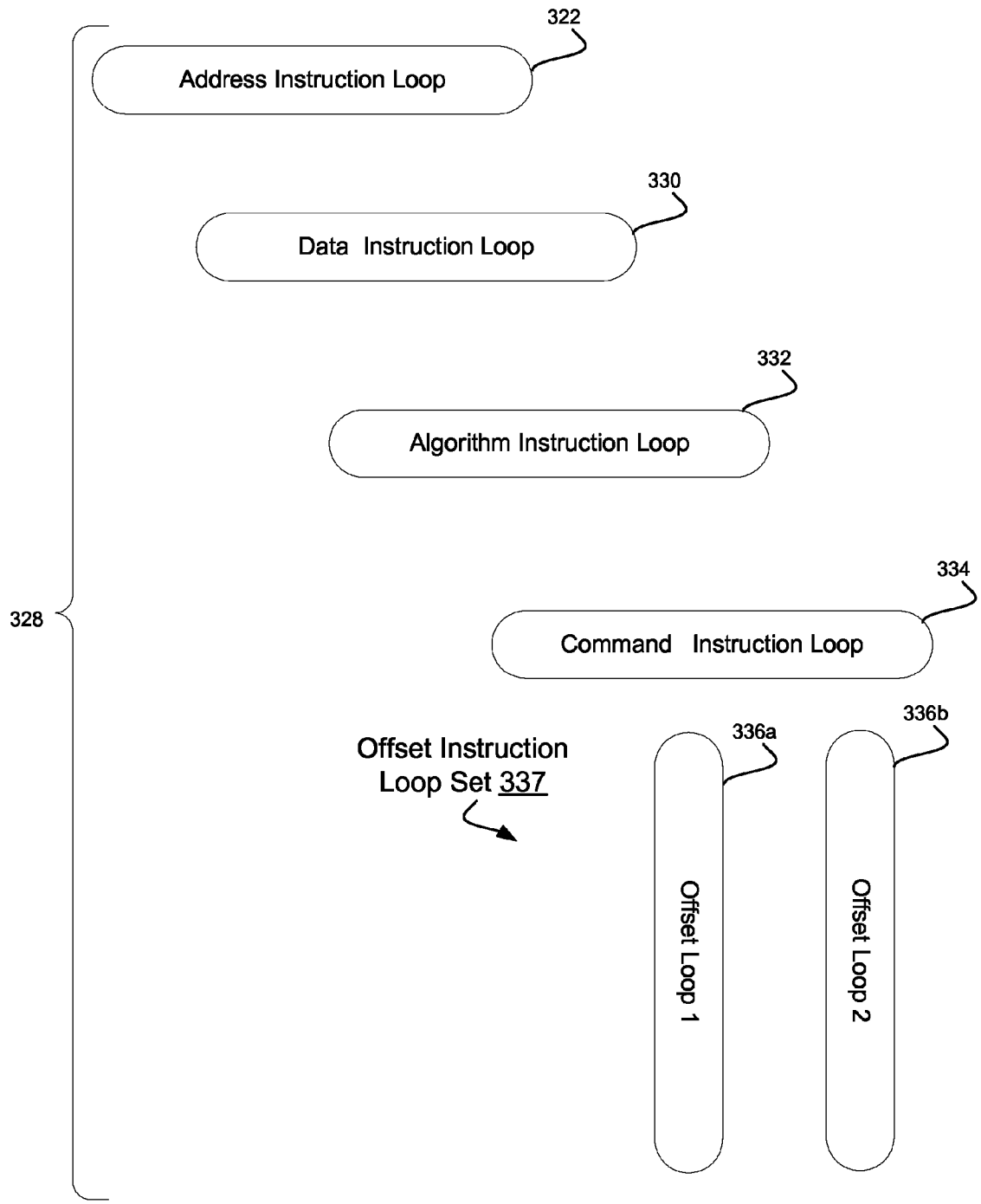
FIG. 3b is a schematic diagram of nested instructions of one embodiment of a programmable stress test pattern generator of the self-test logic of FIG. 2.

For example, FIG. 3b shows a plurality 328 of nested instruction loops including a data instruction loop 330 nested within the address instruction loop 322, an algorithm instruction loop 332 nested within the data instruction loop 330, a command instruction loop 334 nested within the algorithm instruction loop 332, and selectable offset instruction loops 336a, 336b of a set 337 of offset instructions nested within the command instruction loop 334. It is appreciated that in some embodiments, the number and type of nested instruction loops may differ from those illustrated and the order of nesting may be changed as well, depending upon the particular application.

Figures 3C, 6:
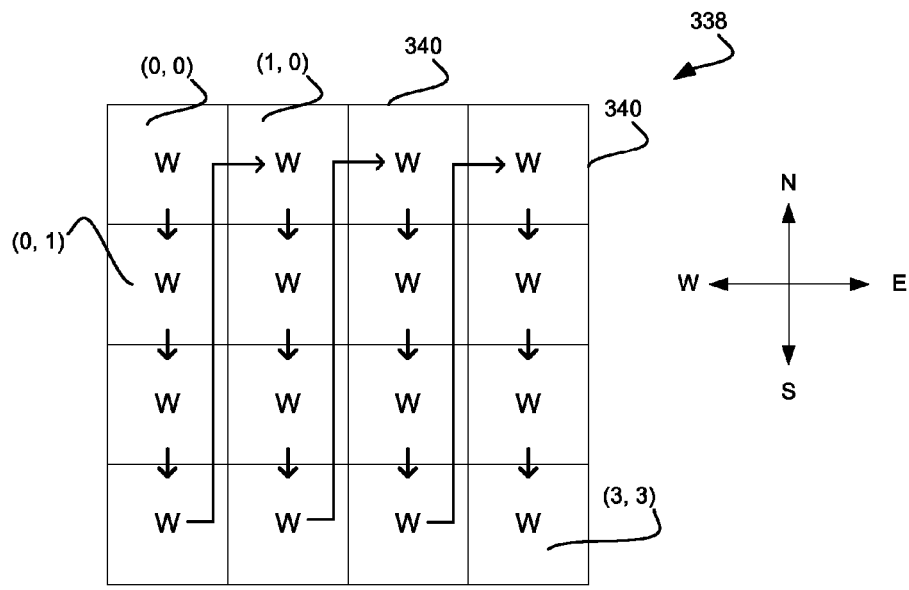
FIG. 3c is a schematic diagram of one example of a stress test pattern which may be generated by the programmable stress test pattern generator of the self-test logic of FIG. 2, in response to a sequence of stress test instructions provided to the programmable stress test pattern generator.
FIG. 6 is a schematic diagram of one embodiment of a repair list repository in accordance with one aspect of the present description.

FIG. 3c shows an example of an address pattern which may be generated by one of the address generators 310a, 310b . . . 310n such as address generator 310a, for example, in response to one of the address instructions, Address Instruction 1, Address Instruction 2 . . . Address Instruction n, such as Address Instruction 1, for example, for a memory region 338 of memory cells 340 of the memory 104. The memory region 338 is represented by a four by four array of memory cells 340 arranged in columns and rows. A typical memory region may be substantially larger and thus may have memory cells numbering in the kilobytes, megabytes, gigabytes, terabytes or more. One example of a memory region is often referred to as a "bank." Each memory cell 340 may store a single bit, a byte, a word or a longer string of bits, depending upon the particular application.

In this example, the address pattern generated is a "walking" pattern in which the generated address of the address pattern "walks" to the next adjacent memory cell of a particular column of memory cells 340. Thus, the address pattern may start at a particular memory cell address which may be represented as an ordered pair of a column address and a row address such the column-row address (0, 0) depicted in FIG. 3*c*. The next address of this particular address pattern may be generated by incrementing the row address portion of the memory cell address to the column-row address (0, 1) depicted in FIG. 3*c*. The remaining addresses of the remaining memory cells of the column are sequentially generated in this fashion.

Once the end of the column is reached, the row address portion may be reset to the original row address and the column address may be incremented to the column-row address (1, 0) depicted in FIG. 3*c*. The remaining addresses of the memory remaining memory cells of the region 338 are sequentially generated in this fashion. Once the end of the last column is reached, the final column-row address (3, 3) of the address pattern is depicted in FIG. 3*c*.

The address pattern which is generated may be readily changed by changing the address instruction, or changing the address generator to which the address instruction is applied, or both. Thus, in the example depicted in FIG. 3*c*, the direction of cell walking may be reversed from that shown in FIG. 3*c*, by providing an appropriate address instruction to an address generator. Other address patterns may walk up one column and then walk down another column, for example. Other address patterns may walk across a row before changing to a different row instead of walking up or down a column. Other address patterns for traversing a memory which are suitable for stress testing a memory may be readily implemented by appropriate selection of address instructions and address generator designs. Thus, parameters of the address instruction may include a parameter defining address generation direction. It is appreciated that other parameters may be included or utilized, depending upon the particular application. It is appreciated that providing multiple address instructions for multiple address generators facilitates implementation of a suitable stress tests for a memory.

In the illustrated embodiment, the sequence 324 (FIG. 3*a*) of address instructions, Address Instruction 1, Address Instruction 2 . . . Address Instruction n, applied to the address generators 310*a*, 310*b* . . . 310*n*, may comprise a sequence of four address instructions, for example. It is appreciated that the number of address instructions in a sequence of address instructions, may vary, depending upon the particular application.

Figure 3D:
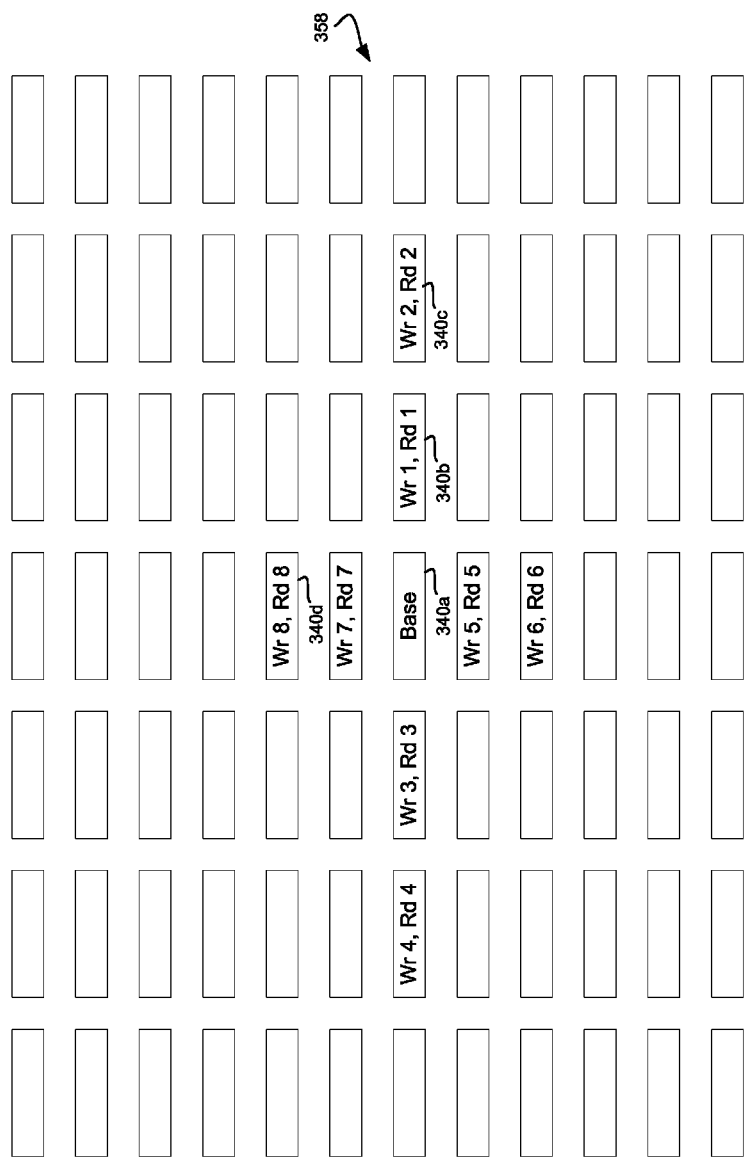
FIG. 3d is a schematic diagram of another example of a stress test pattern which may be generated by the programmable stress test pattern generator of the self-test logic of FIG. 2, in response to a sequence of stress test instructions provided to the programmable stress test pattern generator.
Figure 3F:
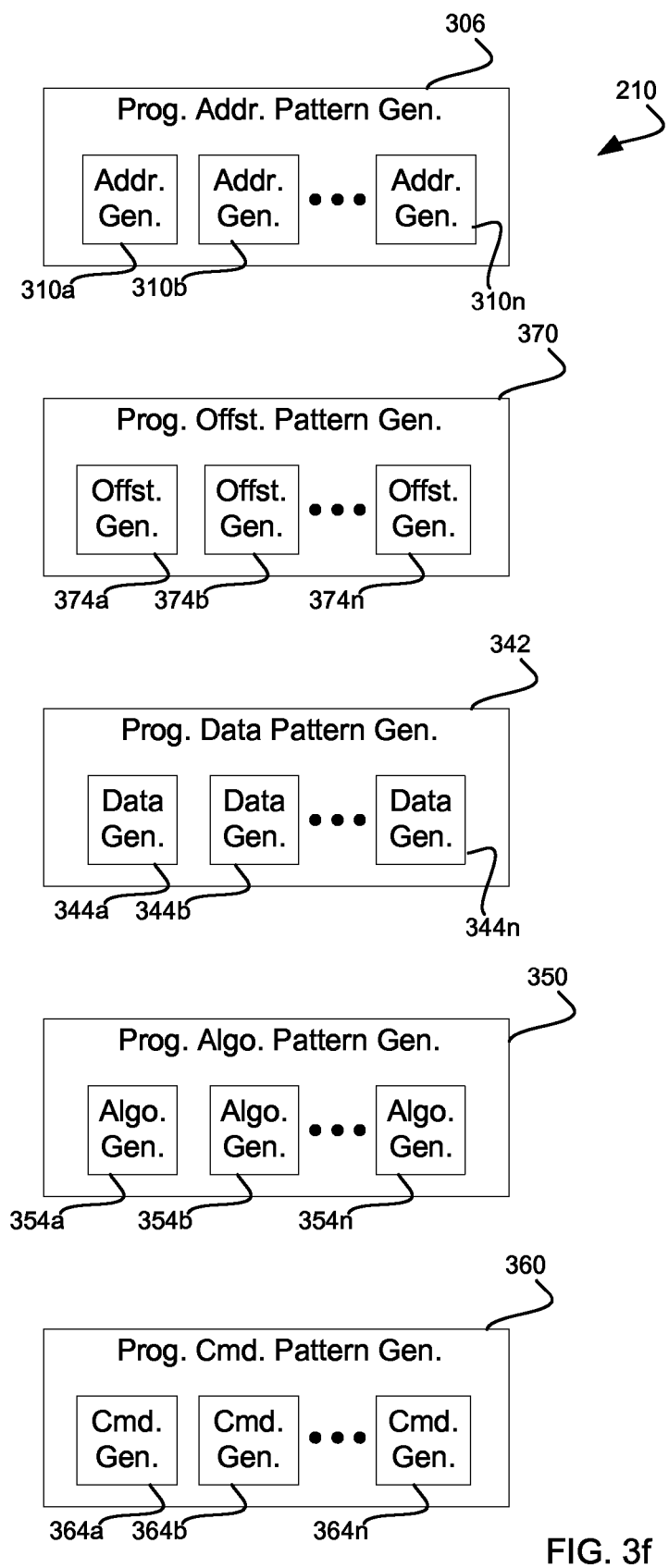
FIG. 3f is a more detailed schematic diagram of one embodiment of pattern generators of a programmable stress test pattern generator of the self-test logic of FIG. 2.

The test pattern generator 210 further includes a programmable data pattern generator 342 which includes at least one data generator 344*a*, 344*b* . . . 344*n* (FIG. 3*f*). The loop sequencer circuit 320 is adapted to apply to appropriate ones of the data generators 344*a*, 344*b* . . . 344*n*, a plurality of nested loop instructions, including a sequential loop 330 (FIG. 3*b*) of data instructions in a sequence 346 (FIG. 3*a*) of data instructions, Data Instruction 1, Data Instruction 2 . . . Data Instruction n. A counter of the counters 323 of the instruction loop sequencer 320, generates a pointer to the sequence 346 (FIG. 3*a*) of data instructions, which in turn generates the current address instruction to be used. A parameter of the data instructions may include a parameter indicating that a particular data instruction is the last address instruction of the sequence. It is appreciated that other parameters may be included or utilized, depending upon the particular application. Each data generator 344*a*, 344*b* . . . 344*n* may include one or more finite state machines. Each data instruction, Data Instruction 1, Data Instruction 2 . . . Data Instruction n, of the sequence 346 when executed by an appropriate one of the data generators 344*a*, 344*b* . . . 344*n*, causes that data generator 344*a*, 344*b* . . . 344*n* to generate a data pattern as a function of the particular data instruction, Data Instruction 1, Data Instruction 2 . . . Data Instruction n, and the particular data generator 344*a*, 344*b* . . . 344*n*, to which it is applied.

The test pattern generator 210 (FIG. 2) is adapted to execute memory commands at memory cells to write a pattern of test data generated by a data instruction being executed in sequence 346 in the loop 330 (FIG. 3*b*) of data instructions, Data Instruction 1, Data Instruction 2 . . . Data Instruction n, in memory cells addressed by a pattern of memory cell addresses generated by an address instruction being executed in sequence in the loop of address instructions. Thus, in the example of FIG. 3*c*, a data generator such as the data generator 344*a*, for example, of the programmable data pattern generator 342, may generate a string of data bits, such as all ones, for example, in response to one of the data instructions such as Data Instruction 1, for example. A generated data bit of the generated data pattern, is written, for example, into each memory cell 340 by the test pattern generator 210 as the address generator 310*a*, for example, in response to one of the address instructions, such as Address Instruction 1, for example, generates the walking address pattern depicted for a memory region 338 of memory cells 340 of the memory 104. Other examples of data patterns which may be generated by the programmable data pattern generator 342 include strings of 0's, checkerboard patterns of alternating 1's and 0's, etc. depending upon the particular application. Thus, the data output by the programmable data pattern generator 342 may be used as write data, for example, to stress test the memory 104 as commands are executed at memory addresses traversing the memory 104. Furthermore, the data output by the programmable data pattern generator 342 may also be used as expected test result data to compare to actual test data obtained as the memory 104 is stress tested. Still further, the generated data patterns may also be used as control signals to control the control signal inputs of the memory 104. Thus, parameters of the data instruction may include parameters indicating whether to invert data and indicating various data backgrounds such as solid, column stripes, row stripes, checkerboard etc. It is appreciated that other parameters may be included or utilized, depending upon the particular application.

In the illustrated embodiment, the sequence 346 (FIG. 3*a*) of data instructions, Data Instruction 1, Data Instruction 2 . . . Data Instruction n, applied to the appropriate data generators 344*a*, 344*b* . . . 344*n*, may comprise a sequence of four data instructions, for example. It is appreciated that the number of data instructions in a sequence of data instructions, may vary, depending upon the particular application.

The test pattern generator 210 further includes a programmable algorithm pattern generator 350 which includes at least one algorithm generator 354*a*, 354*b* . . . 354*n* (FIG. 3*f*). The loop sequencer circuit 320 is adapted to apply to appropriate ones of the algorithm generators 354*a*, 354*b* . . . 354*n*, a plurality of nested loop instructions, including a sequential loop 332 (FIG. 3*b*) of algorithm instructions in a sequence 356 (FIG. 3*a*) of algorithm instructions, Algorithm Instruction 1, Algorithm Instruction 2 . . . Algorithm Instruction n. A counter of the counters 323 of the instruction loop sequencer 320, generates a pointer to the sequence 356 (FIG. 3*a*) of algorithm instructions, which in turn generates the current algorithm instruction to be used. A parameter of the algorithm instructions may include a parameter indicating that a particular algorithm instruction is the last algorithm instruction of the sequence. It is appreciated that other parameters may be included or utilized, depending upon the particular application. Each algorithm generator 354a, 354b . . . 354n may include one or more finite state machines. Each algorithm instruction, Algorithm Instruction 1, Algorithm Instruction 2 . . . Algorithm Instruction n, of the sequence 356 when executed by an appropriate one of the algorithm generators 354a, 354b . . . 354n, causes that algorithm generator 354a, 354b . . . 354n to generate a test data pattern as an output of an algorithm.

In one embodiment, the programmable algorithm test generator 350 inputs the data pattern generated by the programmable data pattern generator 342, and modifies the input data pattern to a modified data pattern in accordance with the algorithm of the selected algorithm generator 354a, 354b . . . 354n executing the selected algorithm instruction, Algorithm Instruction 1, Algorithm Instruction 2 . . . Algorithm Instruction n, of the sequence 356. In other embodiments, the programmable algorithm test generator 350 generates a data pattern as a function of the particular algorithm instruction, Algorithm Instruction 1, Algorithm Instruction 2 . . . Algorithm Instruction n, and the particular algorithm generator 354a, 354b . . . 354n, to which it is applied, without inputting the data pattern generated by the programmable data pattern generator 342.

The test pattern generator 210 (FIG. 2) is adapted to execute memory commands at memory cells to write a data test pattern in accordance with an algorithm instruction being executed in sequence 356 in the loop 332 of algorithm instructions, Algorithm Instruction 1, Algorithm Instruction 2 . . . Algorithm Instruction n, in memory cells addressed by a pattern of memory cell addresses generated by an address instruction being executed in sequence in the loop of address instructions. Thus, the data output by the programmable algorithm test generator 350 may be used as write data, for example, to stress test the memory 104 as commands are executed at memory addresses traversing the memory 104. Sill further, the data output by the programmable algorithm test generator 350 may also be used as expected test result data to compare to actual test data obtained as the memory 104 is stress tested. Still further, the generated data patterns may also be used as control signals to control the control signal inputs of the memory 104.

One example of an algorithm which may be generated by a selected algorithm generator 354a, 354b . . . 354n, such as the algorithm generator 354a, for example, executing a selected algorithm instruction, Algorithm Instruction 1, Algorithm Instruction 2 . . . Algorithm Instruction n, such as the Algorithm Instruction 1, for example, of the sequence 356, is a shift register based random pattern algorithm which may be used for testing interconnects of the memory 104, for example. These random patterns generated by an algorithm generator such as the algorithm generator 354a, for example, executing a selected algorithm instruction, such as the Algorithm Instruction 1, for example, are believed to create white noise on an interconnect to stress the interconnect to test for a defect. As described above, the random pattern may be generated by modifying a test data pattern generated by a generator of the programmable data pattern generator 342, using an algorithm generator of the programmable algorithm pattern generator 350. Alternatively, the random pattern may be generated by an algorithm generator of the programmable algorithm pattern generator 350 without modifying a test data pattern generated by a generator of the programmable data pattern generator 342.

Another example an algorithm which may be generated by a selected algorithm generator 354a, 354b . . . 354n, such as the algorithm generator 354b, for example, executing a selected algorithm instruction, Algorithm Instruction 1, Algorithm Instruction 2 . . . Algorithm Instruction n, such as the Algorithm Instruction 2, for example, of the sequence 356, is a neighbor interaction based address walking algorithm. This algorithm may be used, for example, for testing memory cells of dynamic random access memories which are primarily capacitive in nature. In accordance with the neighbor interaction based address walking algorithm, if all neighboring cells in the memory are switched, a cross coupling effect may cause a cell under test to flip to the wrong digital value.

FIG. 3d shows an example of a neighbor interaction based address walking algorithm which may be generated by the algorithm generator 354b, for example, executing the Algorithm Instruction 2, for example, of the sequence 356, for a memory region 358 of memory cells 340 of the memory 104. The memory region 358 is represented by a seven by twelve array of memory cells 340 arranged in columns and rows.

In this algorithm a memory cell 340a designated "Base", the address of which is generated by an address generator as a "base address", is stressed by neighbors cells within two cells away from it. Thus the test pattern generator 210 (FIG. 2) is adapted to execute a first set of memory commands, write (Wr 1) and read (Rd 1) at a first neighbor memory cell 340b, a second set of memory commands, write (Wr 2) and read (Rd 2) at a second neighbor memory cell 340b, and so on finishing with an eighth set of memory commands, write (Wr 8) and read (Rd 8) at an eighth neighbor memory cell 340d, in accordance with a neighbor interaction based address walking algorithm which may be generated by the algorithm generator 354b, for example, executing the Algorithm Instruction 2, for example, of the sequence 356.

Parameters of the algorithm instructions may further include parameters indicating the starting command of a sequence of commands, the starting address direction for that sequence of commands, whether data is to be inverted, one or more wait periods to prevent a new algorithm instruction from beginning until the wait condition is satisfied, whether to reset a counter such an instruction counter for a sequence of instructions such as a sequence of command instructions, for example. It is appreciated that other parameters may be included or utilized, depending upon the particular application.

It is appreciated that the algorithm instructions, Algorithm Instruction 1, Algorithm Instruction 2 . . . Algorithm Instruction n, of the sequence 356 when executed by an appropriate one of the algorithm generators 354a, 354b . . . 354n, may implement other algorithms for stress testing the memory 104, depending upon the particular application. In the illustrated embodiment, the sequence 356 (FIG. 3a) of algorithm instructions, Algorithm Instruction 1, Algorithm Instruction 2 . . . Algorithm Instruction n applied to the appropriate algorithm generators 354a, 354b . . . 354n, may comprise a sequence of eight algorithm instructions, for example. It is appreciated that the number of algorithm instructions in a sequence of algorithm instructions, may vary, depending upon the particular application.

The test pattern generator 210 further includes a programmable command pattern generator 360 which includes at least one command generator 364a, 364b . . . 364n (FIG. 3f). The loop sequencer circuit 320 is adapted to apply to appropriate ones of the command generators 364a, 364b . . . 364n, a plurality of nested loop instructions, including a sequential loop 334 (FIG. 3b) of command instructions in a sequence 366 (FIG. 3a) of command instructions, Command Instruction 1, Command Instruction 2 . . . Command Instruction n. A counter of the counters 323 of the instruction loop sequencer 320, generates a pointer to the sequence 366 (FIG. 3a) of command instructions, which in turn generates the current command instruction to be used. A parameter of the command instructions may include a parameter indicating that a particular command instruction is the last command instruction of the sequence. It is appreciated that other parameters may be included or utilized, depending upon the particular application. Each command generator 364a, 364b . . . 364n may include one or more finite state machines. Each Command instruction, Command Instruction 1, Command Instruction 2 . . . Command Instruction n, of the sequence 366 when executed by an appropriate one of the command generators 364a, 364b . . . 364n, causes that command generator 364a, 364b . . . 364n to generate a pattern of commands as a function of the particular selected command generator and the particular selected command instruction.

The test pattern generator 210 (FIG. 2) is adapted to execute a pattern of memory commands at memory cells in accordance with a command instruction being executed in sequence 366 in the loop 334 of command instructions, Command Instruction 1, Command Instruction 2 . . . Command Instruction n, in memory cells addressed by a pattern of memory cell addresses generated by an address instruction being executed in sequence in the loop of address instructions. The data of the write commands is provided by one or both of the programmable data pattern generator 342 and the programmable algorithm generator 350 as discussed above. In addition to providing data to be written to the memory 104, the generated data patterns may also be used for control signal commands of the programmable command pattern generator 360 to control the control signal inputs of the memory 104.

In the illustrated embodiment, the sequence 366 (FIG. 3a) of command instructions, Command Instruction 1, Command Instruction 2 . . . Command Instruction n, which are applied to the appropriate command generators 364a, 364b . . . 364n, may comprise a sequence of twenty-four command instructions, for example. It is appreciated that the number of command instructions in a sequence of command instructions, may vary, depending upon the particular application.

In one embodiment, each command instructions, Command Instruction 1, Command Instruction 2 . . . Command Instruction n, may instruct an appropriate command generator of the command generators 364a, 364b . . . 364n to generate a single command such as a memory write or memory read command, for example. In other embodiments, each command instruction, Command Instruction 1, Command Instruction 2 . . . Command Instruction n, may instruct an appropriate command generator of the command generators 364a, 364b . . . 364n to generate a sequence of commands.

For example, in the stress test pattern depicted in FIG. 3c, a single command, in this example, a write command, is executed for each memory cell of the memory region 338, as the programmable address pattern generator 306 generates a pattern of addresses which walks through the memory region 338 as shown. FIG. 3e depicts a multi-part stress test which employs a sequence of commands. In part 1 of the stress test of FIG. 3e, in a manner similar to that of the stress test pattern depicted in FIG. 3c, a single command, in this example, a write command, is executed for each memory cell of the memory region 338, as the programmable address pattern generator 306 generates a pattern of addresses which walks through the memory region 338 as shown, to initialize the memory region 338. Once memory region 338 has been initialized with a write command to each memory cell in part 1 of the stress test, a sequence of commands, in this example, a quick read command (R) followed by a write inverse (Wbar) command, is executed for each memory cell of the same memory region 338, as the programmable address pattern generator 306 again generates the same pattern of addresses generated in part 1, which again walks through the memory region 338 a second time as shown. Following part 2 of the stress test, another sequence of commands, in this example, a quick read inverse (Rbar) command followed by a write (W) command, is executed for each memory cell of the same memory region 338, as the programmable address pattern generator 306 again generates the same pattern of addresses generated in parts 1 and 2, which again walks through the memory region 338 a third time as shown.

In one embodiment, each command instruction may be applied to a common finite state machine of a command generator. It is appreciated that in other embodiments, command instructions may be applied to different finite state machine of various command pattern generators.

In one embodiment, each command instruction defines one command to execute. A sequence of commands may be provided by a sequence of command instructions, each of which may be applied to a particular memory address in sequence. The sequence of commands may then be applied over a sequence of different addresses, one address location at a time over the course of a stress test. It is appreciated that in other embodiments, a command instruction may define more than one command in a sequence.

Thus, in one embodiment, parameters of a command instruction may include parameters indicating a read or write command, whether data for the command is to be inverted, identifying an alternate data source, and a "hammer" function" in which specifies repeated write operations. It is appreciated that other parameters may be utilized, depending upon the particular application.

The test pattern generator 210 further includes a programmable address offset pattern generator 370 which includes at least one offset generator of the offset generators 374a, 374b . . . 374n (FIG. 3f). Each offset generator 374a, 374b . . . 374n is adapted to generate a pattern of address offsets to offset a base address generated by the programmable address pattern generator 306. The loop sequencer circuit 320 is adapted to apply to appropriate ones of the offset generators 374a, 374b . . . 374n, a plurality of nested loop instructions, including a selected sequential loop 336a, 336b (FIG. 3b) of offset instructions in a sequence 376 (FIG. 3a) of offset instructions, Offset Instruction 1, Offset Instruction 2 . . . Offset Instruction n. A counter of the counters 323 of the instruction loop sequencer 320, generates a pointer to the sequence 376 (FIG. 3a) of offset instructions, which in turn generates the current offset instruction to be used. A parameter of the offset instructions may include a parameter indicating that a particular offset instruction is the last offset instruction of the sequence. It is appreciated that other parameters may be included or utilized, depending upon the particular application. Each offset generator 374a, 374b . . . 374n may include one or more finite state machines. Each Offset instruction, Offset Instruction 1, Offset Instruction 2 . . . Offset Instruction n, of the sequence 376 when executed by an appropriate one of the offset generators 374a, 374b . . . 374n, causes that offset generator 374a, 374b . . .

374n to generate a pattern of address offsets as a function of the particular selected offset generator and the particular selected offset instruction.

The test pattern generator 210 (FIG. 2) in executing memory commands at memory cells is adapted to execute a pattern of commands generated by a command instruction being executed in sequence 366 in the loop 334 of command instructions in memory cells addressed by a pattern of memory cell addresses generated by an address instruction being executed in sequence 324 in the loop 322 of address instructions and offset by the pattern of memory address offsets generated by a memory address offset instructions, Offset Instruction 1, Offset Instruction 2 . . . Offset Instruction n, being executed in sequence 376 in the loop 336a, 336b of memory address offset instructions. In this manner, a base address of the address pattern generated by the programmable address pattern generator 306 may be offset by one or more address offsets of the offset pattern generated by the programmable offset pattern generator 370. The data of the write commands is provided by one or both of the programmable data pattern generator 342 and the programmable algorithm generator 350 as discussed above.

In the illustrated embodiment, the sequence 376 (FIG. 3a) of offset instructions, Offset Instruction 1, Offset Instruction 2 . . . Offset Instruction n, which are applied to the appropriate offset generators 374a, 374b . . . 374n, may comprise a sequence of two offset instructions, for example. It is appreciated that the number of offset instructions in a sequence of offset instructions, may vary, depending upon the particular application.

In one embodiment, one loop of offset instructions such as loop 336a, for example, may be a loop of offset address instructions which create a variety of possible offset operations in an address range relative to the current base address. The offset address commands allow a sequence of offset address commands, such as a sequence of six offset address commands, for example, to be sequentially executed in each loop 336a. An offset address instruction of this loop may include parameters indicating the direction of offset such as north, south, east or west of the base address, for example, whether a stripe is involved, and that a particular offset address instruction is the last offset address instruction of the sequence. In one embodiment, the stripe function disables the normal carry from row to column or column to row during the offset address increments. It is appreciated that other parameters may be included or utilized, depending upon the particular application.

In one embodiment, one loop of offset instructions such as loop 336b, for example, may be a loop of offset command instructions that may be sequentially executed in the loop 336b. An offset address instruction of this loop may include parameters indicating a read or write command, whether data for the offset command is to be inverted, identifying an alternate data source, whether to use the base address or an offset address, a "hammer" function" which specifies repeated write operations, and that a particular offset command instruction is the last offset command instruction of the sequence. It is appreciated that other parameters may be utilized, depending upon the particular application.

In one embodiment, in connection with a command instruction of the sequence 366 of command instructions, an offset instruction as described above may be substituted for a current command instruction by setting an offset command substitution parameter of the command instruction of the sequence 366. In addition, the offset loop 336a, 336b of the offset command to be substituted may be indicated by an offset loop identifying parameter of the command instruction of the sequence 366. As previously mentioned, FIG. 3d shows an example of a neighbor interaction based address walking algorithm stress test. In this stress test, a memory cell 340a designated "Base" is stressed by neighbors cells within two cells away from it. The base address which is the address of the memory cell 340a, is generated by the programmable address generator 306. The addresses of the neighbors of the base cell 340a are generated by modifying the base address of the base cell 340a with the address offsets generated by the programmable address offset pattern generator 370. For example, the address of the neighbor cell 340b may be generated by adding a column offset of "one" to the address of the base cell 340. The address of the neighbor cell 340c may be generated by adding a column offset of "two" to the address of the base cell 340a or may be generated by adding a column offset of "one" to the generated address of the neighbor cell 340b. Similarly, the address of the neighbor cell 340d may be generated by subtracting a row offset of "two" from the address of the base cell 340a. The address offsets may be generated by the offset generator 374a, for example, executing the Offset Instruction 1, for example.

Thus the test pattern generator 210 (FIG. 2) is adapted to execute a first set of memory commands, write (Wr 1) and read (Rd 1) at a first neighbor memory cell 340b, a second set of memory commands, write (Wr 2) and read (Rd 2) at a second neighbor memory cell 340b, and so on finishing with an eighth set of memory commands, write (Wr 8) and read (Rd 8) at an eighth neighbor memory cell 340d, in accordance with a neighbor interaction based address walking algorithm at addresses which may be generated by the programmable address generator 306, offset by the address offset pattern generated by the programmable address offset generator 370.

Figure 4:
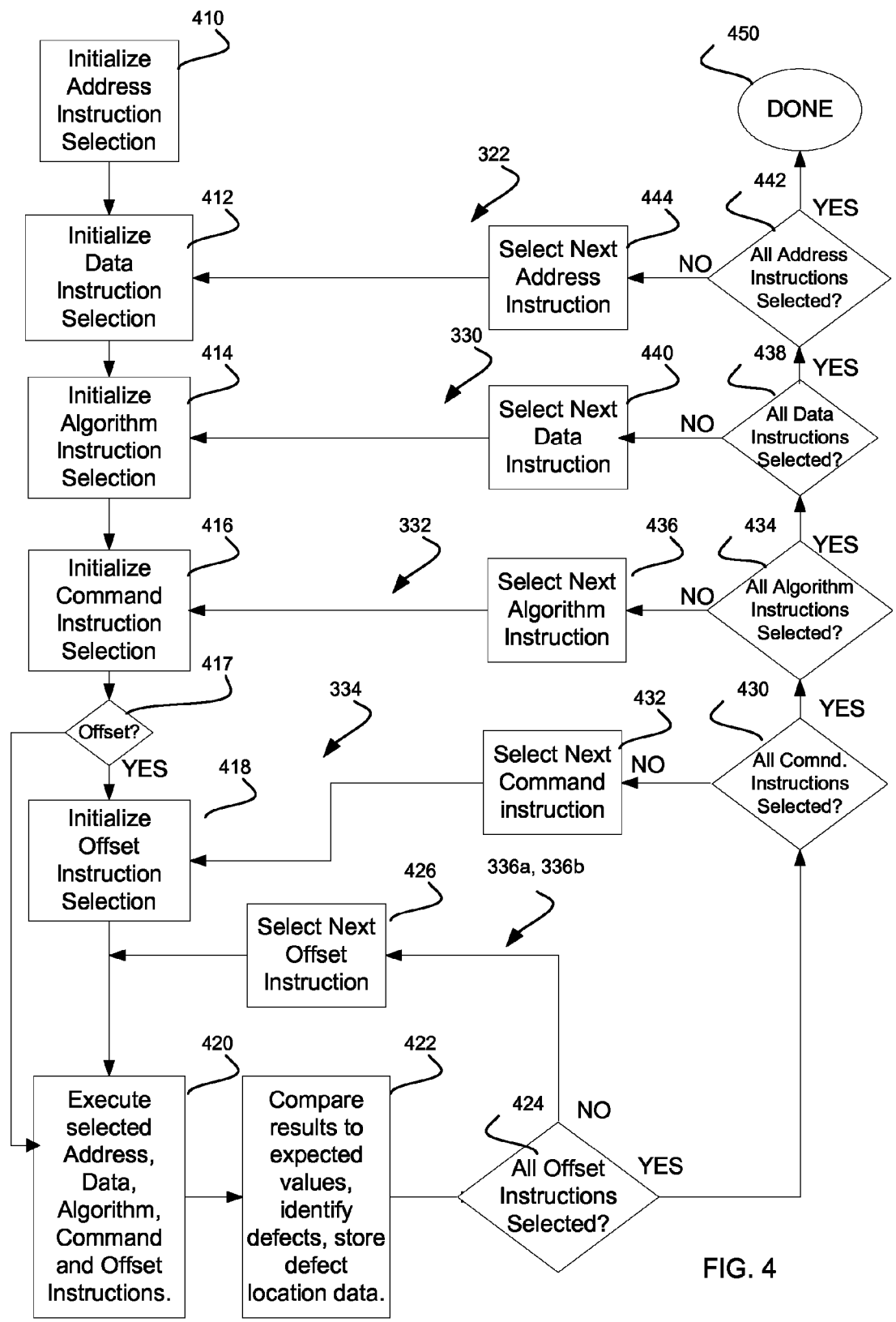
FIG. 4 depicts one embodiment of operations in accordance with one aspect of the present description, of the programmable stress test pattern generator of the self-test logic of FIG. 2, generating stress test patterns in response to sequences of stress test instructions arranged in nested loops.

FIG. 4 depicts one example of operations of the self-test logic 110 of FIG. 1 implementing the nested loop structure depicted in FIG. 3b. The instruction sequences may In a first operation, address instruction selection is initialized (block 410) to select the first address instruction such as Address Instruction 1, for example. It is appreciated that address instruction selection may be initialized to select another address instruction of the sequence 324 of address instructions, depending upon the particular application. In a similar manner, data instruction selection is initialized (block 412) to select the first data instruction such as Data Instruction 1, for example, algorithm instruction selection is initialized (block 414) to select the first algorithm instruction such as Algorithm Instruction 1, for example, command instruction selection is initialized (block 416) to select the first command instruction such as Command Instruction 1, for example, and if there is an offset (block 417) an offset instruction selection is initialized (block 418) to select the first offset instruction such as Offset Instruction 1, for example. It is appreciated that data, algorithm, command and offset instruction selection may be initialized to select another instruction of the respective sequences 346, 356, 366, and 376, of instructions, depending upon the particular application. Once the initial instruction has been selected for the programmable pattern generators 306, 342, 350, 360 and 370, the instructions may be applied to the appropriate generators of the programmable pattern generators 306, 342, 350, 360 and 370 and executed (block 420) to generate the selected address, data, algorithm, command and offset patterns to generate the appropriate stress tests of the memory 104.

For example, FIG. 3c discussed above depicts a stress test which employs a single command, a write command in this example, which is generated by the programmable command pattern generator 360 in response to the Command Instruction 1, in this example. The write command is executed for each memory cell of the memory region 338, as the programmable address pattern generator 306 in response to the Address Instruction 1, in this example, generates a pattern of addresses which walks through the memory region 338 as shown, to initialize the memory region 338. The same bit (or bits if a multi-bit cell) may be written into each memory cell of the memory region 338, or the bits may vary from cell to cell, as defined by the data pattern generated by the programmable data pattern generator 342 in response to the Data Instruction 1, in this example.

In one embodiment, the stress test of FIG. 3c does not employ address offsets and accordingly, the programmable offset pattern generator 370 may, in response to the Offset Instruction 1, pass the addresses generated by the programmable address pattern generator 306 unmodified. In another embodiment, the walking pattern may be generated by sequentially applying column and row offsets to a base address generated by the programmable address pattern generator 306. Similarly, depending upon the particular stress test, the programmable algorithm pattern generator 350, in response to the Algorithm Instruction 1, may pass the write data generated by the programmable pattern generator 342 unmodified by a particular algorithm.

Once a stress test has been applied to a particular memory region or regions in response to the execution of the initial set of programmable pattern generator instructions, the memory defect detector 220 (FIG. 2) compares (block 422, FIG. 4) the results of the stress test to expected values and identifies defects (if any) in the memory region or regions tested and stores appropriate defect location data in the repair list repository 224 (FIG. 2) of failing addresses.

As previously mentioned, the self-test logic 110 (FIG. 1) executes a nested loop 336a, 336b (FIG. 3b) of offset instructions, nested within the command instruction loop 334. A determination (block 424) is made as to whether all of the offset instructions of the offset instruction sequence 376 (FIG. 3a) have been selected. If not, the next offset instruction, such as Offset Instruction 2, for example, in the sequence 376 of offset instructions is selected (block 426) for the programmable offset pattern generator 370. Since the offset instruction loop 336a, 336b is nested within the command loop 334, the command instruction as well as the algorithm, data and address instructions remain unchanged at this point. Accordingly, the selected offset instruction together with the initial instructions selected for the programmable pattern generators 306, 342, 350, and 360 may be applied to the appropriate generators of the programmable pattern generators 306, 342, 350, 360 and 370 and executed (block 420) to generate the selected address, data, algorithm, command and offset patterns to generate the appropriate stress tests of the memory 104.

If it is determined (block 424) that all of the offset instructions of the offset instruction sequence 376 (FIG. 3a) have been selected (and executed), a determination (block 430) is made as to whether all of the command instructions of the command instruction sequence 366 (FIG. 3a) have been selected. If not, the next command instruction, such as Command Instruction 2, for example, in the sequence 366 of command instructions is selected (block 432) for the programmable command pattern generator 360. Since the command instruction loop 334 is nested within the algorithm instruction loop 332, the algorithm instruction as well as the data and address instructions remain unchanged at this point. However, the offset instruction selection is reinitialized (block 418) to the first instruction of the offset instruction sequence 376 (FIG. 3a). Accordingly, the selected command instruction together with the initial instructions selected for the programmable pattern generators 306, 342, 350 and 370 may be applied to the appropriate generators of the programmable pattern generators 306, 342, 350, 360 and 370 and executed (block 420) to generate the selected address, data, algorithm, command and offset patterns to generate the appropriate stress tests of the memory 104.

As previously mentioned, FIG. 3e depicts a multi-part stress test which employs a sequence of commands, which may be generated by the programmable command generator 360. In part 1 of the stress test of FIG. 3e, a single command, in this example, a write command, is executed in response to an initial command instruction, such as Command Instruction 1, for example, for each memory cell of the memory region 338, as the programmable address pattern generator 306 generates in response to an initial address instruction, such as Address Instruction 1, for example, a pattern of addresses which walks through the memory region 338 as shown, to initialize the memory region 338. Once memory region 338 has been initialized with a write command to each memory cell in part 1 of the stress test, a sequence of commands, in this example, a quick read command (R) followed by a write inverse (Wbar) command, is executed for each memory cell of the same memory region 338, as the programmable address pattern generator 306 again generates the same pattern of addresses generated in part 1, which again walks through the memory region 338 a second time as shown for part 2.

In one embodiment, the second sequence of commands (a quick read command (R) followed by a write inverse (Wbar) command) of part 2 may be generated in response to a second selected command instruction such as Command Instruction 2, for example, as the programmable address pattern generator 306 generates in response to the unchanged initial address instruction, such as Address Instruction 1, for example, the same pattern of addresses which again walks through the memory region 338 for part 2 of the stress test. In another embodiment, each command may be generated in response to a single command instruction.

Following part 2 of the stress test, another sequence of commands, in this example, a quick read inverse (Rbar) command followed by a write (W) command, is executed for each memory cell of the same memory region 338, as the programmable address pattern generator 306 again generates the same pattern of addresses generated in parts 1 and 2, which again walks through the memory region 338 a third time as shown for part 3. Again, in one embodiment, the sequence of commands of part 3 may be generated in response to a third selected command instruction. In another embodiment, the sequence of commands of part 3 may be generated in response to a single command instruction which also generated the commands of parts 1 and 2 of the stress test.

FIG. 3d shows an example of a neighbor interaction based address walking algorithm stress test as discussed above. To generate the neighbor interaction based address walking algorithm stress test, one or more offset instructions may be employed in the sequence 376 of offset instructions to generate appropriate offset addresses to address the neighbor cells of the base cell as shown. In addition, one or more command instructions may be employed in the sequence 366 of command instructions to generate the appropriate sequence of commands for each neighbor cell as shown.

If it is determined (block 430, FIG. 4) that all of the command instructions of the command instruction sequence 366 (FIG. 3a) have been selected (and executed), a determination (block 434) is made as to whether all of the algorithm instructions of the algorithm instruction sequence 356 (FIG. 3a) have been selected. If not, the next algorithm instruction, such as Algorithm Instruction 2, for example, in the sequence 356 of algorithm instructions is selected (block 436) for the programmable algorithm pattern generator 350. Since the algorithm instruction loop 332 is nested within the data instruction loop 330, the data instruction as well as the address instruction remain unchanged at this point. However, the command instruction selection is reinitialized (block 416) as well as the offset instruction selection (block 418) to the first instruction of the respective instruction sequence 366, 376 (FIG. 3a). Accordingly, the next selected algorithm instruction together with the initial instructions selected for the programmable pattern generators 306, 342, 350, 360 and 370 may be applied to the appropriate generators of the programmable pattern generators 306, 342, 350, 360 and 370 and executed (block 420) to generate the selected address, data, algorithm, command and offset patterns to generate the appropriate stress tests of the memory 104.

If it is determined (block 434) that all of the algorithm instructions of the algorithm instruction sequence 356 (FIG. 3a) have been selected (and executed), a determination (block 438) is made as to whether all of the data instructions of the data instruction sequence 346 (FIG. 3a) have been selected. If not, the next data instruction, such as Data Instruction 2, for example, in the sequence 346 of data instructions is selected (block 440) for the programmable data pattern generator 342. Since the data instruction loop 330 is nested within the address instruction loop 322, the address instruction remains unchanged at this point. However, the algorithm instruction selection is reinitialized (block 414) as well as the command selection (block 416) and the offset instruction selection (block 418) to the first instruction of the respective instruction sequences 356, 366, 376 (FIG. 3a). Accordingly, the selected data instruction together with the initial instructions selected for the programmable pattern generators 306, 350, 360 and 370 may be applied to the appropriate generators of the programmable pattern generators 306, 342, 350, 360 and 370 and executed (block 420) to generate the selected address, data, algorithm, command and offset patterns to generate the appropriate stress tests of the memory 104.

If it is determined (block 438) that all of the data instructions of the data instruction sequence 346 (FIG. 3a) have been selected (and executed), a determination (block 442) is made as to whether all of the address instructions of the address instruction sequence 324 (FIG. 3a) have been selected. If not, the next address instruction, such as Address Instruction 2, for example, in the sequence 324 of address instructions is selected (block 444) for the programmable address pattern generator 306. The data instruction selection is reinitialized (block 412) as well as the algorithm instruction selection (block 414), command instruction selection (block 416) and the offset instruction selection (block 418) to the first instruction of the respective instruction sequences 346, 356, 366, 376 (FIG. 3a). Accordingly, the selected address instruction together with the initial instructions selected for the programmable pattern generators 342, 350, 360 and 370 may be applied to the appropriate generators of the programmable pattern generators 306, 342, 350, 360 and 370 and executed (block 420) to generate the selected address, data, algorithm, command and offset patterns to generate the appropriate stress tests of the memory 104. Once all of the address instructions of the address instruction sequence 324 (FIG. 3a) have been selected (block 442), the test pattern generation is done (block 450) unless new instructions are loaded into the sequences 324, 346, 356, 366, 376, and executed, repeating the test pattern generation and execution depicted in FIG. 4.

Figure 5:
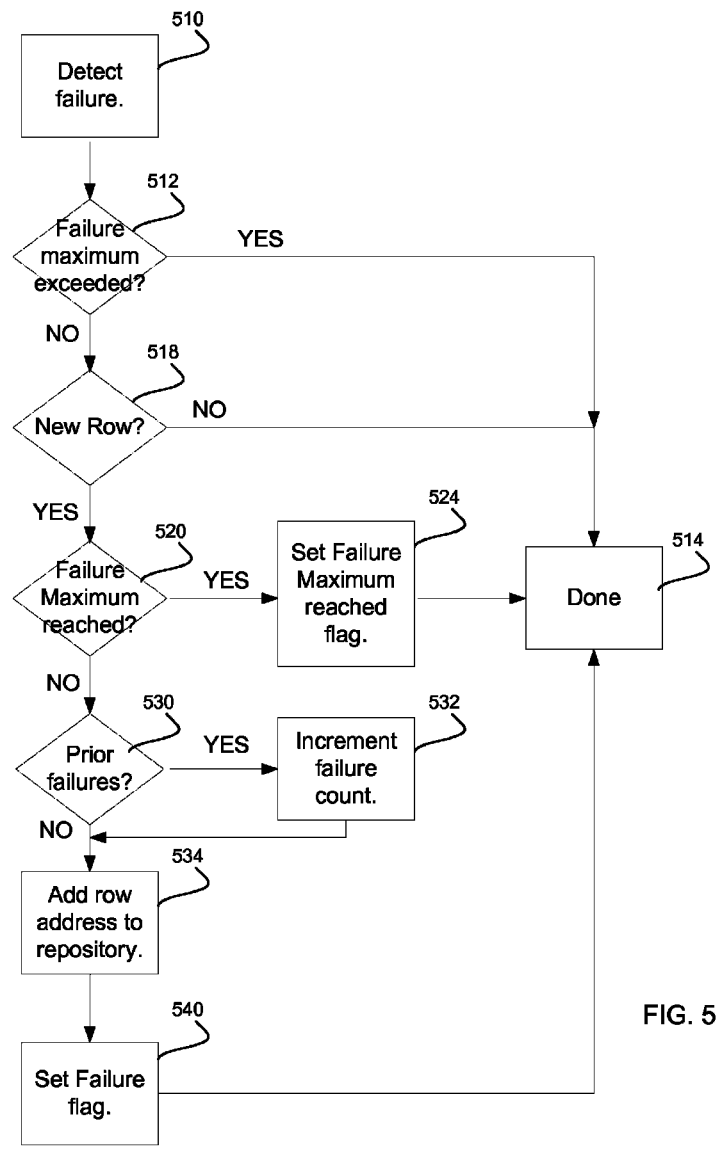
FIG. 5 depicts one embodiment of operations in accordance with one aspect of the present description, of the defect detector logic circuit of FIG. 2, detecting and recording addresses of memory locations containing a defective memory cell in a repair list repository.

FIG. 5 depicts one example of defect detection and recording operations of the defect detector circuit 220 of FIG. 2. The logic depicted in FIG. 5 may be implemented in one embodiment, with a hardware finite state machine on board the die of the memory controller 106. This finite state machine may in turn be implemented with hardware logic gates or a software or firmware programmable processor or a combination thereof on the same die as the memory controller 104 or other internal die of the device 100.

The defect detector circuit 220 detects (block 510) a failure of a memory cell in response to a stress test applied by the test pattern generator 210 using a stress test pattern generated by the test pattern generator 210. As described above, a stress test may include memory commands including read commands, write commands or both, or control signals or both, which are applied to the memory 104 or a region thereof. Data is read from the memory 104 and compared to expected results.

The comparison of actual to expected results may indicate a defect in a memory cell. If so, a determination is made as to whether (block 512) the maximum number of defects has already been reached. In one embodiment, the memory cells may be arranged in a plurality of memory regions and a fixed number of spare rows of memory cells may be available to be substituted for each row of memory cells containing a defective cell. Thus, for a bank of memory cells, for example, there may be a maximum of two spare rows of cells to available to replace rows having defective cells in that particular bank of cells. It is appreciated that the number of spare rows of cells available for a particular region may vary, depending upon the particular application. Thus, although stress testing and repair is described herein with respect to rows and banks of memory cells, it is appreciated that stress testing and repair may be organized at other levels such as on a rank basis, or chip basis or any memory region or portion thereof.

In some embodiments, the number of spare rows may exceed the number of repair list repository locations for storing row addresses of rows containing defects, for a particular bank of memory. Accordingly, the maximum number of defects will be equal to the number of spare rows available or the number of repair list repository locations available, whichever is less, for a particular bank of the memory 104.

It is understood that it may not be cost effective in some embodiments to implement a repair list repository 224 with a relatively large number of locations for storing the addresses or rows needing repair. However if the number of repairable elements exceeds the number of repair list repository locations, the test and repair process may be repeated, finding additional failing rows on each iteration, referred to herein as two pass, three pass or n-pass testing. In this manner it may be possible to test and repair memory devices with a large number of defects, while employing a relatively limited number of repository locations.

The number of spare rows (or repair list repository locations) available for each bank of the memory 104 may be set by a user setting a configuration register 232 (FIG. 2), for example, via the portal 126 prior to the initiation of testing. In other embodiments, the number of spare rows (or repair list repository locations) available for each bank of the memory 104 may be set as a fixed value at the time of manufacture of the device 100.

Thus, a determination may be made as to whether the number of memory locations such as rows, for example, having at least one defective memory cell exceeds a maximum for a particular memory region, such as a bank of memory cells, for example. In one embodiment, such a determination may be made by checking a flag (such as a flag of the flags 234 of FIG. 2, for example) which when set, indicates that the failure maximum has been reached. Thus, upon detecting (block 510) a defective memory cell, it may be determined whether (block 512) the maximum number of defects has already been reached for the region in which the defect was found, by checking the status of the failure maximum flag for that region. If the maximum has already been reached such that the additional defect exceeds the maximum, the detection and recording process is ended (block 514) for that particular defect.

In this manner, the failure maximum flag provides an overflow indicator which indicates whether additional repair is possible for a particular bank. In one embodiment, stress testing of a bank may continue after the failure maximum flag has been set to determine whether additional defects exist in that bank notwithstanding that additional spare rows (or additional repair list repository locations) are not available for use in connection replacement of any such additional defects. If appropriate, a failure maximum flag may be reset by a write operation to a configuration register of the flags 234 via the portal 126 or by an explicit reset operation.

If the maximum number of defects has not been exceed, a determination is made as to whether (block 518) the row of the defective memory cell is new, that is, whether the defective memory cell is the first known defective memory cell of a set of memory locations such as a row of memory cells, for example. As previously mentioned, in the illustrated embodiment, the memory may be repaired by replacing a row of memory cells containing a defective cell with an entire row of spare cells. Hence, if the row is not new and unique, that is, it has already been designated for replacement, then the defect is not the first defect discovered for that row, and the detection and recording process is ended (block 514) for that particular defect.

As explained below, a row or other set of memory locations containing a defective memory cell may be designated for replacement in a memory configured as a repair list repository, such as the repair list repository 224 (FIG. 2) of failing memory addresses. In such an embodiment, it may be determined as to whether (block 518) the defective memory cell is the first known defective memory cell of a row of memory cells, for example, by determining if the row of memory cells containing the defective memory cell of a particular memory region of memory cells, has already been stored as an entry in the list of the repair list repository 224. If so, the defective memory cell is determined to not be the first known defective cell of that row, and storing a designation of that row containing the defective memory cell in the repair list repository as an entry of the list of memory locations may be bypassed (block 514), since the particular row of memory cells of the particular memory region of memory cells has already been stored as an entry in the list of the repair list repository.

If it is determined (block 518) that the defective memory cell is the first known defective memory cell of a set of memory locations such as a row of memory cells, for example, a determination may be made as to whether the number of memory locations such as rows, for example, having at least one defective memory cell has reached (block 520) the maximum for a particular memory region, such as a bank of memory cells, for example. If so, the aforementioned failure maximum flag may be set (block 524) and the detection and recording process is ended (block 514) for that particular defect. In one embodiment, the failure maximum may be set to indicate when the supply of spare rows available for replacement of defective rows has been exhausted for a particular memory region.

If the failure maximum has not been reached, indicating that additional spare rows are available for use as replacement for defective rows for a particular memory region, a determination is made as to whether (block 530) there have been prior failures of other rows detected. If so, a counter representing a failure count is incremented (block 532). This failure count may be compared to the failure maximum in a subsequent determination (block 520) to determine if the number of failure detections has reached the failure maximum.

The row address of the row containing the defective memory cell may be stored (block 534) in an appropriate location of the repair list repository 224 (FIG. 2) of failing addresses and a flag set (block 540) indicating that the address of a row of memory cells has been stored in the repair list repository 534 for repair of that row. This flag may be checked in a subsequent determination (block 530) as to whether there have been prior failures detected for that memory region. In one embodiment, a flag may be set for each memory region, indicating whether at least one row of the particular memory region has at least one defective memory cell.

FIG. 6 shows one example of repair list repository 224 of failing memory addresses. In this example, the structure of the repair list repository 224 has been arranged as an array of rows and columns of repository locations, in which each bank, Bank 0, Bank 1 . . . Bank n, of the memory 104 has an assigned row of repository locations. The array of the repair list repository 224 has a column of locations, Fail 0, Fail 1, . . . Fail n, for each spare memory row available to be assigned to replace a row of a particular bank of memory cells. Thus, if a particular memory has eight banks, for example, and four spare rows of memory cells, for example, for each bank, the repair list repository 224 would have eight rows of repository locations, one row of repository locations for each bank, and four columns of repository locations, one column of repository locations for each available spare row of memory cells for that particular bank.

Accordingly, upon detection (block 510, FIG. 5) of the first defective row of a particular bank, such as Bank 0, the row address of the memory cell row of Bank 0 containing the defective memory cell may be placed in the repair list repository location, Bank 0, Fail 0, and a flag may be set (block 540) in the Bank 0 Flags location of the repair list repository 224, indicating that the address of a row of memory cells has been stored in the repair list repository 534 for repair of that memory cell row in Bank 0. Upon detection (block 510, FIG. 5) of the next new, unique defective memory cell row of Bank 0, the failure count is incremented (block 532) to point to repository location Bank 0, Fail 1, the next location in the row of repository locations for Bank 0, and the memory cell row address of that next new, unique row of Bank 0 containing the defective memory cell may be placed in the repair list repository location at Bank 0, Fail 1. In addition, a flag may be set (block 540) in the Bank 0 Flags location of the repair list repository 224, indicating that another address of a row of memory cells has been stored in the repair list repository 534 for repair of that memory cell row in Bank 0.

Upon each subsequent detection of a new, unique row of memory cells of Bank 0 containing a defect, the failure count is incremented (block 532) to point to the next repository location in the row of locations for Bank 0, and the memory cell row address of that next unique memory cell row of Bank 0 containing the defective memory cell may be placed in the repair list repository location corresponding to that failure count. In addition, a flag may be set (block 540) in the Bank 0 Flags location of the repair list repository 224, indicating that another address of a memory cell row of memory cells has been stored in the repair list repository 534 for repair of that row in Bank 0.

Stress testing of Bank 0 continues until all of that bank has been stress tested with each of the programmed stress tests. As the stress testing of Bank 0 progresses, once the number of detected new, unique rows containing a defect exceeds the number of spare rows for Bank 0, the failure maximum is reached (block 520), and the failure maximum flag may be set (block 524) in the Bank 0 Flags location in the repair list repository 224. At that point, no additional memory cell row addresses are recorded (block 514) in the repair list repository since no additional spare rows remain for Bank 0. However, stress testing of Bank 0 may continue, in one embodiment, even after the failure maximum is reached, to identify whether additional defects exist in Bank 0. In other embodiments, stress testing of a particular bank may be terminated once the failure maximum has been reached.

Upon termination of stress testing and defect recordation in the repair list repository 224 for Bank 0, the failure count as indicated by the failure counter may be reset either automatically or by a user or external software resetting the failure counter prior to the initiation of testing of the next bank of the memory 104. In one embodiment, the failure counter may be maintained as a register in the flags 234 and accessed via the portal 126 to be read or reset as appropriate. Also, in some embodiments, a separate failure counter may be maintained for each bank or other memory region of the memory 104.

Stress testing of the memory 104 continues, stress testing the remaining banks, Bank 1, Bank 2 . . . Bank n, wherein the memory cell row addresses of new, unique memory cell rows containing defects are recorded in the repair list repository 224 in a manner similar to that described above for Bank 0. In addition, flags may be set for each bank as stress testing progresses for each bank, as described above.

Once at least one memory cell row address of a row of memory cells containing a defect has been recorded in the repair list repository 224, the self-repair logic 114 (FIG. 1) may automatically commence repairing the defective memory 104 by replacing the row of cells containing a defect, with a spare row of memory cells, without user or external software intervention. In one embodiment, the self-repair logic 114 may operate in parallel with the self-test logic 100 such that the memory 104 may be repaired in parallel with ongoing stress testing of the memory to identify additional rows if any containing a defective memory cell.

Thus, in one embodiment, the repair logic may be activated once all stress tests are complete and all defective memory cells rows have been recorded in the repository 224. In another embodiment, the repair logic may be activated once all stress tests are complete for a particular memory region such as a bank, for example, and all defective memory cells rows have been recorded in the repository 224 for that bank. As such, stress tests may be resumed to identify any memory defects in one bank while defective memory cell rows already recorded in the repair list repository 224 are repaired for another bank. In yet another embodiment, the repair logic may be activated to repair memory cell rows as soon as defective memory cell rows are recorded in the repair list repository without waiting for stress testing to be completed for a particular memory region such as a bank, for example.

It is appreciated that the contents of the repair repository, including the addresses of rows with at least one defective cell and the associated flags may be read out by hardware or software and saved for later use in repair. As described above the repair may be conducted as failures are detected, or after all stress tests have completed. In addition the repair may be deferred to a later time in the same test step or even to some other future test step. If the repair data is stored in volatile registers it may be required to copy the data to some other permanent storage, either on-die or off-die, such as over a network or storage device before removing power from the repository 224. Storing the repair data in this way may not only facilitate deferred repair but may also serve as a permanent record of failure rates such as might be employed in process tracking for quality management or other purposes.

Figure 7:
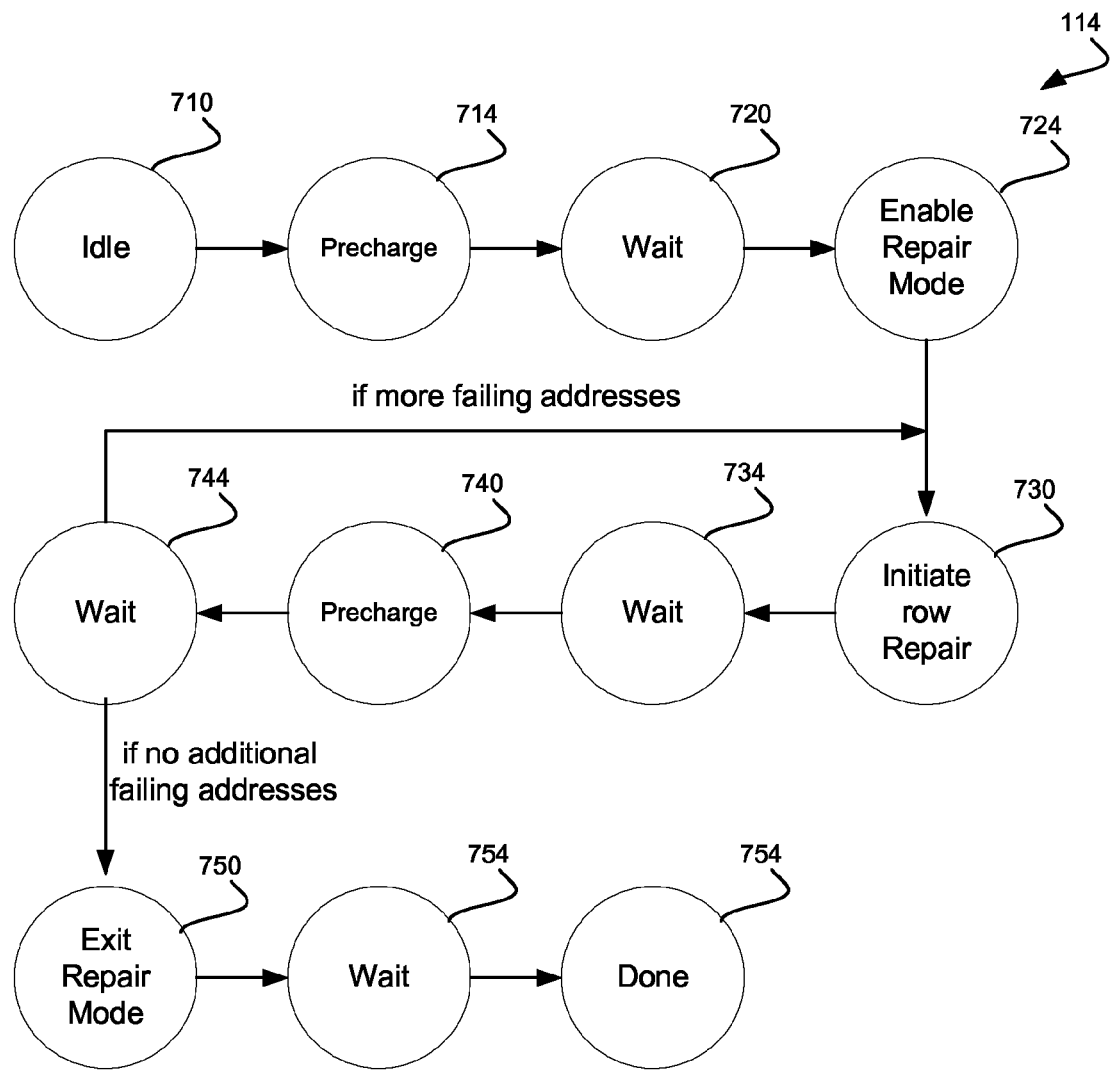
FIG. 7 is a schematic diagram of one embodiment of the self-repair logic of FIG. 2.

FIG. 7 illustrates a more detailed example of the self-repair logic 114 of FIG. 1, in accordance with one embodiment of the present description. In this example, the logic depicted in FIG. 7 is a repair engine implemented in one embodiment, with a hardware finite state machine on board the die of the memory controller 106. This finite state machine may in turn be implemented with hardware logic gates or a software or firmware programmable processor or a combination thereof on the same die as the memory controller 104 or other internal die of the device 100.

As explained in greater detail below, the repair logic 114 cycles through the list of failing addresses collected by the self-test logic 110 and recorded in the repair list repository 224. For each failing memory cell row, the row address of which is recorded in a repository location of the repository 224, the repair logic 114 issues appropriate commands to the memory 104 to replace the failing or failed row with a spare row built into the memory 104.

In a first state 710, the state machine of the repair logic 114 is idle, awaiting recordation of a row address of a defective memory cell row in the repair list repository 224. Upon recordation of at least one row address of a defective memory cell row in the repair list repository 224, the state machine automatically issues a precharge command (state 714) to precharge the memory region or regions containing the defective memory cell rows as identified in the repair list repository 224. Following a wait state 720 to allow the precharge to complete, the state machine automatically enables (state 724) the repair mode of the memory 104, initiates (state 730) the repair of a memory cell row as identified by a location recorded in the repair list repository 224, and enters a wait state 734 to allow sufficient time for the repair of that memory cell row to be completed.

In one embodiment, the state machine of the repair logic 114 includes a suitable timer circuit for the wait state 734. For example, a programmable delay/counter may be provided to allow sufficient time (such as 200 milliseconds, for example) for the repair to complete. In some embodiments, the counter may have up to 20 bits depending on the input clock frequency. To reduce the size of the counter circuitry, it may be appropriate in some embodiments to have a two stage counter which includes a fixed counter/divider with an output timing granularity of approximately 2 to 5 milliseconds and a programmable 6 to 8 bit counter. It is appreciated that other timer designs may be employed, depending upon the particular application.

In one embodiment, the state machine of the repair logic 114 may issue appropriate Post Package Repair (PPR) commands in accordance with the JEDEC (JEDEC Solid State Technology Association, formerly known as the Joint Electron Device Engineering Council) protocols. In response to the commands, fuses are opened or closed as appropriate to remove the defective memory cell row from the memory array and add a spare memory cell row in circuit to the array to substitute the spare memory cell row for the defective row. It is appreciated that other repair commands and protocols may be utilized, depending upon the particular application.

Upon expiration of the wait state 734, another precharge command (state 740) may be issued followed by another wait state 744 to allow the precharge to complete. The cycle of state machine states 730-744 is automatically repeated for each additional row address recorded in the repair list repository 224 until all defective memory cell rows identified in the repair list repository 224 have been replaced by spare memory cells of the associated bank.

Once all defective memory cell rows identified in the repair list repository 224 have been replaced by spare memory cells of the associated bank, the state machine of the repair logic 114 exits (state 750) the repair mode, waits (state 754) for the exit to complete, and the repair operations are complete. A flag bit of the flags 234 may be set to indicate that all repairs have been done. This flag bit may be polled internally or by external test equipment or software, to determine when the repairs have been completed.

In one embodiment, suitable instruction sequences may be loaded into appropriate configuration registers 232 (FIG. 2) or other memory of the self-test logic 110 (FIG. 1) via the portal 126. Such loading operation may be performed automatically by logic on board the computer architecture device 100. In other embodiments, devices or software external to the computer architecture device 100 may be employed to load suitable instruction sequences into the self-test logic 110. In this manner, the instruction sequences may be changed as appropriate to facilitate changing stress test patterns. In still other embodiments, suitable instruction sequences may be fixed into the logic of the self-test logic 110. Whether instruction sequences are fixed or changeable, it is appreciated that the nested loop structure of instruction sequences described herein may facilitate readily adapting the self-test logic 110 to conduct a wide variety of stress tests.

In one embodiment, hardware configuration registers 232, registers of the flags 234 and the repair list repository 224 are accessible in a system Peripheral Component Interconnect (PCI) or PCI Express configuration space or from a Test Access Port (TAP) controller. Configuration space registers may be mapped to memory locations. Device drivers and diagnostic software may have access to the configuration space, and the operating system may use Application Programming Interfaces (API's) to allow access to the device configuration space. In those embodiments, in which the operating system does not have access methods defined or API's for memory mapped configuration space requests, the driver or diagnostic software accesses the configuration space in a manner that is compatible with the operating system underlying access rules. In other embodiments the hardware configuration registers may be accessed through some other interface or an existing interface adapted for the purpose of accessing hardware configuration registers.

In the illustrated embodiment, the flags 234 including the failure counter may be implemented with a single register or adjacent registers, to facilitate allowing all status bits for a channel to be read with as few as a single TAP operation. Thus, in one embodiment, the registers for a 4 bank, 4 row repair engine of the self-repair logic circuit 114 may occupy 20 bits, for example, for the flag bits, plus the number of bits implementing the delay register of the finite state machine of the self-repair logic circuit 114.

As previously mentioned, the internal defect detection and repair circuit 108 may interrupt normal memory transactions between the processor 102 and memory 104 to conduct memory test and repair operations. For example, the defect detection and repair circuit 108 may be invoked as part of a boot process executing a (Basic Input and Output System (BIOS) boot process of the computer architecture device 100.

FIGS. 8a-8g show an example of an address generator 800 of the address generators 310a, 310b . . . 310n of FIG. 3. In this example, the address generator 800 is a configurable pipeline address generator having a plurality of pipeline stages, n00 and n01, for example. As explained in greater detail below, the address generator 800 is believed capable of rapidly generating addresses for stress testing the memory 104. For example, to excite neighboring interaction of charge coupling to detect failure, it is preferable to generate back to back memory transactions without excessive delay from the self-test logic 110 (FIG. 1). Although the pipeline address generator 800 is depicted as having two pipestages n00, n01, is it appreciated that a pipeline address generator may have more or fewer pipestages, depending upon the particular application.

Also, in this example, the pipeline address generator 800 is configurable into a plurality of configurations 804a, 804b . . . 804g, depicted in FIGS. 8a-8g, respectively. A particular configuration may be selected by an address instruction, for example, of the address instructions 1, 2, . . . n, of the sequence 324 (FIG. 3a) of the instruction loop 322 (FIG. 3b), for example. In the illustrated embodiment, each configuration 804a, 804b . . . 804g generates addresses in a particular address order of the hierarchical structure of the memory 104. As previously mentioned, a memory region of rows and columns of memory cells may be referred to as a bank. The memory 104 may have a plurality of integrated circuit memory chips, in which a group of integrated circuit memory chips is often referred to as a rank. In this embodiment, each rank of the memory 104 has a rank address and comprises a plurality of banks of memory cells on one or more dies. However, the memory 104 may in some embodiments, have a hierarchical structure which lacks ranks or may have one or more ranks on the same die.

Each bank of a rank of banks in turn has a bank address and comprises a memory region of a plurality of rows and column of memory cells arranged in an array. Thus, the full address of each memory cell of the memory 104 includes a rank address, bank address, row address and column address. However, it is appreciated that in some embodiments, a full address may lack a rank address, for example.

The pipeline address generator 800 may be configured to generate the full address of a memory cell in different address orders, depending upon the configuration selected for the generator 800. Thus, the pipeline address generator 800 generates row, column, bank and rank addresses in a particular address order. By altering the address order in which the parts of the full address are generated, the path of the generated addresses through the memory 104 is correspondingly altered. Thus, parameters of the address instruction may include address order. It is appreciated that other parameters may be included or utilized, depending upon the particular application.

Figure 8A:
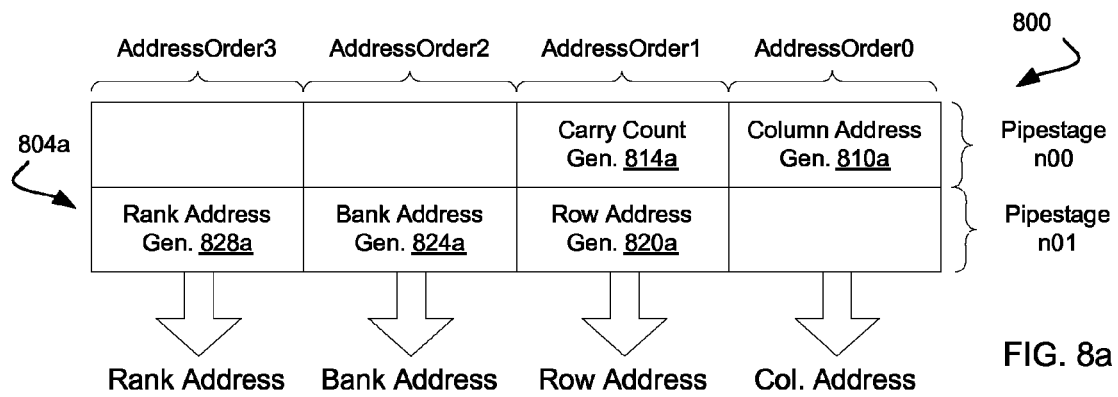
FIGS. 8a-8h are schematic diagrams of examples of configurations of a configurable pipeline address generator of the self-test logic of FIG. 1.
Figure 9A:
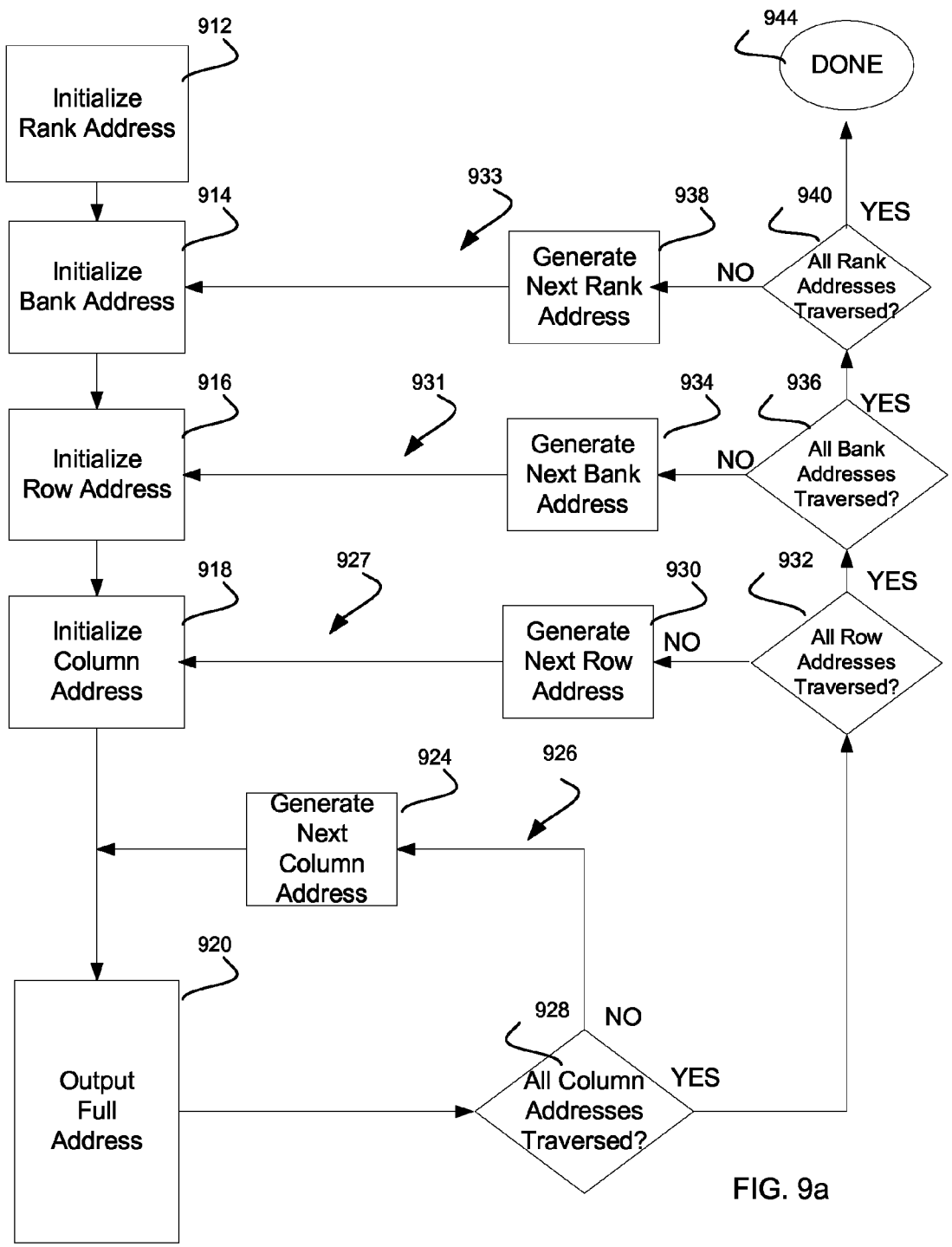
FIGS. 9a-9c are examples of operations of various configurations of a configurable pipeline address generator of the self-test logic of FIG. 1.

In one example, the configuration 804a of the pipeline address generator 800 depicted in FIG. 8a, sequentially generates memory addresses sequentially in a first address order of rank, bank, row and column which defines the order in which addresses are sequentially generated by rank, bank, row and column as shown in FIG. 9a. In the configuration 804a, the pipeline address generator 800 has a column address generator 810a in the lowest address order slot, addressorder0, of the first pipestage n00 and a row address generator 810a in the next lowest address order slot, addressorder1, of the second pipestage n01. Thus, after initializing the rank, bank, row and column addresses (blocks 912-918, FIG. 9a) and outputs (block 920) the first full address, the pipeline address generator 800 increments the column address to generate (block 924) the next column address with the column address generator 810a of the first pipestage n00, to traverse in a column loop 926 nested in a row loop 927, the generated full addresses across the columns of memory cells of a particular row of a particular bank of a particular rank, before the row address generated by the row address generator 810a of the second pipestage n01 changes in the row loop 927. Once traversal of the columns has been completed (block 928) in the column loop 926, the pipeline address generator 800 increments in the row loop 927, the row address to generate (block 930) the next row address generated by the row address generator 820a of the second pipestage n01 and resets (block 918) the column address, to traverse the generated full addresses again across the columns of memory cells of the next row of a particular bank of a particular rank, before the row address generated by the row address generator 810a of the second pipestage n01 again changes (block 930) in the row loop 927.

In this manner, the pipeline address generator 800 generates full addresses of memory cells to traverse the generated full addresses across the columns and rows of a particular bank of memory cells in a column, row address order. In the configuration 804a, the pipeline address generator 800 has a bank address generator 824a in the second to highest address order slot addressorder2 of the first pipestage n01 and a rank address generator 828a in the highest address order slot, addressorder2 of the second pipestage n01. Thus, the column loop 926 is nested in the row loop 927 which in turn is nested in a bank loop 931. The bank loop 931 is in turn nested in a rank loop 933.

Thus, once traversal of the rows (and columns) has been completed (block 932) in the nested column and row loops for a bank, the pipeline address generator 800 increments in the bank loop 931, the bank address to generate (block 934) the next bank address generated by the bank address generator 824a of the second pipestage n01 and resets the row address (block 916) and the column address (block 918), to traverse the generated full addresses across the next bank of memory cells of a particular rank, in the manner described above in the nested column loop 926 and row loop 927 before the rank address generated (block 938) by the rank address generator 828a of the second pipestage n01 changes. Once the traversal of all the banks of the particular rank has been completed (block 936), the pipeline address generator 800 increments in the rank loop 933, the rank address to generate (block 938) the next rank address generated by the rank address generator 828a of the second pipestage n01 and resets (block 914) the bank address, row address (block 916) and column address (block 918), to traverse the generated full addresses again across each of the banks of memory cells of the next rank, in the manner described above in the nested column loop 926, row loop 927 and bank loop 931, before the rank address generated by the rank address generator 828a of the second pipestage n01 again changes (block 938). Once the traversal of all the ranks of the selected memory region has been completed (block 940), the traversal of the selected memory region has been completed (block 944). In this manner, the pipeline address generator 800 generates full addresses of memory cells to traverse the generated full addresses across the columns and rows of each bank of each rank of memory cells of the selected memory region, in the address order of rank, bank, row and cell of the configuration 804a of FIG. 8a.

Figure 8B:
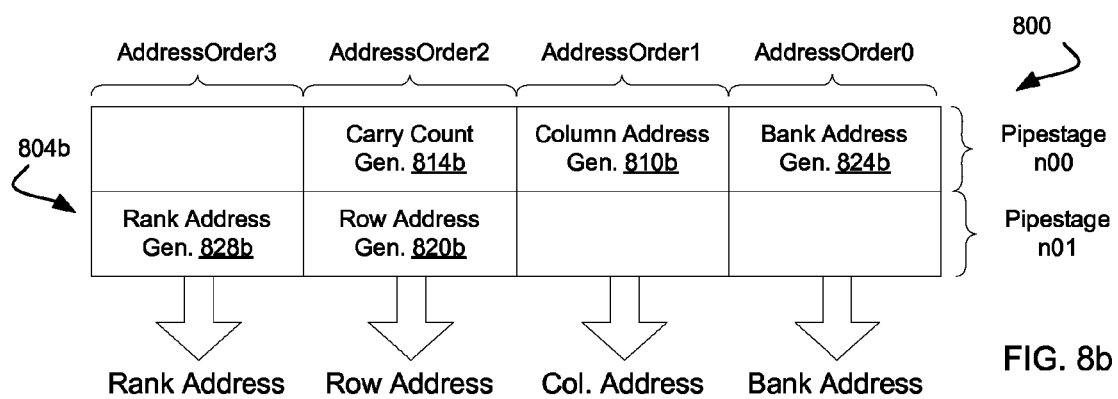
Figure 8C:
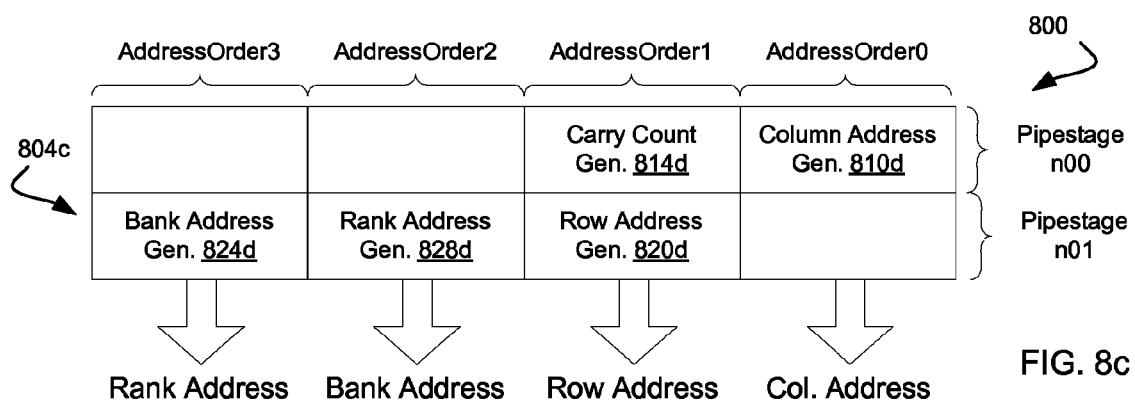
Figure 8D:
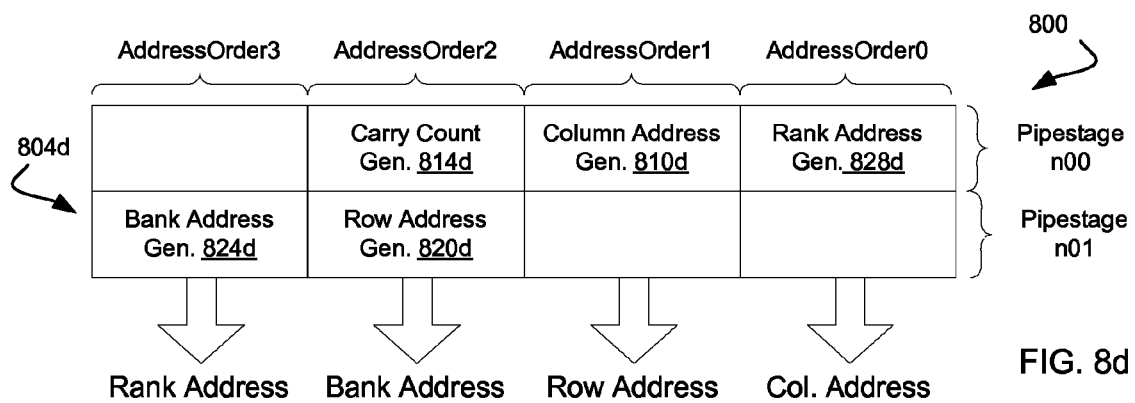
Figure 8E:
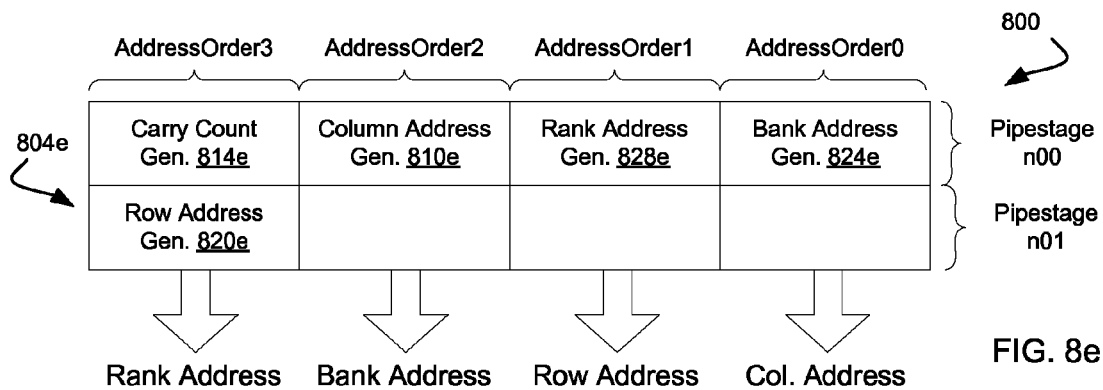
Figure 8F:
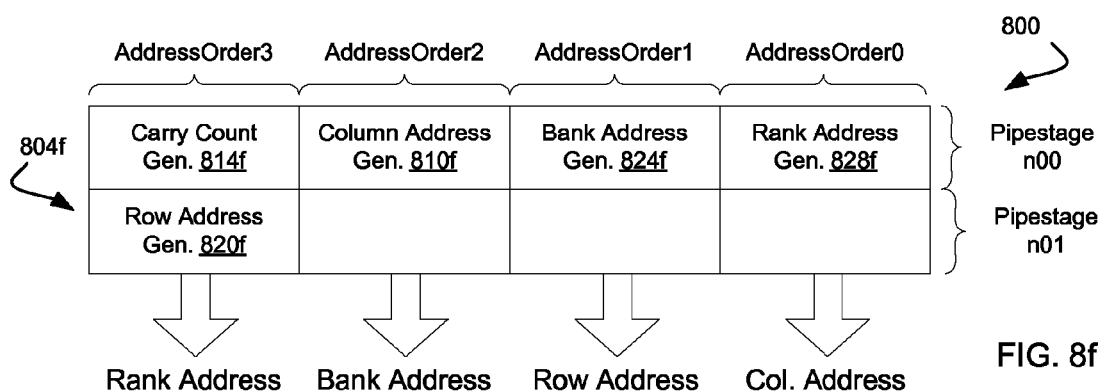
Figure 8G:
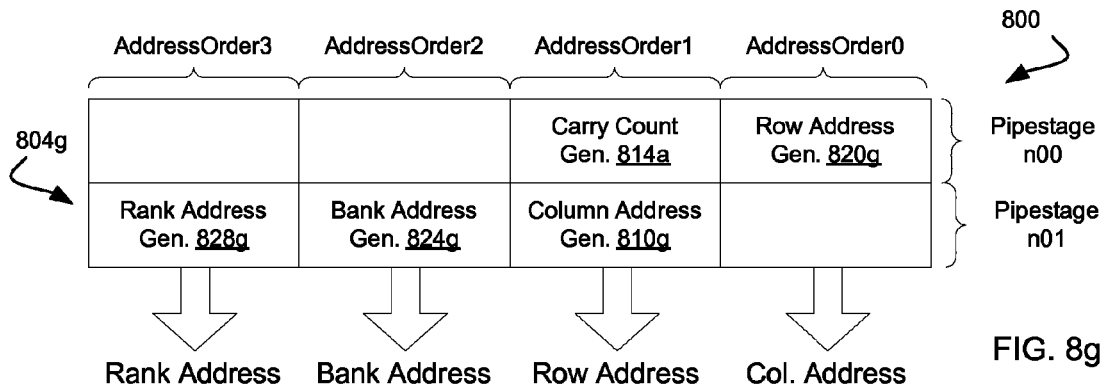
Figure 9B:
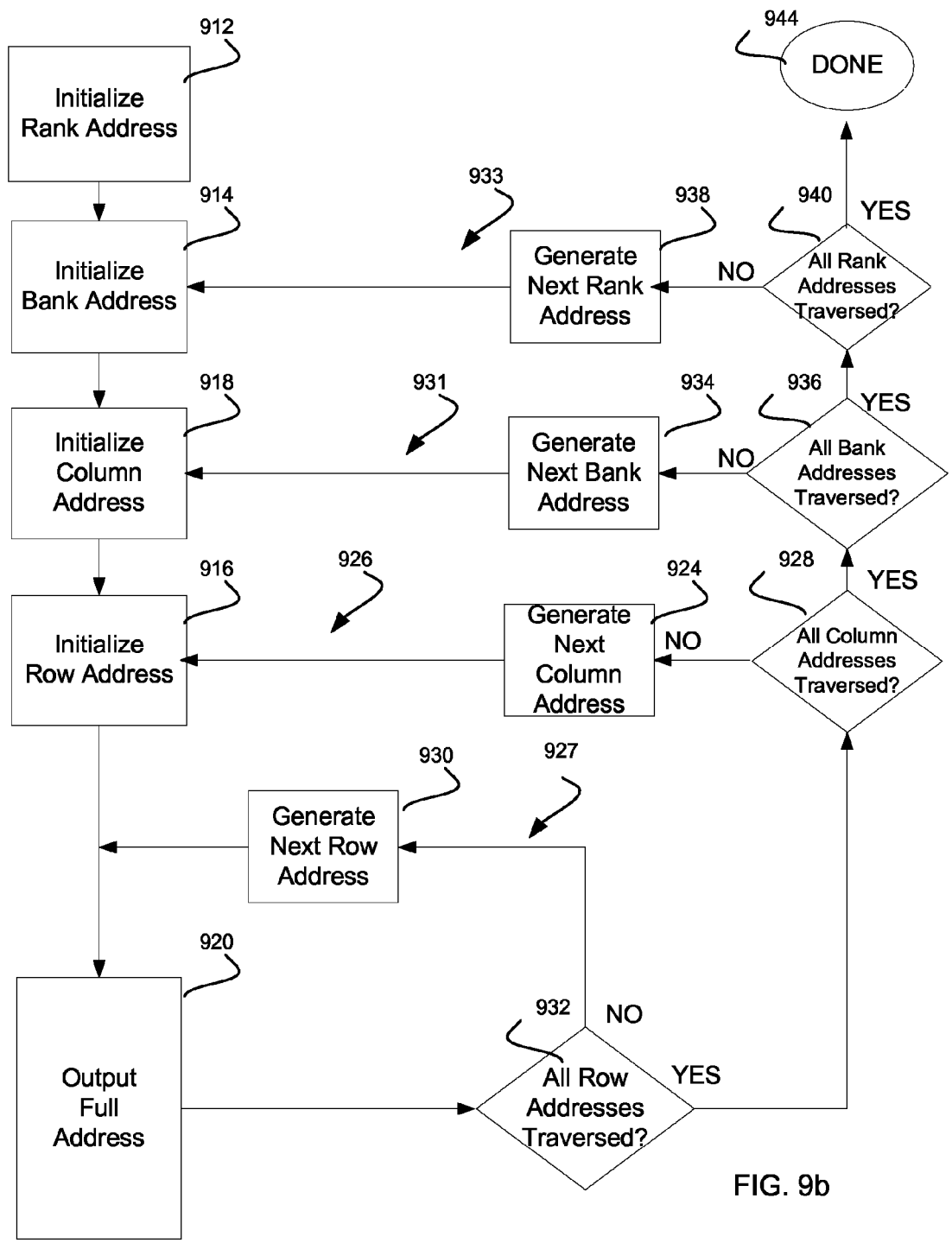

In another example, the configuration of configuration 804a may be modified from that depicted in FIG. 8a, to generate memory addresses sequentially in a different address order of rank, bank column and row, for example as shown in FIG. 8g and FIG. 9b. In this modified configuration 804g, the pipeline address generator 800 has a row address generator 820g in the lowest address order slot addressorder0 of the first pipestage n00 and a column address generator 810g in the next lowest address order slot, addressorder1, of the second pipestage n01. The positions of the rank address generator 828g and the bank address generator 824g are unchanged. Thus, in FIG. 9b, the row loop 927 is nested in the column loop 926, which is nested in a bank loop 931, which is in turn nested in a rank loop 933.

As shown in FIG. 9b, the pipeline address generator 800 of this modified configuration increments (block 930) the row address generated by the row address generator 820g of the first pipestage n00, to traverse the generated full addresses across the rows of memory cells of a particular column of a particular bank of a particular rank, before the column address generated by the column address generator 810g of the second pipestage n01 changes (block 924).

Figure 9C:
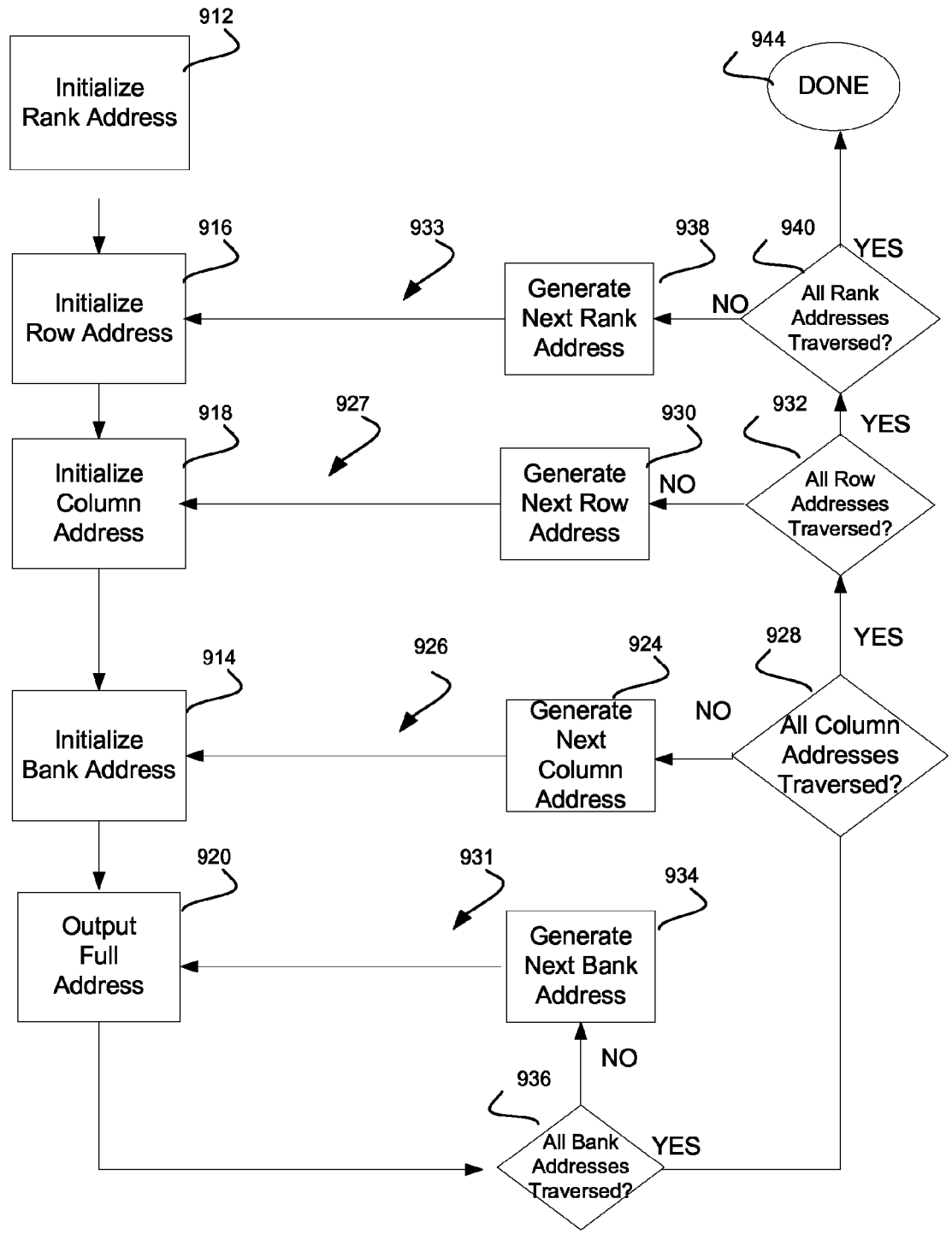

In another example, the configuration of configuration 804a may be modified from that depicted in FIG. 8a, to generate memory addresses sequentially in a different address order of rank, row, column and bank, for example as shown in FIGS. 8b and 9c. In this modified configuration 804b, the pipeline address generator 800 has a bank address generator 824b in the lowest address order slot, addressorder0, of the first pipestage n00, a column address generator 810b in the next lowest address order slot, addressorder1, of the first pipestage n00, a row address generator 820b in the second highest address order slot addressorder1 of the second pipestage n01 and a rank address generator 828b in the highest address order slot, addressorder2, of the second pipestage n01. Thus, the bank loop 931 is nested in the column loop 926, which is nested in the row loop 927 which in turn is nested in a rank loop 933 of FIG. 9c.

The pipeline address generator 800 of this modified configuration increments in bank loop 931, the bank address of a particular full address to generate (block 934) the next bank address generated by the bank address generator 824b of the first pipestage n00, to traverse in bank loop 931, the generated full address at a particular column address and row address across the banks of memory cells of a particular rank, one memory cell per bank, before the column, row and rank addresses generated by pipeline address generator 800 changes. Once the generated full address is traversed across the banks of memory cells of the particular rank, the column address (the next higher address order) is incremented in the column loop 926, to generate (block 924) the next column address with the column address generator 810b of the first pipestage n00. The bank address is reset (block 914), and the bank traversal process of bank loop 931 repeated, traversing that full address with the incremented column address (and unchanged row and rank addresses), across the banks of memory cells in the bank loop 931, one memory cell per bank, of the particular rank, until the memory cells of the incremented column address (and unchanged row and rank addresses), of the banks have been traversed.

Once a generated full address has been incremented for each column and traversed (block 940) across the banks of memory cells of the particular rank, one memory cell per bank, for each bank and column, such that traversal of the columns has been completed (block 928) in the column loop 926, the bank (block 914) and column (block 918) addresses are reset and the row address (the next higher address order) is incremented in row loop 927 to generate (block 930) the next row address with the row address generator 820b of the second pipestage n01. The bank, column ordered traversal process of bank loop 931 nested in column loop 926 to traverse the banks in bank loop 931 one column at a time as described above, is repeated for the incremented row, traversing the full address with the incremented row address (and with unchanged rank address) in the row loop 927, across the banks in bank loop 931 one column at a time, and incrementing in column loop 926, the column address each time the banks of the particular rank are traversed in the bank loop 931.

Thus, once traversal of the rows (and columns and banks) has been completed (block 932) in the nested bank, column and row loops for a rank, the pipeline address generator 800 increments in the rank loop 933, the rank address to generate (block 938) the next rank address generated by the rank address generator 828b of the second pipestage n01 and resets the row address (block 916), column address (block 918), and bank address (block 914) to traverse the generated full addresses again across each of the banks of memory cells of the next rank, in the manner described above in the nested bank loop 931, column loop 926, and row loop 927, before the rank address generated by the rank address generator 828a of the second pipestage n01 again changes (block 938). Once the traversal of all the ranks of the selected memory region has been completed (block 940), the traversal of the selected memory region has been completed (block 944). In this manner, the pipeline address generator 800 generates full addresses of memory cells to traverse the generated full addresses across the columns and rows of each bank of each rank of memory cells of the selected memory region, in the address order from lowest to highest of bank, column, row and rank of the configuration 804b of FIG. 8b and FIG. 9c.

FIGS. 8c-8f show examples of other configurations 804c-804f of the address generators 310a, 310b . . . 310n of FIG. 3a, to generate memory addresses sequentially in a different address orders as shown. In these other configurations, the pipeline address generator 800 has a rank address generator 828c-f, a bank address generator 824c-f, a row address generator 820c-f and a column address generator 810c-f arranged in a pipestage n00, n0a and in an address order slot addressorder3-0, as shown. For example, in the configurations of FIGS. 8a, b, and e bank addresses are sequentially incremented to the next bank address in sequence of the device before a rank address is incremented to the next rank address of the device in sequence. Conversely, in the configurations of FIGS. 8c, d and f, rank addresses are sequentially incremented to the next rank address of the device in sequence before a bank address is incremented to the next bank address of the device in sequence. It is appreciated that other configurations and other address orders may be utilized, depending upon the particular application.

In generating addresses to traverse through the memory 104, it is appreciated that address portions such as row addresses, column addresses, bank addresses and rank addresses, for example, may be incremented by a positive or negative amount, depending upon the selected traversal direction (for example, north, south, east, west, (FIG. 3c)) of the selected traversal pattern. It is further appreciated that address portions may be incremented (positively or negatively) by more than one applicable unit such as a cell, bank or rank unit, to skip cells, banks or ranks, depending upon the particular walking pattern selected. Moreover, the incremental amount may vary rather than being fixed in some traversal patters. A traversal pattern including the parameters defining the traversal pattern may be selected by an address instruction, for example, of the address instructions 1, 2, . . . n, of the sequence 324 (FIG. 3a) of the instruction loop 322 (FIG. 3b), for example, applied to a selected address generator.

Figure 8H:
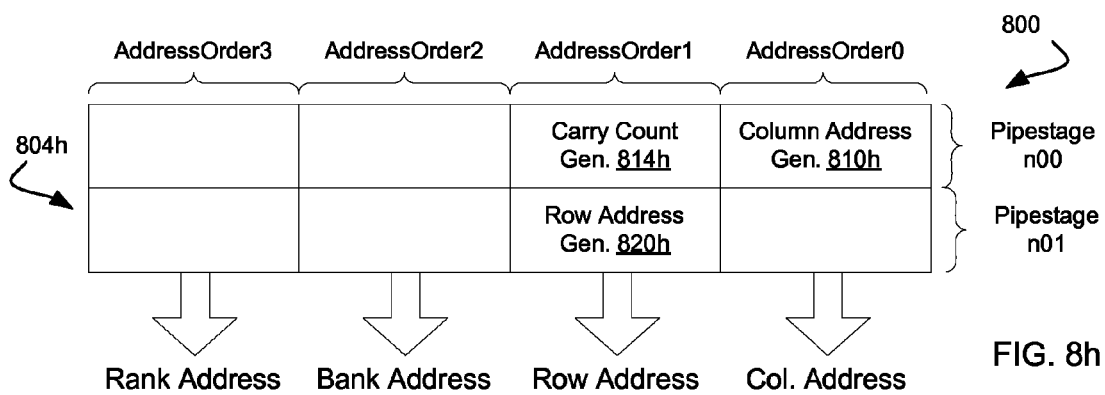

FIG. 8h shows an example of the offset address generators 374a, 374b . . . 374n of FIG. 3a. In this example, the offset address generator is a configuration 8h of an address generator 800 previously described for the address generators 310a, 310b . . . 310n of FIG. 3d. The configuration 804h of the pipeline address generator 800 depicted in FIG. 8h, sequentially generates memory addresses offset from the base in the neighbor traversal pattern depicted in FIG. 9a. In the configuration 804a, the pipeline address generator 800 has a column address generator 810h in the lowest address order slot addressorder0 of the first pipestage n00 and a row address generator 810h in the next lowest address order slot, addressorder1 of the second pipestage n01. The rank and bank addresses are provided by the base address and thus remain unchanged for each base address.

In the neighbor traversal pattern depicted in FIG. 3d, four offset full addresses are generated by incrementing the column address of the base address, in the row address of the base address, first in one direction and then reversing to the opposite direction. Similarly, an additional four offset full addresses are generated by incrementing the row address of the base address, in the column address of the base address, first in one direction and then reversing to the opposite direction. To facilitate rapid column or row address generation, the positions of the row address and column address generators may be reconfigured from the configuration depicted in FIG. 3h to be reversed as appropriate.

In accordance with another aspect of the present description, the pipeline address generator 800 has a carry count generator such as the carry count generators 814a-g of the configurations 804a-g, respectively. In the illustrated embodiment, one or more of the addresses generated by the corresponding address generators of the pipeline address generator 800 are a function of the output of the carry count generator which is 814a-g which performs a look ahead function for the address carry of addresses being generated.

For example, in the address order of the configuration of FIG. 8a, following generation of the last row address, the bank address increments to the bank address of the next bank of the sequence of the selected walking pattern. However, in embodiments in which an address such as a row or column address is generated by an address generator having a large counter having 32 bits or 64 bits, for example, it is appreciated that generation of an address carry by such a generator may take a correspondingly large amount of time.

Figure 10:
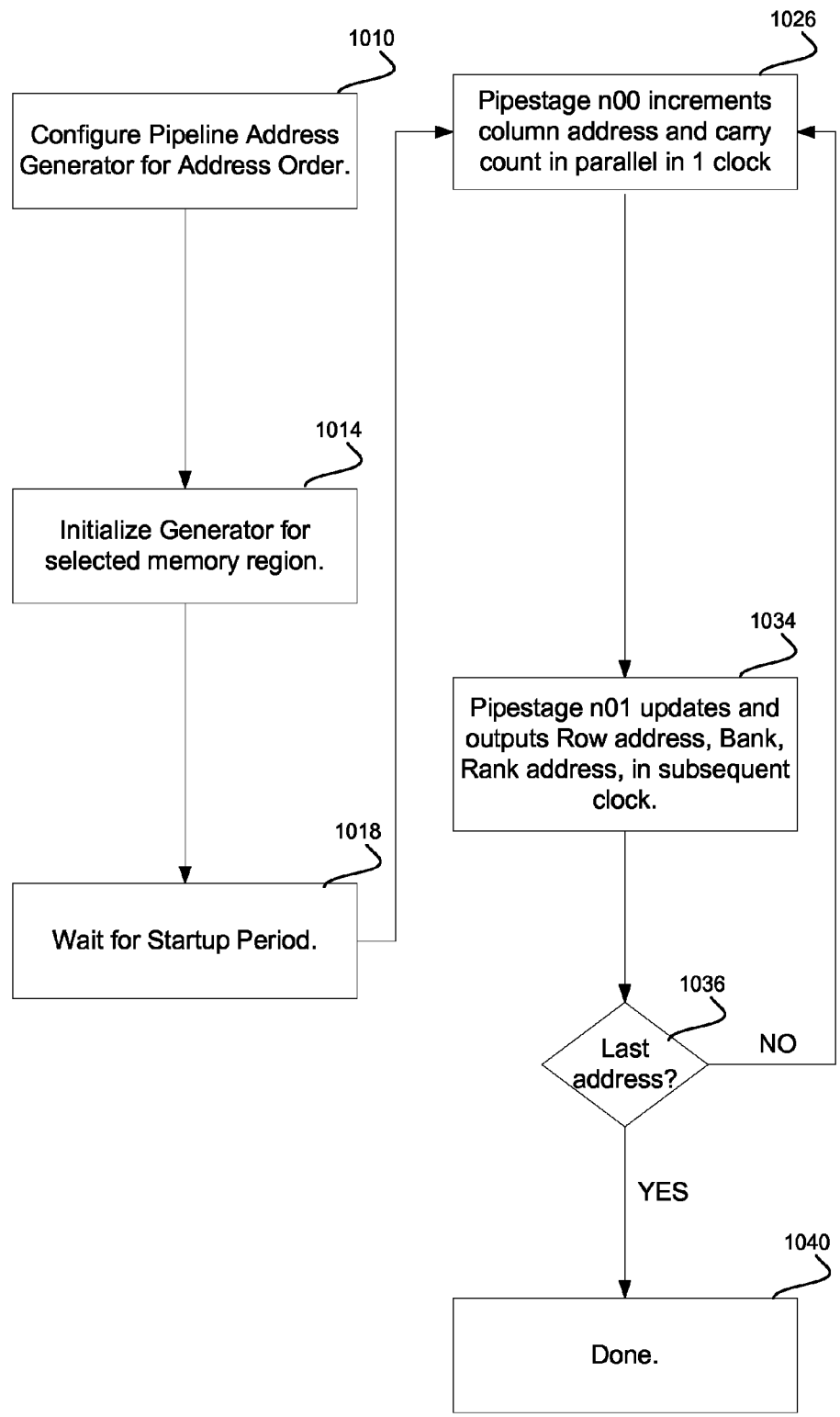
FIG. 10 is an example of operations of pipestages of a configurable pipeline address generator of the self-test logic of FIG. 1.
Figure 11:
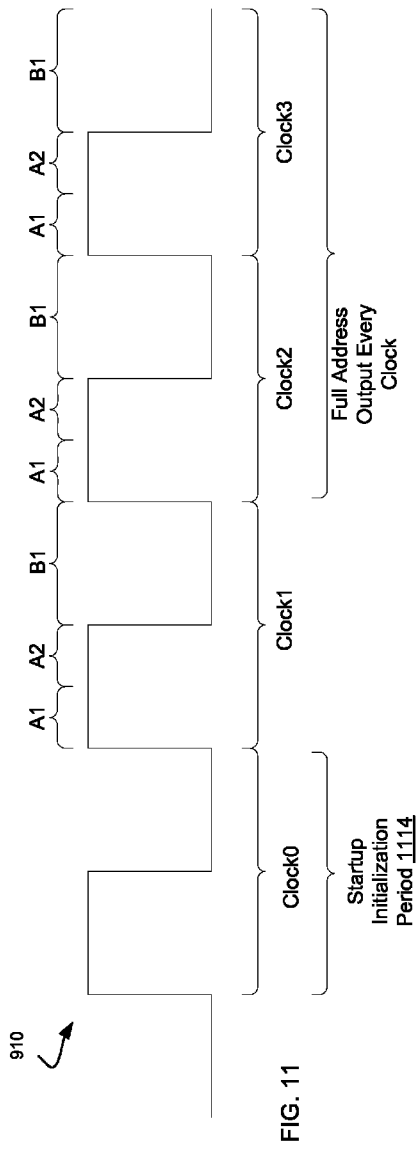
FIG. 11 is a schematic diagram of clock cycle intervals of operation of pipestages of a configurable pipeline address generator of the self-test logic of FIG. 1.

FIGS. 10 and 11 are directed to another aspect of the present description. In the illustrated embodiment, the pipeline address generator is responsive to a clock signal described in the operations of FIG. 10 and as schematically represented by the clock signal 910 of FIG. 11, to produce a full address including rank, bank, column and row addresses every clock signal after an initial startup period. Because the carry count generator 814a of the pipestage n00 performs a look ahead function for the address carry of addresses being generated, the output of the carry count generator 814a of the pipestage n00 may be valid in an initial part (schematically represented by the clock interval A1 in FIG. 9) of each clock signal clock1, clock2 . . . clock n after the initial startup period. By providing a valid address carry output prior to or relatively early in the clock cycle, the address or addresses such as the bank address which is a function of an address carry, may also be valid in the next clock cycle in an interval of each clock (schematically represented by the clock interval A2 in FIG. 9) which may be the same, different or overlapping interval A1. As a result, the next full address output is valid in a part of each clock signal (schematically represented by the clock interval B1 in FIG. 9) following the interval A2 after the initial startup period. Accordingly, after the startup initialization period 1114, the pipeline address generator 800 can produce a full address in sequence in each interval B1 of each clock cycle, clock1, clock2, etc.

FIG. 10 illustrates operations of pipestages of a configurable address generator such as the address generator 800 of FIGS. 8a-8h, for example. In a first operation, the address generator is configured (block 1010) for a particular address order, such as the address order rank, row, column and bank addresses, of FIG. 8b, for example, of a full address. Such configuration may be provided by an address instruction, for example. In the example of FIG. 10, the address generator is configured as in FIG. 8a.

In addition, the generator is configured (block 1014) for a selected memory region. Such configurations parameters may be provided by an address instruction, for example, and may define the size of the memory region to be traversed in terms of number of ranks, banks, columns, rows etc. and include a starting address, for example. Following a startup period (block 1018) such as the startup period 1114 (FIG. 11), the first full address may be output in a clock cycle interval such as the interval B1 (FIG. 11) of the clock clock1, for example.

Following the startup period, a pipestage such as the pipestage n00, for example, over the course of a clock cycle, increments (block 1026) and outputs the column address in the address order of the configuration of configuration 804a (FIG. 8a), and the column and row combined carry out count of the carry counter generator 814b. Over the course of the next clock cycle, a pipestage such as the pipestage n01, for example, updates and outputs (block 1034) the row address, bank address and the rank address. The row address, bank address and the rank address generated by the pipestage n01 are a function of the column and row combined carry out count generated by the pipestage n00 in the prior clock cycle. While the row address, bank address and the rank address are being generated for one full address by the pipestage n01, the pipestage n00 is generating in the same clock cycle, the column and row combined carry out count as well as the column address for the next full address. Thus, to generate a full address, takes two clock cycles. However, because the pipestages n00 and n01 operate in parallel, a full address is output each clock cycle. In one embodiment, the output of the address carry count generator of the first pipeline stage is valid in each clock signal after the initial startup period, and the next full address is valid in a subsequent part of each clock signal after the initial startup period.

If (block 1036) the last full address of the selected memory region has not been generated and output, the operations of block 1026-1036 are repeated for the next clock cycle, such as clock3, for example. In this manner, a full address is generated and output for each clock cycle, following the startup period. Once (block 1036) all the addresses of the selected memory region have been generated, the process ends (block 1040) for that portion of the stress tests.

Figure 12:
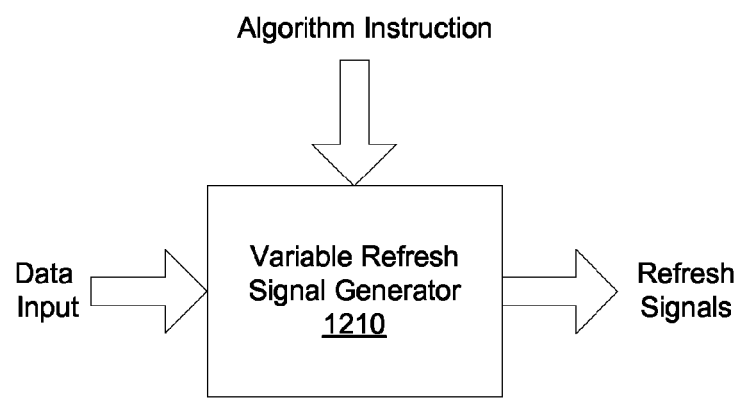
FIG. 12 is a schematic diagram of one example of an algorithm generator of the self-test logic of FIG. 1, configured as a variable refresh signal generator.

FIG. 12 shows one example of a programmable algorithm pattern generator of the generators 354a-n in accordance with one aspect of the present description. The programmable algorithm pattern generator of FIG. 11 is a variable refresh signal generator 1210 for generating, in response to an algorithm instruction such as one of the algorithm instructions 1, 2, . . . n (FIG. 3a) of the sequence 356 of the algorithm instruction loop 332 (FIG. 3b), a refresh signal for the memory cells of the memory 104, wherein the refresh signal has a variable refresh rate.

In the illustrated embodiment, the memory 104 is a dynamic random access memory (DRAM) in which bits are stored as charges on a node capacitance. In a DRAM, a bit cell typically loses charge over time. To prevent loss of data stored in the memory, the memory controller for a DRAM periodically issues a refresh signal to all the rows within an allowed refresh time to restore the charge (and retain the data stored) within each cell.

If the memory cells are refreshed too infrequently, data may be lost. If the memory cells are refreshed too frequently, energy may be wasted and may lead to premature battery exhaustion in portable devices. Accordingly, the variable refresh signal generator 1210 may be programmed to generate a refresh signal at various refresh rates, both within and without an expected refresh rate of the memory specification, to test for defective cells and to determine whether the memory may be refreshed at a rate below specification and yet retain the stored data.

In one embodiment, the variable refresh signal generator 1210 may be programmed to generate refresh signals in a declining sequence of refresh rates for refreshing memory cells at each rate of the declining sequence of refresh rates. Each refresh rate of the declining sequence may be reduced by an amount from the rate of the prior refresh rate of the declining sequence of refresh rates. In this manner, the memory cells may be refreshed at declining refresh rates until memory defects or data loss is detected.

In one embodiment, the refresh rate may be varied by varying the frequency of refresh signals as the test progresses. In another embodiment, the duty cycle of refresh pulses of refresh signals may be varied as the test progresses. It is appreciated that refresh signals may be programmed to vary in other respects, depending upon the particular application. In another aspect, varying the refresh rate may be combined with various other stress tests in which memory commands of various memory command patterns, are issued to memory cells addressed by various memory address traversal patterns as the refresh rate is varied.

In one embodiment, the variable refresh signal generator 1210 may be programmed or configured by algorithm instruction such as one of the algorithm instructions 1, 2, . . . n (FIG. 3a) of the sequence 356 of the algorithm instruction loop 332 (FIG. 3b), for example, to provide refresh signals at a programmed rate.

The data input and modified by the variable refresh signal generator 1210 to generate a refresh signal at various refresh rates, may be provided by the programmable data pattern generator 342. In other embodiments, the input signal may be self-generated by the variable refresh signal generator 1210. In one embodiment, the output of the generator 1210 is an alternate data source which may be selected by a parameter of a command instruction.

Figure 13:
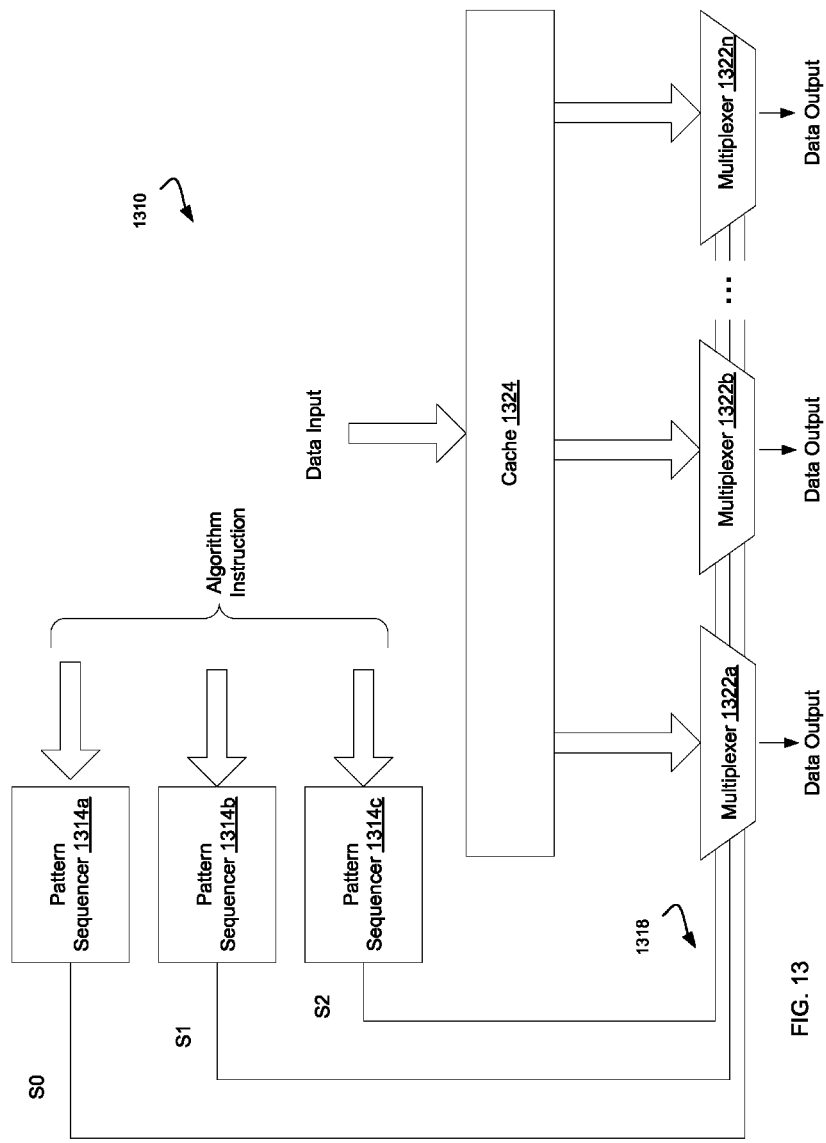
FIG. 13 is a schematic diagram of another example of an algorithm generator of the self-test logic of FIG. 1.

FIG. 13 shows another example of an algorithm generator 1310 of the algorithm generators 354*a*, 354*b* . . . 354*n* (FIG. 3*a*), of the programmable algorithm pattern generator 350, of the test pattern generator 210. The algorithm generator 1310 of this embodiment includes a pattern sequencer 1314*a*, 1314*b*, 1314*c*, each having an output, S0, S1, S2, respectively, coupled to the selector inputs 1318 of one or more multiplexers 1322*a*, 1322*b*, . . . 1322*n*. Each multiplexer 1322*a*, 1322*b*, . . . 1322*n* has inputs coupled to a memory such as a register or cache 1324, for example, storing pattern mixer data which may be generated and stored in the cache 1324 by the programmable data pattern generator 342 (FIG. 3*a*), for example. Each multiplexer 1322*a*, 1322*b*, . . . 1322*n* is adapted to select a multiplexer input to output a bit of the pattern mixer data to a multiplexer output, in response to the selection signals S0, S1, S2, of the pattern sequencers 1214*a*, 1314*b*, 1314*c*, respectively. The data output by each multiplexer 1322*a*, 1322*b*, . . . 1322*n* may be used as a control signal to stress test the memory 104 as commands are executed at addresses traversing the memory 104. Also, the data output by each multiplexer 1322*a*, 1322*b*, . . . 1322*n* may be used as write data to stress test the memory 104 as commands are executed at addresses traversing the memory 104. Still further, the data output by each multiplexer 1322*a*, 1322*b*, . . . 1322*n* may be used as expected test result data to compare to actual test data obtained as the memory 104 is stress tested. In one embodiment, the output of the generator 1310 is an alternate data source which may be selected by a parameter of a command instruction. Similarly, in one embodiment, the output of a pattern sequencer 1314*a*, 1314*b*, 1314*c* is an alternate data source which may be selected by a parameter of a command instruction.

In the illustrated embodiment, the pattern sequencers 1214*a*, 1314*b*, 1314*c*, are each programmable to output various patterns of multiplexer selection signals S0, S1, S2. In one embodiment, the pattern sequencers 1214*a*, 1314*b*, 1314*c* may be programmed by the sequential loop 332 (FIG. 3*b*) of algorithm instructions in the sequence 356 (FIG. 3*a*) of algorithm instructions, Algorithm Instruction 1, Algorithm Instruction 2 . . . Algorithm Instruction n. Each algorithm instruction, Algorithm Instruction 1, Algorithm Instruction 2 . . . Algorithm Instruction n, of the sequence 356 when executed by an appropriate one of the pattern sequencers 1214*a*, 1314*b*, 1314*c*, causes that pattern sequencer 1214*a*, 1314*b*, 1314*c* to generate a multiplexer select signal pattern as a function of the particular algorithm instruction.

In another aspect of the algorithm generator 1310, the pattern mixer data which is generated and stored in the cache 1324, may remain static, that is unchanged, over the course of a particular stress test. FIG. 14 is a table depicting examples of various Boolean function based modes of operation, based upon various pattern mixer codes which may be stored in the cache 1324 and provided to the inputs of a particular multiplexer 1322*a*, 1322*b*, . . . 1322*n*. As shown in FIG. 14, the data output by each multiplexer 1322*a*, 1322*b*, . . . 1322*n*, may be considered as a Boolean function of the multiplexer selection signals S0, S1, S2. The particular Boolean function of the multiplexer selection signals S0, S1, S2 may be selected by storing a particular pattern mixer code in the cache 1324 and providing the pattern mixer code to the inputs of a particular multiplexer 1322*a*, 1322*b*, . . . 1322*n*.

For example, if the pattern mixer code 00 (hex) is stored in the cache 1324 and provided to the inputs of the multiplexer 1322*a*, for example, the data output of the multiplexer 1322*a* is a constant 0 bit value. Similarly, if the pattern mixer code FF (hex) is stored in the cache 1324 and provided to the inputs of the multiplexer 1322*a*, for example, the data output of the multiplexer 1322*a* is a constant 0 bit value. If the pattern mixer code AA (hex) is stored in the cache 1324 and provided to the inputs of the multiplexer 1322*a*, for example, the data output of the multiplexer 1322*a* is the same as the multiplexer selection signal S0. (The other multiplexer selection signals S1, S2 are "don't care" for pattern mixer code AA). Similarly, if the pattern mixer code CC or F0 (hex) is stored in the cache 1324 and provided to the inputs of the multiplexer 1322*a*, for example, the data output of the multiplexer 1322*a* is the same as the multiplexer selection signal S1, S2, respectively.

If the pattern mixer code 03 (hex) is stored in the cache 1324 and provided to the inputs of the multiplexer 1322*a*, for example, the data output of the multiplexer 1322*a* is the same as the Boolean AND function of the inverse of each of the multiplexer selection signals S0 and S1. (The other multiplexer selection signal S2 is "don't care" for pattern mixer code 03). If the pattern mixer code 80 (hex) is stored in the cache 1324 and provided to the inputs of the multiplexer 1322*a*, for example, the data output of the multiplexer 1322*a* is the same as the Boolean AND function of the multiplexer selection signals S0, S1 and S2. If the pattern mixer code C0 (hex) is stored in the cache 1324 and provided to the inputs of the multiplexer 1322*a*, for example, the data output of the multiplexer 1322*a* is the same as the Boolean AND function of the multiplexer selection signals S0 and S1. (The other multiplexer selection signal S2 is "don't care" for pattern mixer code C0). If the pattern mixer code EE (hex) is stored in the cache 1324 and provided to the inputs of the multiplexer 1322*a*, for example, the data output of the multiplexer 1322*a* is the same as the Boolean OR function of the multiplexer selection signals S0 and S1. (The other multiplexer selection signal S2 is "don't care" for pattern mixer code EE). It is appreciated that other Boolean functions may be selected using other pattern mixer codes, depending upon the particular application.

In one embodiment, the pattern mixer code is programmed at the beginning of the test, and may be relatively static, that is, is not reprogrammed as the test progresses through the test cycle. Conversely, the pattern streams of the multiplexer selection signals S0, S1, S2 connected to the multiplex select inputs 1318 may be relatively dynamic, that is, change on every clock cycle, for example. By comparison, in prior multiplexed schemes, it is believed that dynamic input streams typically go to the multiplexer inputs and one of the dynamic streams is selected with relatively static selection signals on the select lines of the multiplexer.

Figure 15:
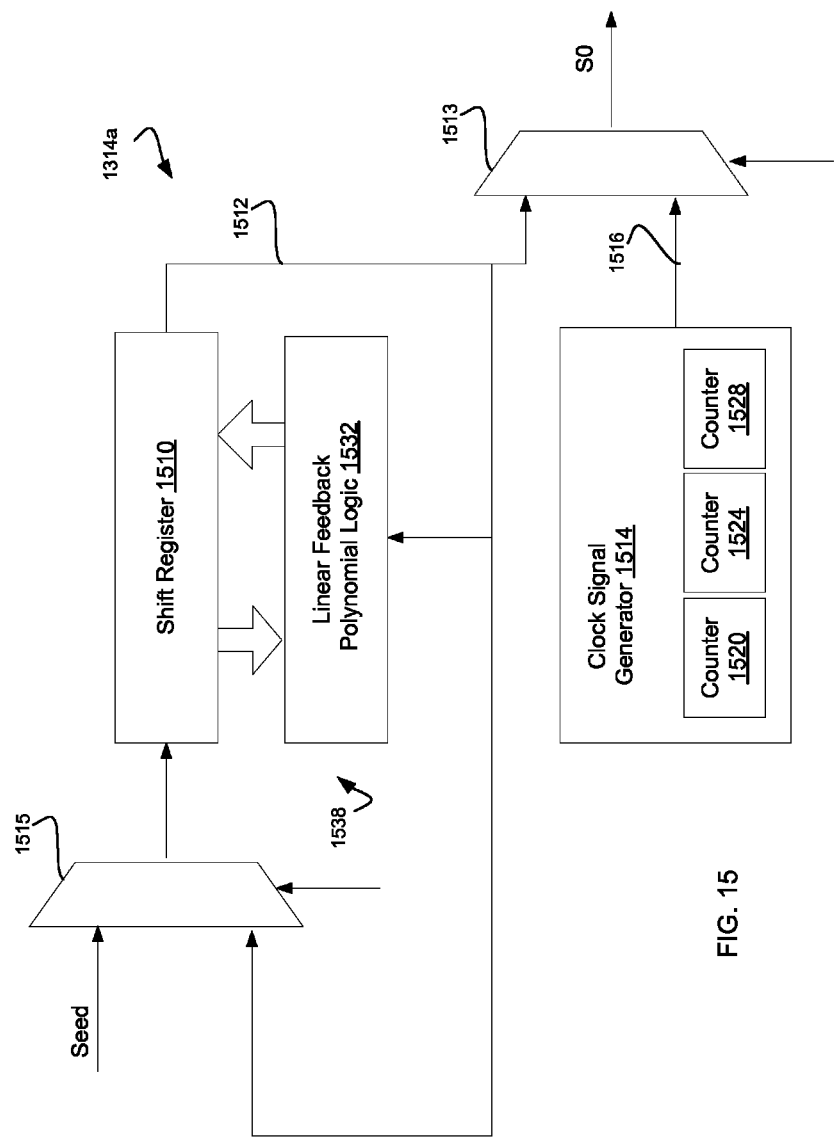
FIG. 15 shows one example of a multi-mode pattern sequencer of the algorithm generator of FIG. 13.

In another aspect of the algorithm generator 1310, each the pattern sequencer 1314*a*, 1314*b*, 1314*c*, is a multi-mode pattern sequencer in which a mode of operation may be selected to output a selected pattern of multiplexer selection signals S0, S1, S2. 20. FIG. 15 shows one example of the pattern sequencers 1314*a* as a multi-mode pattern sequencer. The other pattern sequencers 1314*b*, 1314*c* may be constructed in a similar fashion. The capability of selecting one of a plurality of modes of operation in each sequences permits, for example, allowing the same sequence for outbound patterns directed to the memory to be used for many tests on many devices, as well as allowing patterns of the expected results for comparing to inbound test results to be generated on the fly. Thus, test patterns for stress testing memory regions may be generated in real time as expected results patterns for those test patterns are generated either at the same time or in overlapping fashion, for example.

The pattern sequencer 1314a includes a first fixed pattern mode in which a shift register 1510 shifts a fixed pattern stored in the shift register 1510 on a shift register output 1512, through an output multiplexer 1513 to the pattern sequencer output, which is multiplexer select signal S0, in this example. The pattern may be shifted into the shift register 1510 through an input multiplexer 1515. The pattern sequencer 1314a further includes a clock signal pattern mode which a clock signal generator 1514 outputs a clock signal on an output 1516, through the output multiplexer 1513m to the pattern sequencer output, that is, the multiplexer selection signal S0. In the illustrated embodiment, the clock signal has a programmable period and programmable duty cycle in which the length of the clock pulse within the clock period is programmable.

Figure 16:
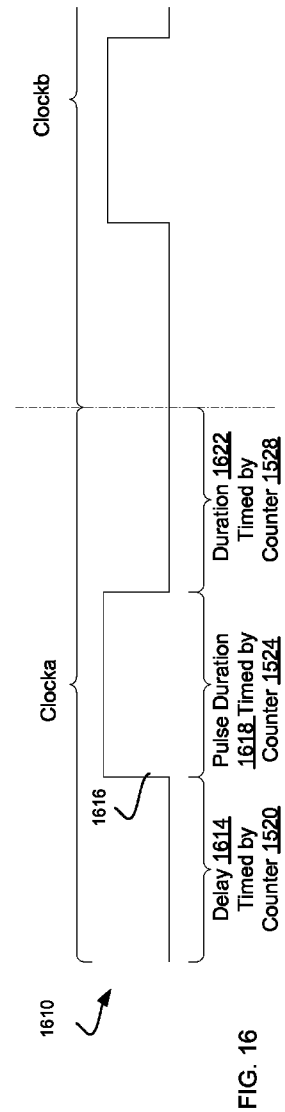
FIG. 16 shows one example of a clock signal which may be generated in one mode of the multi-mode pattern sequencer of the algorithm generator of FIG. 13.

FIG. 16 shows an example of such a clock signal, clocka, clockb, etc., in which a first counter of the combinational logic of the clock signal generator 1514 (FIG. 15) times the delay 1614 of the initiation of the clock pulse 1616 of the clock signal within the clock period. A second counter 1524 of the combinational logic times the duration 1618 of the clock pulse, and a third counter 1528 times the duration 1622 of the remaining period of the clock signal after the clock pulse 1616 until the beginning of the next clock signal, clockb. In this manner, relatively long clock signals may be readily generated. In some embodiments, a sweep mode of the clock signal mode in which the frequency or duty cycle may change as the test progresses.

The pattern sequencer 1314a further includes a linear feedback mode which outputs a linear feedback polynomial pattern to the pattern sequencer output, S0. The pattern sequencer 1314a has linear feedback polynomial logic 1532 of a finite state machine 1538 which determines the next state of the finite state machine 1538 of the multi-mode pattern sequencer 1314a. An output 1512 of the shift register 1510 is fed back to inputs of the linear feedback polynomial logic 1532, and to an input of the input multiplexer 1515.

Figure 17:
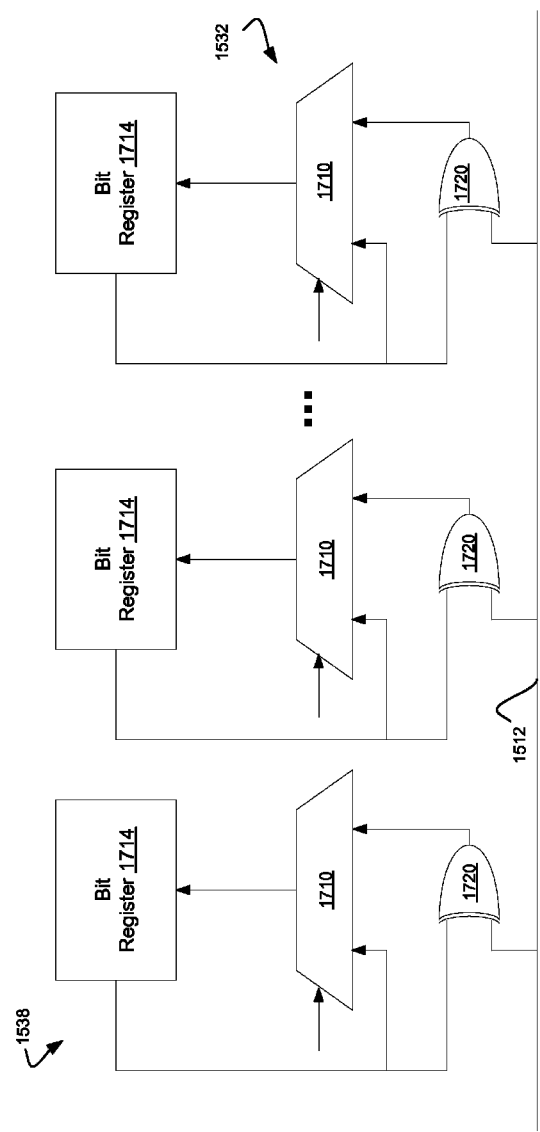
FIG. 17 is a schematic diagram showing examples of bits of a linear feedback shift register based finite state machine of multi-mode pattern sequencer of the algorithm generator of FIG. 13.

As best seen in FIG. 17, each bit of the linear feedback polynomial logic 1532 includes one or more multiplexers 1710 having an input coupled to the output of a bit register 1714 of the shift register 1510 (FIG. 15) and an output coupled to the input of the shift register 1510. Another input of the multiplexer 1710 of each bit of the linear feedback polynomial logic 1532, is coupled to polynomial combinational logic as represented by an exclusive-OR gate 1720. The linear feedback polynomial logic 1532 of the finite state machine 1538 determines the next state of the finite state machine 1538 of the multi-mode pattern sequencer 1314a, in which the state of the finite state machine 1538 is represented by the bits stored in the bit registers of the shift register 1510. In this manner, the linear feedback polynomial finite state machine 1538 of the linear feedback mode shares the bit registers 1714 of the shift register 1510 of the fixed pattern mode. Thus, in this example, the linear feedback mode, which may also be referred to as a linear feedback shift register (LFSR) based mode, the shift register 1510 holds the initial seeds provided through the input multiplexer 1515, and the LFSR feedback polynomials of the logic 1532 determine the next states of the state machine 1538. In one embodiment, the logic 1532 supports multiple optimized LFSR polynomials which may vary in size, such as from 8 bits to 32 bits, for example.

As previously mentioned, a random pattern generated by an algorithm generator such as the algorithm generator 354a, for example, executing a selected algorithm instruction, such as the Algorithm Instruction 1, for example, may be used to create white noise on an interconnect to stress the interconnect to test for a defect. Thus, if one pattern sequencer such as pattern sequencer 1314a, for example, was programmed to be operated in the clock signal mode to generate a low frequency clock signal on multiplexer select line S1, and another pattern sequencer such as the pattern sequencer 1314b was programmed to operate in the LFSR based mode to generate a random appearing bit pattern on the multiplexer select line S2, the Boolean function of S1 AND S2 provided by the pattern mixer code C0 (hex) will provide a burst of noise followed by quiet period, and the cycle repeats.

In one embodiment, seed data may be provided, and a mode of operation may be selected from the available modes of operation including the fixed pattern mode of the shift register 1510, the programmable clock signal mode of the clock generator 1514, and the linear feedback polynomial mode, by application of one or more algorithm instructions in the sequence 356 (FIG. 3a) of algorithm instructions, Algorithm Instruction 1, Algorithm Instruction 2 . . . Algorithm Instruction n. In other embodiments, modes may be selected by other portions of the tester circuit.

EXAMPLES

The following examples pertain to further embodiments.

Example 1 is a memory controller for use with a memory having memory cells including spare memory cells, comprising:

an internal self-test logic circuit built in within the memory controller, the self-test logic circuit including:
　a test pattern generator for generating test patterns and for testing memory cells within the memory using the generated test patterns;
　a repository; and
　a detector circuit adapted to detect defective memory cells in response to the test patterns testing the memory cells, and to store in the repository within the memory controller, a list of memory locations, each memory location of the list having a set of memory cells which includes at least one defective memory cell; and an internal self-repair logic circuit built in within the memory controller, the internal self-repair logic including a repair logic circuit adapted to read the list of memory locations stored in the repository, and to repair the memory locations of the list by substituting a memory location of spare memory cells, for a memory location having at least one defective memory cell.

In Example 2, the subject matter of Examples 1-20 (excluding the present Example) can optionally include a semiconductor die wherein the internal self-test logic circuit and the internal self-repair logic circuit are disposed on the die of the memory controller.

In Example 3, the subject matter of Examples 1-20 (excluding the present Example) can optionally include that the test pattern generator includes a plurality of generators including at least one address generator, and a loop sequencer circuit adapted to apply to the generators a plurality of nested loop instructions, including a sequential loop of address instructions in a sequence of address instructions to an address generator, each address instruction of the sequence when executed by an address generator, causes an address generator to generate a pattern of memory cell addresses, and wherein the test pattern generator is adapted to execute memory commands at memory cells addressed by a pattern of memory cell addresses generated by an address instruction being executed in sequence in the loop of address instructions.

In Example 4, the subject matter of Examples 1-20 (excluding the present Example) can optionally include that the plurality of generators includes at least one data generator, and wherein the loop sequencer circuit is adapted to apply to a data generator, a sequential loop of data instructions in a sequence of data instructions, each data instruction of the sequence when executed by a data generator, causes a data generator to generate a pattern of data for a pattern of test data, wherein the sequential loop of data instructions is nested within another loop of instructions, and wherein the test pattern generator in executing memory commands at memory cells is adapted to write a pattern of test data generated by a data instruction being executed in sequence in the loop of data instructions, in memory cells addressed by a pattern of memory cell addresses generated by an address instruction being executed in sequence in the loop of address instructions.

In Example 5, the subject matter of Examples 1-20 (excluding the present Example) can optionally include that the plurality of generators includes at least one algorithm generator and wherein the loop sequencer circuit is adapted to apply to an algorithm generator, a sequential loop of algorithm instructions in a sequence of algorithm instructions, each algorithm instruction of the sequence when executed by an algorithm generator causes an algorithm generator to generate a pattern of data for a pattern of test data, wherein the sequential loop of algorithm instructions is nested within another loop of instructions, and wherein the test pattern generator in executing memory commands at memory cells is adapted to write a pattern of test data in accordance with an algorithm instruction being executed in sequence in the loop of algorithm instructions, in memory cells addressed by a pattern of memory cell addresses generated by an address instruction being executed in sequence in the loop of address instructions.

In Example 6, the subject matter of Examples 1-20 (excluding the present Example) can optionally include that the plurality of generators includes at least one command generator and wherein the loop sequencer circuit is adapted to apply to a command generator, a sequential loop of command instructions in a sequence of command instructions, each command instruction of the sequence when executed by a command generator causes a command generator to generate a pattern of memory commands, wherein the sequential loop of command instructions is nested within another loop of instructions, and wherein the test pattern generator in executing memory commands at memory cells is adapted to execute a pattern of commands generated by a command instruction being executed in sequence in the loop of command instructions, said pattern of commands writing a pattern of test data generated by the output of the test pattern generator in response to an algorithm instruction being executed in sequence in the loop of algorithm instructions, and in response to a data instruction being executed in sequence in the loop of data instructions, in memory cells addressed by a pattern of memory cell addresses generated by an address instruction being executed in sequence in the loop of address instructions.

In Example 7, the subject matter of Examples 1-20 (excluding the present Example) can optionally include that the plurality of generators includes at least one address offset generator and wherein the loop sequencer is adapted to apply to an address offset generator, a sequential loop of memory address offset instructions in a sequence of memory address offset instructions, each memory address offset instruction of the sequence when executed by an address offset generator, causes an address offset generator to generate a pattern of memory address offsets, wherein the sequential loop of memory address offset instructions is nested within another loop of instructions, and wherein the test pattern generator in executing memory commands at memory cells is adapted to execute a pattern of commands generated by a command instruction being executed in sequence in the loop of command instructions in memory cells addressed by a pattern of memory cell addresses generated by an address instruction being executed in sequence in the loop of address instructions and offset by the pattern of memory address offsets generated by a memory address offset instruction being executed in sequence in the loop of memory address offset instructions.

In Example 8, the subject matter of Examples 1-20 (excluding the present Example) can optionally include that the memory cells are arranged in a plurality of memory regions, and wherein the detector circuit is adapted to determine if the number of memory locations having at least one defective memory cell exceeds a maximum for a particular memory region and if so, to set a flag indicating that the number of memory locations having at least one defective memory cell exceeds the maximum for the particular memory region.

In Example 9, the subject matter of Examples 1-20 (excluding the present Example) can optionally include that the memory cells are arranged in memory regions of memory cells, each memory region comprising an array of memory cells arranged in rows and columns of memory cells, and each memory location of a memory region is a row of memory cells, and wherein the detector circuit is adapted to determine if a particular row of memory cells of a particular memory region of memory cells has already been stored as an entry in the list of the repository, and to bypass the storing in the repository the particular row of the particular memory region of memory cells as an entry of the list of memory locations if the particular row of memory cells of the particular memory region of memory cells has already been stored as an entry in the list of the repository.

In Example 10, the subject matter of Examples 1-20 (excluding the present Example) can optionally include that the memory cells are arranged in memory regions of memory cells, each memory region comprising an array of memory cells arranged in rows and columns of memory cells, and each memory location of a memory region is a row of memory cells, and wherein the detector circuit is adapted to set a flag for each memory region, indicating whether at least one row of the particular memory region has at least one defective memory cell in the at least one row of memory cells of the particular memory region.

In Example 11, the subject matter of Examples 1-20 (excluding the present Example) can optionally include that the memory cells are arranged in memory regions of memory cells, each memory region comprising an array of memory cells arranged in rows and columns wherein each memory cell has a row address and a column address, and wherein the at least one address generator is a first configurable pipeline address generator having a plurality of pipeline stages, having an address carry count generator in a first pipeline stage, and one of a row address generator and a column address generator in a second pipeline stage, which generates one of a row address and a column address, respectively, as a function of the output of the address carry count generator of the first pipeline stage.

In Example 12, the subject matter of Examples 1-20 (excluding the present Example) can optionally include that wherein the memory regions are arranged in banks of memory regions, each bank having a bank address, and the banks are arranged in ranks of banks, each rank having a rank address, the first configurable pipeline address generator having a first configuration which includes a bank address generator in one of the first and second pipeline stages, and a rank address generator in at least one of the first and second pipeline stages.

In Example 13, the subject matter of Examples 1-20 (excluding the present Example) can optionally include that wherein in the first configuration of the configurable pipeline address generator, the row, column, bank and rank address generators are arranged in the first configurable pipeline address generator to generate row, column, bank and rank addresses, respectively, sequentially in a first address order defining the order in which addresses are sequentially generated by row, column, bank and rank, and wherein the first configurable pipeline address generator is configurable in a second configuration wherein in the first configuration of the configurable pipeline address generator, the row, column, bank and rank address generators are arranged in the first configurable pipeline address generator to generate row, column, bank and rank addresses, respectively, sequentially in a second address order in which addresses are sequentially generated by row, column, bank and rank, in an address order different from the first address order.

In Example 14, the subject matter of Examples 1-20 (excluding the present Example) can optionally include that in the first address order, the configurable pipeline address generator is adapted to sequentially increment bank addresses to the next bank address in sequence before a rank address is incremented to the next rank address in sequence, and wherein in the second address order, the configurable pipeline address generator is adapted to sequentially increment rank addresses to the next rank address in sequence before a bank address is incremented to the next bank address in sequence.

In Example 15, the subject matter of Examples 1-20 (excluding the present Example) can optionally include that in the first address order, the configurable pipeline address generator is adapted to sequentially increment row addresses to the next row address in sequence before a column address is incremented to the next column address in sequence, and wherein in the second address order, the configurable pipeline address generator is adapted to sequentially increment column addresses to the next column address in sequence before a row address is incremented to the next row address in sequence.

In Example 16, the subject matter of Examples 1-20 (excluding the present Example) can optionally include that the pipeline address generator is adapted to be responsive to a clock signal and to produce the next full address including rank, bank, column and row addresses every clock signal after an initial startup period and wherein the output of the address carry count generator of the first pipeline stage is valid in each clock signal after the initial startup period, and the next full address is valid in each clock signal after the initial startup period.

In Example 17, the subject matter of Examples 1-20 (excluding the present Example) can optionally include that the at least one algorithm generator includes a refresh signal generator adapted to generate a refresh signal for the memory cells, having a variable refresh rate.

In Example 18, the subject matter of Examples 1-20 (excluding the present Example) can optionally include that the refresh signal generator is adapted to generate refresh signals in a declining sequence of refresh rates for refreshing memory cells at each rate of the declining sequence of refresh rates, each refresh rate of the declining sequence being reduced by an amount from the rate of the prior refresh rate of the declining sequence of refresh rates.

In Example 19, the subject matter of Examples 1-20 (excluding the present Example) can optionally include that the at least one algorithm generator includes at least one pattern sequencer, each having an output, a multiplexer having a plurality of inputs and outputs, and at least one selector input coupled to an output of at least one pattern sequencer, wherein the multiplexer is adapted to select a multiplexer input to output to a multiplexer output, in response to at least one pattern sequencer coupled to at least one multiplexer selector input.

In Example 20, the subject matter of Examples 1-20 (excluding the present Example) can optionally include that at least one pattern sequencer is a multi-mode pattern sequencer having a shift register comprising a plurality of bit registers, a finite state machine comprising linear feedback polynomial logic coupled to the bit registers of the shift register, and combinational logic including a plurality of counters, and a plurality of modes of operation including a fixed pattern mode in which the shift register is adapted to shift a fixed pattern to the pattern sequencer output, a clock signal pattern mode in which the pattern sequencer is adapted to output a clock signal to the pattern sequencer output, the clock signal having a programmable duty cycle in which the length of a clock pulse within the clock period is programmable, in which a first counter of the combinational logic is adapted to time the delay of initiation of the clock pulse of the clock signal within the clock period, a second counter of the combinational logic is adapted to time the duration of the clock pulse, and a third counter is adapted to time the duration of the remaining period of the clock signal after the clock pulse until the beginning of the next clock signal, and a linear feedback mode in which the pattern sequencer is adapted to output a linear feedback polynomial pattern to the pattern sequencer output, in which the linear feedback polynomial logic is adapted to determine the next state of the finite state machine of the multi-mode pattern sequencer.

Example 21 is directed to a computer architecture device, comprising:

memory cells within the device including spare memory cells;

an internal self-test logic circuit built in within the device, the self-test logic circuit including:

a test pattern generator for generating test patterns and for testing memory cells within the device using the generated test patterns;

a repository; and a detector circuit adapted to detect defective memory cells in response to the test patterns testing the memory cells, and to store in the repository within the device, a list of memory locations, each memory location of the list having a set of memory cells which includes at least one defective memory cell; and an internal self-repair logic circuit built in within the device, the internal self-repair logic including a repair logic circuit adapted to read the list of memory locations stored in the repository, and to repair the memory locations of the list by substituting a memory location of spare memory cells, for a memory location having at least one defective memory cell.

In Example 22, the subject matter of Examples 21-40 (excluding the present Example) can optionally include that the device further comprises a memory controller disposed on a semiconductor die within the device, for controlling the memory cells of the device and wherein the internal self-test logic circuit and the internal self-repair logic circuit are disposed on the die of the memory controller.

In Example 23, the subject matter of Examples 21-40 (excluding the present Example) can optionally include that the test pattern generator includes a plurality of generators including at least one address generator, and a loop sequencer circuit adapted to apply to the generators a plurality of nested loop instructions, including a sequential loop of address instructions in a sequence of address instructions to an address generator, each address instruction of the sequence when executed by an address generator, causes an address generator to generate a pattern of memory cell addresses, and wherein the test pattern generator is adapted to execute memory commands at memory cells addressed by a pattern of memory cell addresses generated by an address instruction being executed in sequence in the loop of address instructions.

In Example 24, the subject matter of Examples 21-40 (excluding the present Example) can optionally include that the plurality of generators includes at least one data generator, and wherein the loop sequencer circuit is adapted to apply to a data generator, a sequential loop of data instructions in a sequence of data instructions, each data instruction of the sequence when executed by a data generator, causes a data generator to generate a pattern of data for a pattern of test data, wherein the sequential loop of data instructions is nested within another loop of instructions, and wherein the test pattern generator in executing memory commands at memory cells is adapted to write a pattern of test data generated by a data instruction being executed in sequence in the loop of data instructions, in memory cells addressed by a pattern of memory cell addresses generated by an address instruction being executed in sequence in the loop of address instructions.

In Example 25, the subject matter of 21-40 (excluding the present Example) can optionally include that the plurality of generators includes at least one algorithm generator and wherein the loop sequencer circuit is adapted to apply to an algorithm generator, a sequential loop of algorithm instructions in a sequence of algorithm instructions, each algorithm instruction of the sequence when executed by an algorithm generator causes an algorithm generator to generate a pattern of data for a pattern of test data, wherein the sequential loop of algorithm instructions is nested within another loop of instructions, and wherein the test pattern generator in executing memory commands at memory cells is adapted to write a pattern of test data in accordance with an algorithm instruction being executed in sequence in the loop of algorithm instructions, in memory cells addressed by a pattern of memory cell addresses generated by an address instruction being executed in sequence in the loop of address instructions.

In Example 26, the subject matter of 21-40 (excluding the present Example) can optionally include that the plurality of generators includes at least one command generator and wherein the loop sequencer circuit is adapted to apply to a command generator, a sequential loop of command instructions in a sequence of command instructions, each command instruction of the sequence when executed by a command generator causes a command generator to generate a pattern of memory commands, wherein the sequential loop of command instructions is nested within another loop of instructions, and wherein the test pattern generator in executing memory commands at memory cells is adapted to execute a pattern of commands generated by a command instruction being executed in sequence in the loop of command instructions, said pattern of commands writing a pattern of test data generated by the output of the test pattern generator in response to an algorithm instruction being executed in sequence in the loop of algorithm instructions, and in response to a data instruction being executed in sequence in the loop of data instructions, in memory cells addressed by a pattern of memory cell addresses generated by an address instruction being executed in sequence in the loop of address instructions.

In Example 27, the subject matter of Examples 21-40 (excluding the present Example) can optionally include that the plurality of generators includes at least one address offset generator and wherein the loop sequencer is adapted to apply to an address offset generator, a sequential loop of memory address offset instructions in a sequence of memory address offset instructions, each memory address offset instruction of the sequence when executed by an address offset generator, causes an address offset generator to generate a pattern of memory address offsets, wherein the sequential loop of memory address offset instructions is nested within another loop of instructions, and wherein the test pattern generator in executing memory commands at memory cells is adapted to execute a pattern of commands generated by a command instruction being executed in sequence in the loop of command instructions in memory cells addressed by a pattern of memory cell addresses generated by an address instruction being executed in sequence in the loop of address instructions and offset by the pattern of memory address offsets generated by a memory address offset instruction being executed in sequence in the loop of memory address offset instructions.

In Example 28, the subject matter of Examples 21-40 (excluding the present Example) can optionally include that the memory cells are arranged in a plurality of memory regions, and wherein the detector circuit is adapted to determine if the number of memory locations having at least one defective memory cell exceeds a maximum for a particular memory region and if so, to set a flag indicating that the number of memory locations having at least one defective memory cell exceeds the maximum for the particular memory region.

In Example 29, the subject matter of Examples 21-40 (excluding the present Example) can optionally include that the memory cells are arranged in memory regions of memory cells, each memory region comprising an array of memory cells arranged in rows and columns of memory cells, and each memory location of a memory region is a row of memory cells, and wherein the detector circuit is adapted to determine if a particular row of memory cells of a particular memory region of memory cells has already been stored as an entry in the list of the repository, and to bypass the storing in the repository the particular row of the particular memory region of memory cells as an entry of the list of memory locations if the particular row of memory cells of the particular memory region of memory cells has already been stored as an entry in the list of the repository.

In Example 30, the subject matter of Examples 21-40 (excluding the present Example) can optionally include that the memory cells are arranged in memory regions of memory cells, each memory region comprising an array of memory cells arranged in rows and columns of memory cells, and each memory location of a memory region is a row of memory cells, and wherein the detector circuit is adapted to set a flag for each memory region, indicating whether at least one row of the particular memory region has at least one defective memory cell in the at least one row of memory cells of the particular memory region.

In Example 31, the subject matter of Examples 21-40 (excluding the present Example) can optionally include that the memory cells are arranged in memory regions of memory cells, each memory region comprising an array of memory cells arranged in rows and columns wherein each memory cell has a row address and a column address, and wherein the at least one address generator is a first configurable pipeline address generator having a plurality of pipeline stages, having an address carry count generator in a first pipeline stage, and one of a row address generator and a column address generator in a second pipeline stage, which generates one of a row address and a column address, respectively, as a function of the output of the address carry count generator of the first pipeline stage.

In Example 32, the subject matter of Examples 21-40 (excluding the present Example) can optionally include that the memory regions are arranged in banks of memory regions, each bank having a bank address, and the banks are arranged in ranks of banks, each rank having a rank address, the first configurable pipeline address generator having a first configuration which includes a bank address generator in one of the first and second pipeline stages, and a rank address generator in at least one of the first and second pipeline stages.

In Example 33, the subject matter of Examples 21-40 (excluding the present Example) can optionally include that in the first configuration of the configurable pipeline address generator, the row, column, bank and rank address generators are arranged in the first configurable pipeline address generator to generate row, column, bank and rank addresses, respectively, sequentially in a first address order defining the order in which addresses are sequentially generated by row, column, bank and rank, and wherein the first configurable pipeline address generator is configurable in a second configuration wherein in the first configuration of the configurable pipeline address generator, the row, column, bank and rank address generators are arranged in the first configurable pipeline address generator to generate row, column, bank and rank addresses, respectively, sequentially in a second address order in which addresses are sequentially generated by row, column, bank and rank, in an address order different from the first address order.

In Example 34, the subject matter of Examples 21-40 (excluding the present Example) can optionally include that in the first address order, the configurable pipeline address generator is adapted to sequentially increment bank addresses to the next bank address in sequence before a rank address is incremented to the next rank address in sequence, and wherein in the second address order, the configurable pipeline address generator is adapted to sequentially increment rank addresses to the next rank address in sequence before a bank address is incremented to the next bank address in sequence.

In Example 35, the subject matter of Examples 21-40 (excluding the present Example) can optionally include that in the first address order, the configurable pipeline address generator is adapted to sequentially increment row addresses to the next row address in sequence before a column address is incremented to the next column address in sequence, and wherein in the second address order, the configurable pipeline address generator is adapted to sequentially increment column addresses to the next column address in sequence before a row address is incremented to the next row address in sequence.

In Example 36, the subject matter of Examples 21-40 (excluding the present Example) can optionally include that the pipeline address generator is adapted to be responsive to a clock signal and to produce the next full address including rank, bank, column and row addresses every clock signal after an initial startup period and wherein the output of the address carry count generator of the first pipeline stage is valid in each clock signal after the initial startup period, and the next full address is valid in each clock signal after the initial startup period.

In Example 37, the subject matter of Examples 21-40 (excluding the present Example) can optionally include that the at least one algorithm generator includes a refresh signal generator adapted to generate a refresh signal for the memory cells, having a variable refresh rate.

In Example 38, the subject matter of Examples 21-40 (excluding the present Example) can optionally include that the refresh signal generator is adapted to generate refresh signals in a declining sequence of refresh rates for refreshing memory cells at each rate of the declining sequence of refresh rates, each refresh rate of the declining sequence being reduced by an amount from the rate of the prior refresh rate of the declining sequence of refresh rates.

In Example 39, the subject matter of Examples 21-40 (excluding the present Example) can optionally include that the at least one algorithm generator includes at least one pattern sequencer, each having an output, a multiplexer having a plurality of inputs and outputs, and at least one selector input coupled to an output of at least one pattern sequencer, wherein the multiplexer is adapted to select a multiplexer input to output to a multiplexer output, in response to at least one pattern sequencer coupled to at least one multiplexer selector input.

In Example 40, the subject matter of Examples 21-40 (excluding the present Example) can optionally include that at least one pattern sequencer is a multi-mode pattern sequencer having a shift register comprising a plurality of bit registers, a finite state machine comprising linear feedback polynomial logic coupled to the bit registers of the shift register, and combinational logic including a plurality of counters, and a plurality of modes of operation including a fixed pattern mode in which the shift register is adapted to shift a fixed pattern to the pattern sequencer output, a clock signal pattern mode in which the pattern sequencer is adapted to output a clock signal to the pattern sequencer output, the clock signal having a programmable duty cycle in which the length of a clock pulse within the clock period is programmable, in which a first counter of the combinational logic is adapted to time the delay of initiation of the clock pulse of the clock signal within the clock period, a second counter of the combinational logic is adapted to time the duration of the clock pulse, and a third counter is adapted to time the duration of the remaining period of the clock signal after the clock pulse until the beginning of the next clock signal, and a linear feedback mode in which the pattern sequencer is adapted to output a linear feedback polynomial pattern to the pattern sequencer output, in which the linear feedback polynomial logic is adapted to determine the next state of the finite state machine of the multi-mode pattern sequencer.

Example 41 is directed to a method of testing and repairing memory, comprising:
using an internal self-test logic circuit built in within a device,
generating test patterns for testing memory cells within the device;
applying the test patterns to the memory cells within the device;
detecting defective memory cells in response to the applied test patterns; and
storing in a repository within the device, a list of memory locations, each memory location of the list having a set of memory cells which includes at least one defective memory cell; and
using an internal self-repair logic circuit built in within the device,
reading the list of memory locations stored in the repository; and
repairing the memory locations, wherein the repairing includes substituting a spare memory location having a set of memory cells, for a memory location having at least one defective memory cell.

In Example 42, the subject matter of Examples 41-60 (excluding the present Example) can optionally include that the device further comprises a memory controller disposed on a semiconductor die within the device, for controlling the memory cells of the device and wherein the internal self-test logic circuit and the internal self-repair logic circuit are disposed on the die of the memory controller.

In Example 43, the subject matter of Examples 41-60 (excluding the present Example) can optionally include that the applying the test patterns includes executing a sequential loop of address instructions in a sequence of address instructions, each address instruction of the sequence when executed generating a pattern of memory cell addresses, and executing memory commands at memory cells addressed by a pattern of memory cell addresses generated by an address instruction being executed in sequence in the loop of address instructions.

In Example 44, the subject matter of Examples 41-60 (excluding the present Example) can optionally include that the generating test patterns includes executing a sequential loop of data instructions in a sequence of data instructions, each data instruction of the sequence when executed generating a pattern of data for a pattern of test data, wherein the sequential loop of data instructions is nested within another loop of instructions, and wherein the executing memory commands at memory cells includes writing test data generated by a data instruction being executed in sequence in the loop of data instructions, in memory cells addressed by a pattern of memory cell addresses generated by an address instruction being executed in sequence in the loop of address instructions.

In Example 45, the subject matter of Examples 41-60 (excluding the present Example) can optionally include that the generating test patterns includes executing a sequential loop of algorithm instructions in a sequence of algorithm instructions, each algorithm instruction of the sequence when executed generating a pattern of data for a pattern of test data, wherein the sequential loop of algorithm instructions is nested within another loop of instructions, and wherein the executing memory commands at memory cells includes writing a pattern of test data in accordance with an algorithm instruction being executed in sequence in the loop of algorithm instructions, in memory cells addressed by a pattern of memory cell addresses generated by an address instruction being executed in sequence in the loop of address instructions.

In Example 46, the subject matter of Examples 41-60 (excluding the present Example) can optionally include that the generating test patterns includes executing a sequential loop of command instructions in a sequence of command instructions, each command instruction of the sequence when executed generating a pattern of memory commands, wherein the sequential loop of command instructions is nested within another loop of instructions, and wherein the executing memory commands at memory cells includes executing a pattern of commands generated by a command instruction being executed in sequence in the loop of command instructions, said pattern of commands writing a pattern of test data generated by the output of an algorithm of an algorithm instruction being executed in sequence in the loop of algorithm instructions, and in response to a data instruction being executed in sequence in the loop of data instructions, in memory cells addressed by a pattern of memory cell addresses generated by an address instruction being executed in sequence in the loop of address instructions.

In Example 47, the subject matter of Examples 41-60 (excluding the present Example) can optionally include that the generating test patterns includes executing a sequential loop of memory address offset instructions in a sequence of memory address offset instructions, each memory address offset instruction of the sequence when executed generating a pattern of memory address offsets, wherein the sequential loop of memory address offset instructions is nested within another loop of instructions, and wherein the executing memory commands at memory cells includes executing a pattern of commands generated by a command instruction being executed in sequence in the loop of command instructions in memory cells addressed by a pattern of memory cell addresses generated by an address instruction being executed in sequence in the loop of address instructions and offset by the pattern of memory address offsets generated by a memory address offset instruction being executed in sequence in the loop of memory address offset instructions.

In Example 48, the subject matter of Examples 41-60 (excluding the present Example) can optionally include that the memory cells are arranged in a plurality of memory regions, the method further comprising determining if the number of memory locations having at least one defective memory cell exceeds a maximum for a particular memory region and if so, setting a flag indicating that the number of memory locations having at least one defective memory cell exceeds the maximum for the particular memory region.

In Example 49, the subject matter of Examples 41-60 (excluding the present Example) can optionally include that the memory cells are arranged in memory regions of memory cells, each memory region comprising an array of memory cells arranged in rows and columns of memory cells, and each memory location of a memory region is a row of memory cells, the method further comprising determining if a particular row of memory cells of a particular memory region of memory cells has already been stored as an entry in the list of the repository, and bypassing the storing in the repository the particular row of the particular memory region of memory cells as an entry of the list of memory locations if the particular row of memory cells of the particular memory region of memory cells has already been stored as an entry in the list of the repository.

In Example 50, the subject matter of Examples 41-60 (excluding the present Example) can optionally include that the memory cells are arranged in memory regions of memory cells, each memory region comprising an array of memory cells arranged in rows and columns of memory cells, and each memory location of a memory region is a row of memory cells, the method further comprising setting a flag for each memory region, indicating whether at least one row of the particular memory region has at least one defective memory cell in the at least one row of memory cells of the particular memory region.

In Example 51, the subject matter of Examples 41-60 (excluding the present Example) can optionally include that the memory cells are arranged in memory regions of memory cells, each memory region comprising an array of memory cells arranged in rows and columns wherein each memory cell has a row address and a column address, and wherein the generating a pattern of memory cell addresses includes generating in a first configurable pipeline address generator having a plurality of pipeline stages, an address carry count in a first pipeline stage, and generating in a second pipeline stage, one of a row address and a column address as a function of the address carry count generated in the first pipeline stage.

In Example 52, the subject matter of Examples 41-60 (excluding the present Example) can optionally include that the memory regions are arranged in banks of memory regions, each bank having a bank address, and the banks are arranged in ranks of banks, each rank having a rank address, the method further comprising generating in one of the first and second pipeline stages in a first configuration of the first configurable pipeline address generator, a bank address, and generating in one of the first and second pipeline stages in the first configuration of the first configurable pipeline address generator, a rank address.

In Example 53, the subject matter of Examples 41-60 (excluding the present Example) can optionally include generating in the first configurable pipeline address generator, the row, column, bank and rank addresses sequentially in a first address order defining the order in which addresses are sequentially generated by row, column, bank and rank, and generating in a second pipeline address generator, row, column, bank and rank addresses sequentially in a second address order in which addresses are sequentially generated by row, column, bank and rank, an address order different from the first address order.

In Example 54, the subject matter of Examples 41-60 (excluding the present Example) can optionally include that the generating the row, column, bank and rank addresses sequentially in the first address order, includes sequentially incrementing bank addresses to the next bank address in sequence of the device before a rank address is incremented to the next rank address of the device in sequence, and wherein the generating the row, column, bank and rank addresses sequentially in the second address order, includes sequentially incrementing rank addresses to the next rank address in sequence of the device before a bank address is incremented to the next bank address of the device in sequence.

In Example 55, the subject matter of Examples 41-60 (excluding the present Example) can optionally include that the generating the row, column, bank and rank addresses sequentially in the first address order, includes sequentially incrementing row addresses to the next row address in sequence of the device before a column address is incremented to the next column address of the device in sequence, and wherein the generating the row, column, bank and rank addresses sequentially in the second address order, includes sequentially incrementing column addresses the next r column address of the device in sequence before a row address is incremented to the next row address of the device in sequence.

In Example 56, the subject matter of Examples 41-60 (excluding the present Example) can optionally include that the generating the row, column, bank and rank addresses includes clocking the pipeline address generator with a clock signal and producing the next full address including rank, bank, column and row addresses every clock signal after an initial startup period and producing a valid address carry count output in each clock signal after the initial startup period, and producing a valid next full address in a subsequent part of each clock signal after the initial startup period.

In Example 57, the subject matter of Examples 41-60 (excluding the present Example) can optionally include that the generating a test data pattern as an output of an algorithm includes generating a refresh signal having a variable refresh rate, and refreshing memory cells at the variable refresh rate.

In Example 58, the subject matter of Examples 41-60 (excluding the present Example) can optionally include that the generating a refresh signal having a variable refresh rate includes generating the refresh signals in a declining sequence of refresh rates, each refresh rate of the declining sequence being reduced by an amount from the rate of the prior refresh rate of the declining sequence of refresh rates and wherein the refreshing memory cells at the variable refresh rate includes refreshing memory cells at each rate of the declining sequence of refresh rates.

In Example 59, the subject matter of Examples 41-60 (excluding the present Example) can optionally include that the generating a test data pattern as an output of an algorithm includes generating a patterned sequence of multiplexer input selection signals, selecting inputs of a multiplexer in response to the patterned sequence of multiplexer input selection signals, and outputting a test pattern from the multiplexer in response to the multiplexer input selecting.

In Example 60, the subject matter of Examples 41-60 (excluding the present Example) can optionally include that the generating a patterned sequence of multiplexer input selection signals, includes:

selecting a mode of a multi-mode pattern sequencer having a shift register comprising a plurality of bit registers, a finite state machine comprising linear feedback polynomial logic coupled to the bit registers of the shift register, combinational logic including a plurality of counters, and a plurality of modes of operation including a fixed pattern mode, a clock signal pattern mode and a and a linear feedback mode;

and operating the multi-mode pattern sequencer in the selected mode wherein:

operating the multi-mode pattern sequencer in the fixed pattern mode includes the shift register shifting a fixed pattern to the pattern sequencer output;

operating the multi-mode pattern sequencer in the clock signal pattern mode includes generating a clock signal at the pattern sequencer output, the clock signal having a programmable duty cycle in which the length of a clock pulse within the clock period is programmable, the clock signal generating including timing the delay of initiation of the clock pulse of the clock signal within the clock period using a first counter of the combinational logic, timing the duration of the clock pulse using a second counter of the combinational logic, and the duration of the remaining period of the clock signal after the clock pulse until the beginning of the next clock signal timing using a third counter of the combinational logic; and operating the multi-mode pattern sequencer in the linear feedback mode includes generating a linear feedback polynomial pattern at the pattern sequencer output, the generating a linear feedback polynomial pattern including the linear feedback polynomial logic determining the next state of the finite state machine of the multi-mode pattern sequencer.

Example 61 is directed to an apparatus comprising means to perform a method as described in any preceding Example. The described operations may be implemented as a method, apparatus or computer program product using standard programming and/or engineering techniques to produce software, firmware, hardware, or any combination thereof. The described operations may be implemented as computer program code maintained in a "computer readable storage medium", where a processor may read and execute the code from the computer storage readable medium. The computer readable storage medium includes at least one of electronic circuitry, storage materials, inorganic materials, organic materials, biological materials, a casing, a housing, a coating, and hardware. A computer readable storage medium may comprise, but is not limited to, a magnetic storage medium (e.g., hard disk drives, floppy disks, tape, etc.), optical storage (CD-ROMs, DVDs, optical disks, etc.), volatile and non-volatile memory devices (e.g., EEPROMs, ROMs, PROMs, RAMs, DRAMs, SRAMs, Flash Memory, firmware, programmable logic, etc.), Solid State Devices (SSD), etc. The code implementing the described operations may further be implemented in hardware logic implemented in a hardware device (e.g., an integrated circuit chip, Programmable Gate Array (PGA), Application Specific Integrated Circuit (ASIC), etc.). Still further, the code implementing the described operations may be implemented in "transmission signals", where transmission signals may propagate through space or through a transmission media, such as an optical fiber, copper wire, etc. The transmission signals in which the code or logic is encoded may further comprise a wireless signal, satellite transmission, radio waves, infrared signals, Bluetooth, etc. The program code embedded on a computer readable storage medium may be transmitted as transmission signals from a transmitting station or computer to a receiving station or computer. A computer readable storage medium is not comprised solely of transmissions signals. Those skilled in the art will recognize that many modifications may be made to this configuration without departing from the scope of the present description, and that the article of manufacture may comprise suitable information bearing medium known in the art. Of course, those skilled in the art will recognize that many modifications may be made to this configuration without departing from the scope of the present description, and that the article of manufacture may comprise any tangible information bearing medium known in the art.

In certain applications, a device in accordance with the present description, may be embodied in a computer system including a video controller to render information to display on a monitor or other display coupled to the computer system, a device driver and a network controller, such as a computer system comprising a desktop, workstation, server, mainframe, laptop, handheld computer, etc. Alternatively, the device embodiments may be embodied in a computing device that does not include, for example, a video controller, such as a switch, router, etc., or does not include a network controller, for example.

The illustrated logic of figures may show certain events occurring in a certain order. In alternative embodiments, certain operations may be performed in a different order, modified or removed. Moreover, operations may be added to the above described logic and still conform to the described embodiments. Further, operations described herein may occur sequentially or certain operations may be processed in parallel. Yet further, operations may be performed by a single processing unit or by distributed processing units.

The foregoing description of various embodiments has been presented for the purposes of illustration and description. It is not intended to be exhaustive or to limit to the precise form disclosed. Many modifications and variations are possible in light of the above teaching.

What is claimed is:

1. A memory controller for use with a memory having memory cells including spare memory cells, comprising:
   an internal self-test logic circuit built in within the memory controller, the self-test logic circuit including:
      a test pattern generator for generating test patterns and for testing memory cells within the memory using the generated test patterns wherein the test pattern generator includes a plurality of generators including at least one instruction programmable address generator, at least one instruction programmable data generator, and a loop sequencer circuit adapted to apply to the generators a plurality of nested loop instructions, including a sequential loop of address instructions in a sequence of address instructions to an instruction programmable address generator, and to apply to an instruction programmable data generator, a sequential loop of data instructions in a sequence of data instructions nested within the sequential loop of address instructions, each address instruction of the sequence when executed by the instruction programmable address generator, causes the instruction programmable address generator to generate a pattern of memory cell addresses, and wherein the test pattern generator is adapted to execute memory commands at memory cells addressed by a pattern of memory cell addresses generated by an address instruction being executed in sequence in the loop of address instructions;
      a repository; and
      a detector circuit adapted to detect defective memory cells in response to the test patterns testing the memory cells, and to store in the repository within the memory controller, a list of memory locations, each memory location of the list having a set of memory cells which includes at least one defective memory cell; and
   an internal self-repair logic circuit built in within the memory controller, the internal self-repair logic including a repair logic circuit adapted to read the list of memory locations stored in the repository, and to repair the memory locations of the list by substituting a memory location of spare memory cells, for a memory location having at least one defective memory cell.

2. The memory controller of claim 1 further comprising a semiconductor die wherein the internal self-test logic circuit and the internal self-repair logic circuit are disposed on the die of the memory controller.

3. The memory controller of claim 1 wherein each data instruction of the sequence when executed by the instruction programmable data generator, causes the instruction programmable data generator to generate a pattern of data for a pattern of test data, and wherein the test pattern generator in executing memory commands at memory cells is adapted to write a pattern of test data generated by a data instruction being executed in sequence in the loop of data instructions nested within the sequential loop of address instructions, in memory cells addressed by the pattern of memory cell addresses generated by the address instruction being executed in sequence in the loop of address instructions.

4. The memory controller of claim 1 wherein the plurality of generators includes at least one algorithm generator and wherein the loop sequencer circuit is adapted to apply to an algorithm generator, a sequential loop of algorithm instructions in a sequence of algorithm instructions, each algorithm instruction of the sequence when executed by the algorithm generator causes the algorithm generator to generate a pattern of data for a pattern of test data, wherein the sequential loop of algorithm instructions is nested within another loop of instructions, and wherein the test pattern generator in executing memory commands at memory cells is adapted to write a pattern of test data in accordance with an algorithm instruction being executed in sequence in the loop of algorithm instructions, in memory cells addressed by the pattern of memory cell addresses generated by the address instruction being executed in sequence in the loop of address instructions.

5. The memory controller of claim 4 wherein the plurality of generators includes at least one command generator and wherein the loop sequencer circuit is adapted to apply to a command generator, a sequential loop of command instructions in a sequence of command instructions, each command instruction of the sequence when executed by the command generator causes the command generator to generate a pattern of memory commands, wherein the sequential loop of command instructions is nested within another loop of instructions, and wherein the test pattern generator in executing memory commands at memory cells is adapted to execute a pattern of commands generated by a command instruction being executed in sequence in the loop of command instructions, said pattern of commands writing the pattern of test data generated by the output of the test pattern generator in response to the algorithm instruction being executed in sequence in the loop of algorithm instructions, and in response to a data instruction being executed in sequence in the loop of data instructions nested within the sequential loop of address instructions, in memory cells addressed by the pattern of memory cell addresses generated by the address instruction being executed in sequence in the loop of address instructions.

6. The memory controller of claim 5 wherein the plurality of generators includes at least one address offset generator and wherein the loop sequencer is adapted to apply to an address offset generator, a sequential loop of memory address offset instructions in a sequence of memory address offset instructions, each memory address offset instruction of the sequence when executed by the address offset generator, causes the address offset generator to generate a pattern of memory address offsets, wherein the sequential loop of memory address offset instructions is nested within another loop of instructions, and wherein the test pattern generator in executing memory commands at memory cells is adapted to execute the pattern of commands generated by the command instruction being executed in sequence in the loop of command instructions in memory cells addressed by a pattern of memory cell addresses generated by an address instruction being executed in sequence in the loop of address instructions and offset by the pattern of memory address offsets generated by a memory address offset instruction being executed in sequence in the loop of memory address offset instructions.

7. The memory controller of claim 1 wherein the memory cells are arranged in a plurality of memory regions, and wherein the detector circuit is adapted to determine if the number of memory locations having at least one defective memory cell exceeds a maximum for a particular memory region and if so, to set a flag indicating that the number of memory locations having at least one defective memory cell exceeds the maximum for the particular memory region.

8. The memory controller of claim 1 wherein the memory cells are arranged in memory regions of memory cells, each memory region comprising an array of memory cells arranged in rows and columns of memory cells, and each memory location of a memory region is a row of memory cells, and wherein the detector circuit is adapted to determine if a particular row of memory cells of a particular memory region of memory cells has already been stored as an entry in the list of the repository, and to bypass the storing in the repository the particular row of the particular memory region of memory cells as an entry of the list of memory locations if the particular row of memory cells of the particular memory region of memory cells has already been stored as an entry in the list of the repository.

9. The memory controller of claim 1 wherein the memory cells are arranged in memory regions of memory cells, each memory region comprising an array of memory cells arranged in rows and columns of memory cells, and each memory location of a memory region is a row of memory cells, and wherein the detector circuit is adapted to set a flag for each memory region, indicating whether at least one row of the particular memory region has at least one defective memory cell in the at least one row of memory cells of the particular memory region.

10. A device, comprising:
memory cells within the device including spare memory cells;
an internal self-test logic circuit built in within the device, the self-test logic circuit including:
a test pattern generator for generating test patterns and for testing memory cells within the device using the generated test patterns wherein the test pattern generator includes a plurality of generators including at least one instruction programmable address generator and at least one instruction programmable data generator, and a loop sequencer circuit adapted to apply to the generators a plurality of nested loop instructions, including a sequential loop of address instructions in a sequence of address instructions to an instruction programmable address generator, and to apply to an instruction programmable data generator, a sequential loop of data instructions in a sequence of data instructions nested within the sequential loop of address instructions, each address instruction of the sequence when executed by the instruction programmable address generator, causes the instruction programmable address generator to generate a pattern of memory cell addresses, and wherein the test pattern generator is adapted to execute memory commands at memory cells addressed by a pattern of memory cell addresses generated by an address instruction being executed in sequence in the loop of address instructions;
a repository; and
a detector circuit adapted to detect defective memory cells in response to the test patterns testing the memory cells, and to store in the repository within the device, a list of memory locations, each memory location of the list having a set of memory cells which includes at least one defective memory cell; and an internal self-repair logic circuit built in within the device, the internal self-repair logic including a repair logic circuit adapted to read the list of memory locations stored in the repository, and to repair the memory locations of the list by substituting a memory location of spare memory cells, for a memory location having at least one defective memory cell.

11. The device of claim 10 wherein the device further comprises a memory controller disposed on a semiconductor die within the device, for controlling the memory cells of the device and wherein the internal self-test logic circuit and the internal self-repair logic circuit are disposed on the die of the memory controller.

12. The device of claim 10 wherein each data instruction of the sequence when executed by the instruction programmable data generator, causes the instruction programmable data generator to generate a pattern of data for a pattern of test data, and wherein the test pattern generator in executing memory commands at memory cells is adapted to write a pattern of test data generated by a data instruction being executed in sequence in the loop of data instructions nested within the sequential loop of address instructions, in memory cells addressed by the pattern of memory cell addresses generated by the address instruction being executed in sequence in the loop of address instructions.

13. The device of claim 10 wherein the plurality of generators includes at least one algorithm generator and wherein the loop sequencer circuit is adapted to apply to an algorithm generator, a sequential loop of algorithm instructions in a sequence of algorithm instructions, each algorithm instruction of the sequence when executed by the algorithm generator causes the algorithm generator to generate a pattern of data for a pattern of test data, wherein the sequential loop of algorithm instructions is nested within another loop of instructions, and wherein the test pattern generator in executing memory commands at memory cells is adapted to write a pattern of test data in accordance with an algorithm instruction being executed in sequence in the loop of algorithm instructions, in memory cells addressed by the pattern of memory cell addresses generated by the address instruction being executed in sequence in the loop of address instructions.

14. A method, comprising:
using an internal self-test logic circuit built in within a device,
generating test patterns for testing memory cells within the device wherein the generating the test patterns includes executing a sequential loop of address instructions in a sequence of address instructions and a sequential loop of data instructions in a sequence of data instructions nested within the sequential loop of address instructions, each address instruction of the sequence when executed programmably generating by the sequence of address instructions, a pattern of memory cell addresses, and executing memory commands at memory cells addressed by a pattern of memory cell addresses generated by an address instruction being executed in sequence in the loop of address instructions;
applying the test patterns to the memory cells within the device;
detecting defective memory cells in response to the applied test patterns; and
storing in a repository within the device, a list of memory locations, each memory location of the list having a set of memory cells which includes at least one defective memory cell; and
using an internal self-repair logic circuit built in within the device,
reading the list of memory locations stored in the repository; and
repairing the memory locations, wherein the repairing includes substituting a spare memory location having a set of memory cells, for a memory location having at least one defective memory cell.

15. The method of claim 14 wherein the device further comprises a memory controller disposed on a semiconductor die within the device, for controlling the memory cells of the device and wherein the internal self-test logic circuit and the internal self-repair logic circuit are disposed on the die of the memory controller.

16. The method of claim 14 wherein each data instruction of the sequence when executed generating a pattern of data for a pattern of test data, and wherein the executing memory commands at memory cells includes writing test data generated by a data instruction being executed in sequence in the loop of data instructions nested within the sequential loop of address instructions, in memory cells addressed by the pattern of memory cell addresses generated by the address instruction being executed in sequence in the loop of address instructions.

17. The method of claim 14 wherein the generating test patterns includes executing a sequential loop of algorithm instructions in a sequence of algorithm instructions, each algorithm instruction of the sequence when executed generating a pattern of data for a pattern of test data, wherein the sequential loop of algorithm instructions is nested within another loop of instructions, and wherein the executing memory commands at memory cells includes writing a pattern of test data in accordance with an algorithm instruction being executed in sequence in the loop of algorithm instructions, in memory cells addressed by the pattern of memory cell addresses generated by the address instruction being executed in sequence in the loop of address instructions.

18. The method of claim 17 wherein the generating test patterns includes executing a sequential loop of command instructions in a sequence of command instructions, each command instruction of the sequence when executed generating a pattern of memory commands, wherein the sequential loop of command instructions is nested within another loop of instructions, and wherein the executing memory commands at memory cells includes executing a pattern of commands generated by a command instruction being executed in sequence in the loop of command instructions, said pattern of commands writing a pattern of test data generated by the output of an algorithm of an algorithm instruction being executed in sequence in the loop of algorithm instructions, and in response to a data instruction being executed in sequence in the loop of data instructions nested within the sequential loop of address instructions, in memory cells addressed by the pattern of memory cell addresses generated by the address instruction being executed in sequence in the loop of address instructions.

19. The method of claim 18 wherein the generating test patterns includes executing a sequential loop of memory address offset instructions in a sequence of memory address offset instructions, each memory address offset instruction of the sequence when executed generating a pattern of memory address offsets, wherein the sequential loop of memory address offset instructions is nested within another loop of instructions, and wherein the executing memory commands at memory cells includes executing the pattern of commands generated by the command instruction being executed in sequence in the loop of command instructions in memory cells addressed by a pattern of memory cell addresses generated by an address instruction being executed in sequence in the loop of address instructions and offset by the pattern of memory address offsets generated by a memory address offset instruction being executed in sequence in the loop of memory address offset instructions.

20. The method of claim 14 wherein the memory cells are arranged in a plurality of memory regions, the method further comprising determining if the number of memory locations having at least one defective memory cell exceeds a maximum for a particular memory region and if so, setting a flag indicating that the number of memory locations having at least one defective memory cell exceeds the maximum for the particular memory region.

21. The method of claim 14 wherein the memory cells are arranged in memory regions of memory cells, each memory region comprising an array of memory cells arranged in rows and columns of memory cells, and each memory location of a memory region is a row of memory cells, the method further comprising determining if a particular row of memory cells of a particular memory region of memory cells has already been stored as an entry in the list of the repository, and bypassing the storing in the repository the particular row of the particular memory region of memory cells as an entry of the list of memory locations if the particular row of memory cells of the particular memory region of memory cells has already been stored as an entry in the list of the repository.

22. The method of claim 14 wherein the memory cells are arranged in memory regions of memory cells, each memory region comprising an array of memory cells arranged in rows and columns of memory cells, and each memory location of a memory region is a row of memory cells, the method further comprising setting a flag for each memory region, indicating whether at least one row of the particular memory region has at least one defective memory cell in the at least one row of memory cells of the particular memory region.

* * * * *